(12) United States Patent
Koyama

(10) Patent No.: US 7,952,541 B2
(45) Date of Patent: *May 31, 2011

(54) METHOD OF DRIVING A DISPLAY DEVICE

(75) Inventor: Jun Koyama, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 825 days.

This patent is subject to a terminal disclaimer.

(21) Appl. No.: 11/871,601

(22) Filed: Oct. 12, 2007

(65) Prior Publication Data

US 2008/0094327 A1 Apr. 24, 2008

Related U.S. Application Data

(63) Continuation of application No. 10/778,605, filed on Feb. 17, 2004, now Pat. No. 7,283,109, and a continuation of application No. 10/102,480, filed on Mar. 21, 2002, now Pat. No. 6,693,385.

(30) Foreign Application Priority Data

Mar. 22, 2001 (JP) .................................. 2001-083286

(51) Int. Cl.
G09G 3/30 (2006.01)

(52) U.S. Cl. ......................................... 345/76; 345/204

(58) Field of Classification Search .................. 345/82, 345/76, 204, 205, 690–693
See application file for complete search history.

(56) References Cited

U.S. PATENT DOCUMENTS

| | | | |
|---|---|---|---|
| 5,684,365 A | 11/1997 | Tang et al. | |
| 5,990,629 A | 11/1999 | Yamada et al. | |
| 6,023,259 A | 2/2000 | Howard et al. | |
| 6,091,203 A | 7/2000 | Kawashima et al. | |
| 6,229,506 B1 | 5/2001 | Dawson et al. | |
| 6,366,116 B1 | 4/2002 | Juang | |
| 6,373,454 B1 | 4/2002 | Knapp et al. | |
| 6,452,341 B1 | 9/2002 | Yamauchi et al. | |
| 6,501,466 B1 | 12/2002 | Yamagishi et al. | |
| 6,535,185 B2 | 3/2003 | Kim et al. | |
| 6,693,385 B2 | 2/2004 | Koyama | |
| 6,844,683 B2 | 1/2005 | Yamauchi et al. | |
| 6,859,193 B1 | 2/2005 | Yumoto | |
| 6,927,753 B2 | 8/2005 | Koyama et al. | |

(Continued)

FOREIGN PATENT DOCUMENTS

EP 1063704 12/2000

(Continued)

OTHER PUBLICATIONS

Bae et al.; "A Novel Pixel Design for an Active Matrix Organic Light Emitting Diode Display"; *SID 2000*; pp. 358-361; 2000.

(Continued)

*Primary Examiner* — Ricardo L Osorio

(74) *Attorney, Agent, or Firm* — Fish & Richardson P.C.

(57) ABSTRACT

A driving method that does not allow a change in temperature of the surroundings to change the luminance of a light emitting element of a pixel is provided for a display device with less uneven display, higher gradation, and reduced power consumption. A time ratio gradation driving method is applied to a pixel that is structured to have a current mirror circuit and use a current drive method. The bit number of digital video signals to be sampled by a source signal line driving circuit is reduced with the use of a switching signal, thereby saving the power consumption when high gradation display is not necessary.

8 Claims, 29 Drawing Sheets

U.S. PATENT DOCUMENTS

| | | |
|---|---|---|
| 7,193,591 B2 | 3/2007 | Yumoto |
| 7,312,572 B2 | 12/2007 | Yamauchi et al. |
| 2001/0022565 A1 | 9/2001 | Kimura |
| 2001/0045929 A1 | 11/2001 | Prache et al. |
| 2002/0180369 A1 | 12/2002 | Koyama |
| 2003/0062524 A1 | 4/2003 | Kimura |
| 2003/0122747 A1 | 7/2003 | Shannon et al. |
| 2004/0207615 A1 | 10/2004 | Yumoto |
| 2004/0239607 A1 | 12/2004 | Koyama |
| 2005/0073242 A1 | 4/2005 | Yamauchi et al. |
| 2005/0190177 A1 | 9/2005 | Yumoto |

FOREIGN PATENT DOCUMENTS

| | | |
|---|---|---|
| EP | 1 102 234 A2 | 5/2001 |
| EP | 1130565 | 9/2001 |
| JP | 8-234683 | 9/1996 |
| JP | 10-187093 | 7/1998 |
| JP | 11-282419 | 10/1999 |
| JP | 2000-040924 | 2/2000 |
| JP | 2000-056847 | 2/2000 |
| JP | 2000-138572 | 5/2000 |
| JP | 2000-206937 A | 7/2000 |
| JP | 2000-267164 | 9/2000 |
| JP | 2001-067018 A | 3/2001 |
| JP | 2001-147659 | 5/2001 |
| JP | 2001-324958 | 11/2001 |
| WO | 99/65012 | 12/1999 |
| WO | 01/06484 | 1/2001 |
| WO | 01/91095 | 11/2001 |

OTHER PUBLICATIONS

Baldo et al.; "Highly efficient phosphorescent emission from organic electrohuninescent devices"; *Nature*, vol. 395; pp. 151-154; Sep. 10, 1998.

Baldo et al.; "Very high-efficiency green organic light-emitting devices based on electrophosphorescence"; *Applied Physics Letters*, vol. 75(1); pp. 4-6; Jul. 5, 1999.

Tsutsui et al.; "High Quantum Efficiency in Organic Light-Emitting Devices with Iridium-Complex as a Triplet Emissive Center"; *Japan Journal of Applied Physics*, vol. 38; pp. L1502-L1504; Part 2, No. 12B; Dec. 15, 1999.

Hunter et al.; "Active Matrix. Addressing of Polymer Light Emitting Diodes Using Low Temperature Poly Silicon TFTs"; *AM-LCD 2000*; pp. 249-252; 2000.

Kimura et al.; "Low-Temperature Poly-Si TFT Display Using Light-Emitting-Polymer"; *AM-LCD 2000*; pp. 245-248; 2000.

Dawson et al.; "The Impact of the Transient Response of Organic Light Emitting Diodes on the Design of Active Matrix OLED Displays"; *IEDM 98*; pp. 875-878; 1998.

Dawson et al.; "A Poly-Si Active-Matrix OLED Display with Integrated Drivers"; *SID 99 Digest*; pp. 438-441; 1999.

Dawson et al.; "4.2: Design of an Improved Pixel for a Polysilicon Active-Matrix Organic LED Display"; *SID 98 Digest*; pp. 11-14; 1998.

Yumoto et al.; "Pixel-Driving Methods for Large-Sized Poly-Si AM-OLED Displays"; *Asia Display/IDW '01*; pp. 1395-1398; 2001.

Chapter 6.7 MOS differential amplifiers; Micro-Electronics circuits by Sedra/Smith Saunders College Publishing; pp. 447-456; 1991.

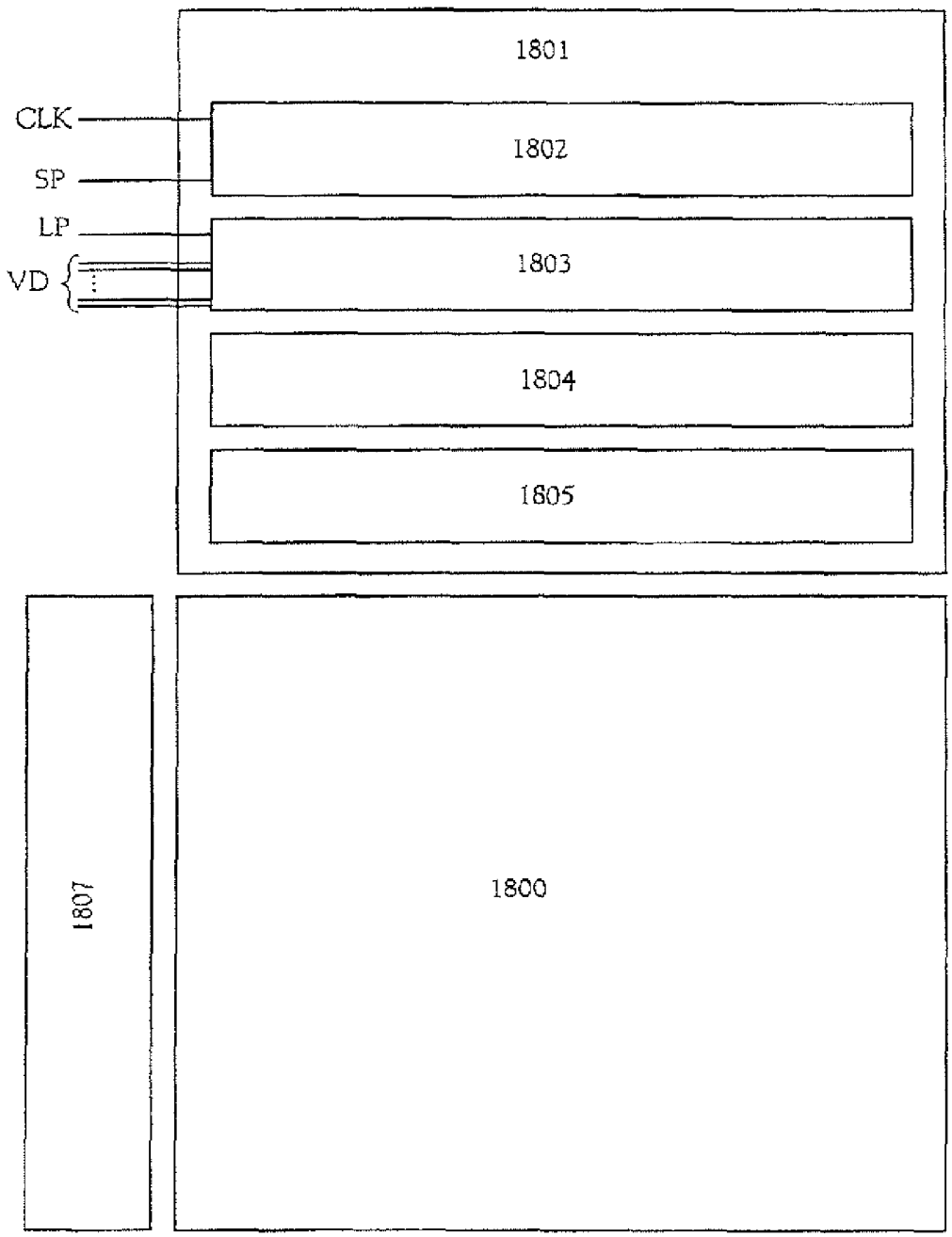
FIG. 18　　　　　　　　　　　　　　　　　　　　　PRIOR ART

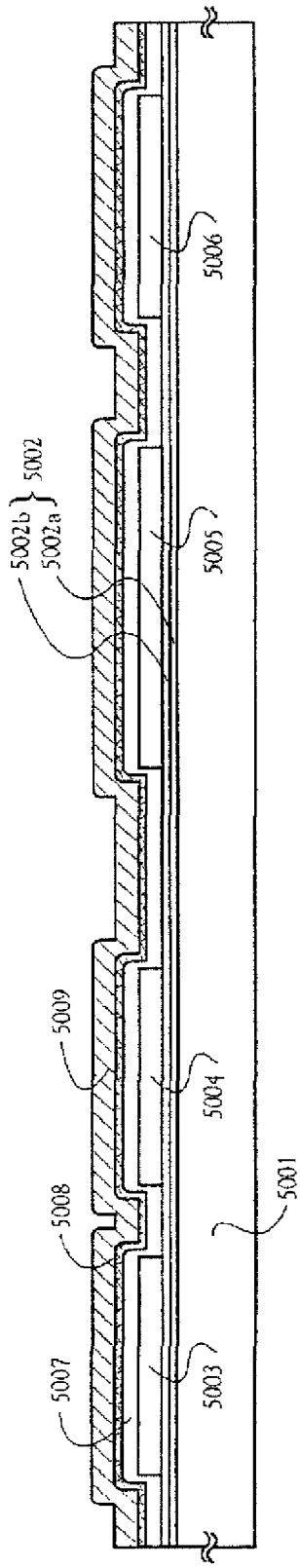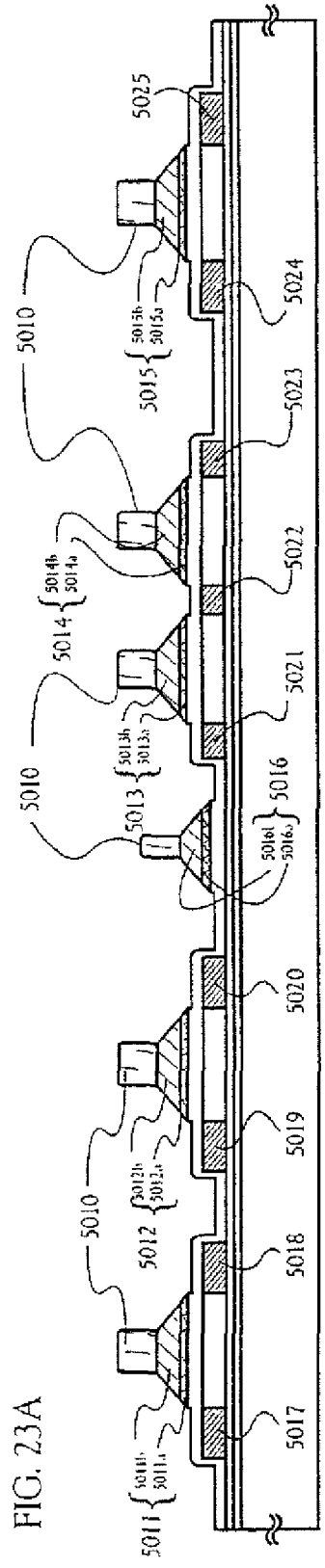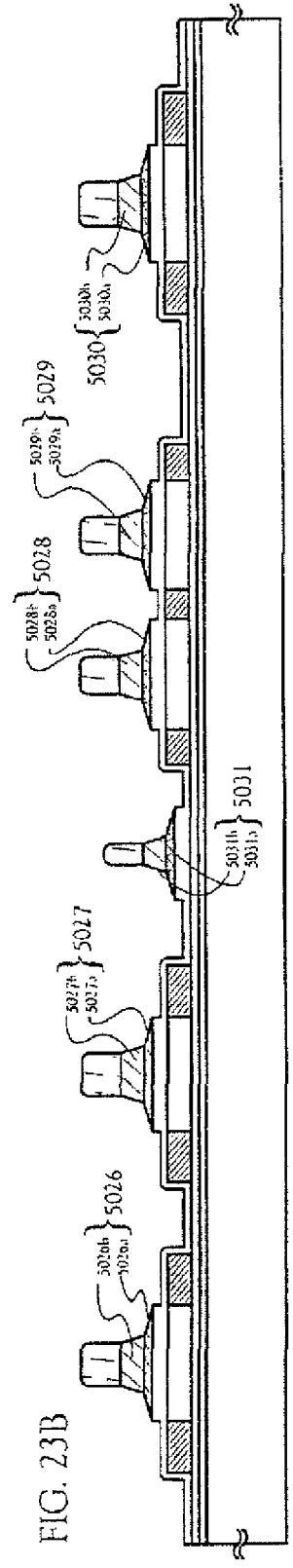

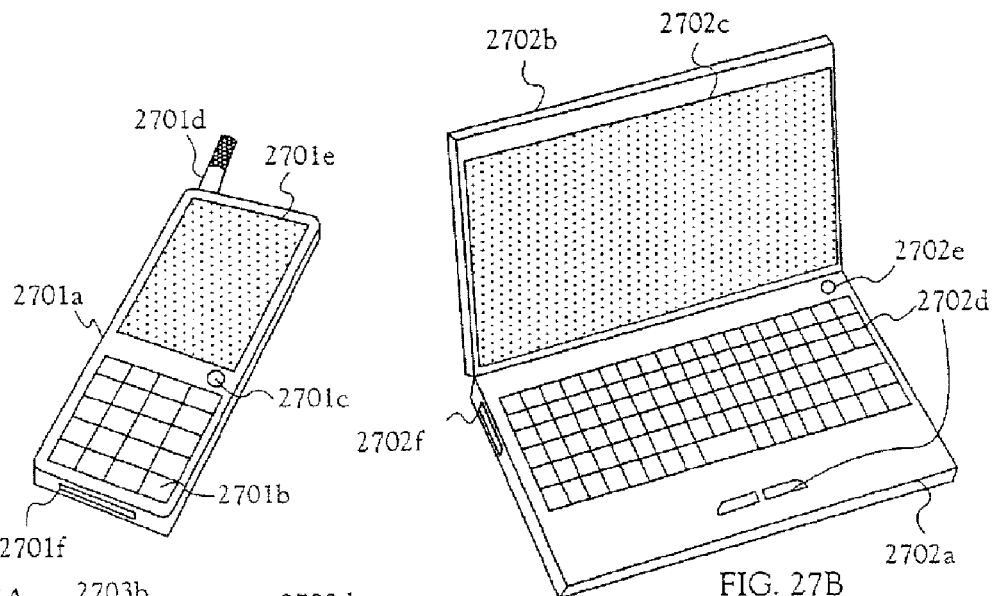
FIG. 27A
FIG. 27B
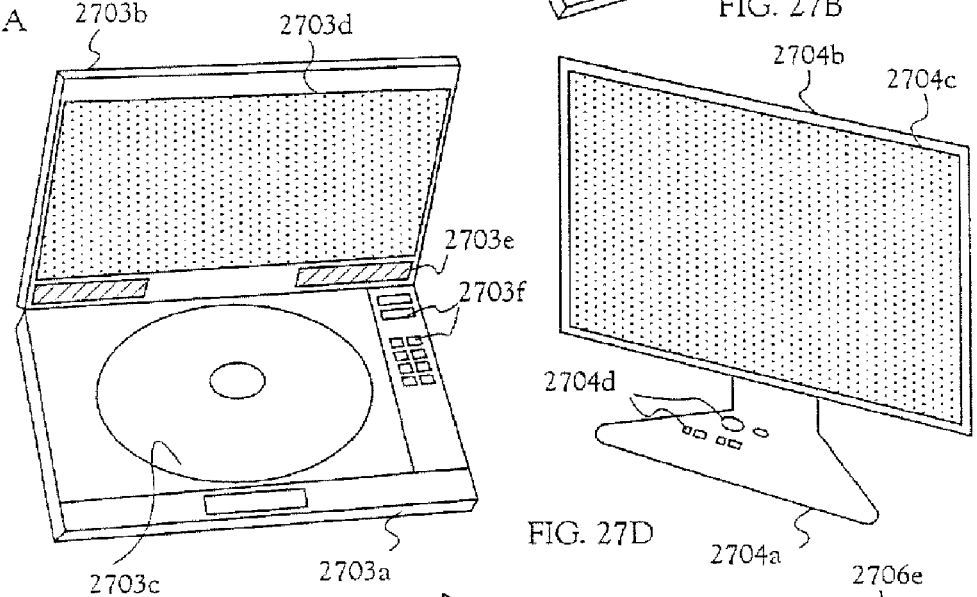
FIG. 27C
FIG. 27D
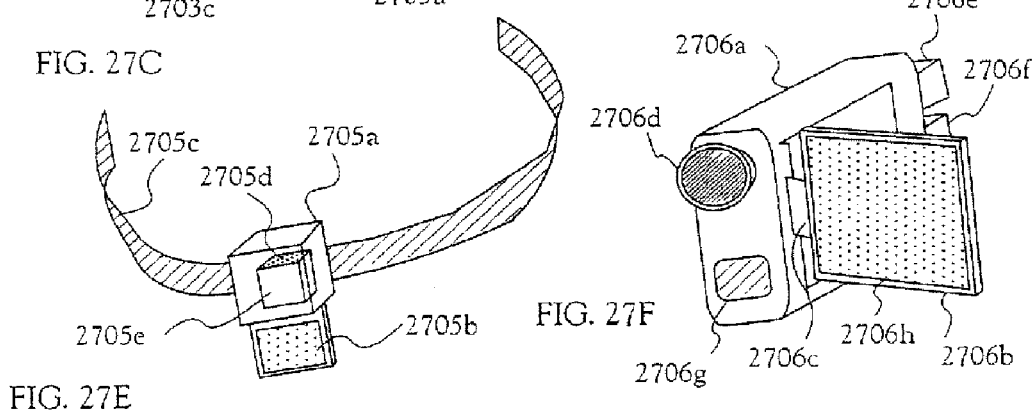
FIG. 27E
FIG. 27F

METHOD OF DRIVING A DISPLAY DEVICE

BACKGROUND OF THE INVENTION

1. Field of the Invention

The present invention relates to a method of driving a display device in which each pixel has a thin film transistor (hereinafter referred to as TFT). Specifically, the present invention relates to a method of driving a display device having an electro luminescence element, which is attracting attention as a light emitting element. The invention also relates to information equipment that use this driving method for a display device.

2. Description of the Related Art

A conventional method of driving a display device that has a light emitting element is described.

Shown here as an example of the light emitting element is an element in which an anode and a cathode sandwich an organic compound layer that emits light by electro luminescence effect upon application of the electric field (EL element).

The term EL element here refers to both an element that utilizes light emission (fluorescence) by shift from singlet exciton to the base state and an element that utilizes light emission (phosphorescence) by shift from triplet exciton to the base state.

An organic compound layer includes a hole injection layer, a hole transporting layer, a light emitting layer, an electron transporting layer, an electron injection layer, and the like. The basic structure of a light emitting element is a laminate of an anode, a light emitting layer, and a cathode layered in this order. The basic structure can be modified into a laminate of an anode, a hole injection layer, a light emitting layer, an electron injection layer, and a cathode layered in this order, or a laminate of an anode, a hole injection layer, a hole transporting layer, a light emitting layer, an electron transporting layer, an electron injection layer, and a cathode layered in this order.

A display device having a conventional light emitting element is described with reference to circuit diagrams in FIGS. 13 and 14 which illustrate examples of structures of pixel and pixel portion.

FIG. 14 shows the structure of a pixel portion.

A pixel portion 1401 has x columns of pixels and y rows of pixels which form a matrix. Each of the pixels is denoted by 1400. The symbols x and y denote arbitrary natural numbers.

The pixel portion 1401 is composed of source signal lines S1 to Sx, gate signal lines G1 to Gy, and power supply lines V1 to Vx, and each pixel in the pixel portion has a switching TFT 141, a driving TFT 142, a storage capacitor 143, and a light emitting element 144.

The storage capacitor 143 is not indispensable if the device makes a positive use of a parasitic capacitance of a gate of the driving TFT 142 or the like.

Signals from a source signal line driving circuit (not shown in the drawing) are inputted to the source signal lines S1 to Sx. Signals from a gate signal line driving circuit (not shown in the drawing) are inputted to the gate signal lines G1 to Gy. A constant electric potential is given to the power supply lines V1 to Vx.

The structure of each pixel 1400 in FIG. 14 is described next with reference to FIG. 13.

In each pixel, a gate signal line G that is one of the gate signal lines G1 to Gy is connected to a gate electrode of the switching TFT 141. The switching TFT 141 has a source region and a drain region one of which is connected to a source signal line S, namely, one of the source signal lines S1 to Sx, and the other of which is connected to a gate electrode of the driving TFT 142. The driving TFT 142 has a source region and a drain region one of which is connected to a power supply line V, namely, one of the power supply lines V1 to Vx, and to one of electrodes of the storage capacitor 143, and the other of which is connected to one of electrodes of the light emitting element 144. The other electrode of the storage capacitor 143 is connected to power supply line V, namely, one of the power supply lines V1 to Vx. Here, being connected means being in electrically conductive state.

Of an anode and a cathode of the light emitting element 144 in the pixel 1400, the one that is connected to the driving TFT 142 is called a pixel electrode and the other is called an opposite electrode.

The operation of each pixel 1400 is described in detail below. The description employs reference symbols in FIGS. 13 and 14.

In a certain period, one of the gate signal lines G1 to Gy is selected first. Every switching TFT 141 whose gate electrode is connected to the selected gate signal line is turned ON. Here, a TFT being turned ON means that the gate/source voltage (hereinafter referred to as gate voltage) of the TFT turns the drain/source thereof conductive. A selected signal line refers to a signal line receiving a signal electric potential to turn ON a TFT whose gate electrode is connected to the signal line.

Signals inputted from the source signal line driving circuit to the source signal line are inputted to the gate electrode of the driving TFT 142 through the drain/source of the switching TFT 141 that has been turned ON. The electric potential given to the gate electrode of the driving TFT 142 is held in the storage capacitor 143. The signals inputted to the gate electrode of the driving TFT 142 turn the driving TFT 142 ON to cause a current to flow into the tight emitting element 144 through the drain/source of the driving TFT 142 from the power supply line. Then the light emitting element 144 emits light at a luminance according to the amount of current it receives.

Driving methods for a display device are roughly divided into analog methods and digital methods. The analog methods as defined in this specification are methods of displaying an image by inputting analog signals to source signal lines. The digital methods as defined herein are methods of displaying an image by inputting digital signals to source signal lines.

An analog driving method is described first.

FIG. 18 shows a block diagram of an analog display device.

In FIG. 18, the display device is composed of a driving circuit portion and a pixel portion 1800. The driving circuit portion consists of a source signal line driving circuit 1801 and a gate signal line driving circuit 1807. The source signal line driving circuit 1801 and the gate signal line driving circuit 1807 are respectively placed only on one side of the pixel portion 1800 in FIG. 18. However, the pixel portion 1800 may have the source signal line driving circuit 1801 on each side thereof and may have the gate signal line driving circuit 1807 on each side thereof. This arrangement is preferred in terms of drive efficiency and reliability of the display device.

Next, a detailed description is given on the structure of the source signal line driving circuit 1801.

In an analog method, video signals inputted from the external to the source signal line driving circuit 1801 may be analog signals or digital signals. When digital signals are inputted from the external to the source signal line driving circuit 1801 and analog signals are to be outputted to the source signal lines, the digital signals have to be converted into analog signals by a digital/analog converter (hereinafter referred to as DAC) in the source signal line driving circuit or before output of the source signal line driving circuit is inputted to the source signal lines.

The driving circuit shown in the block diagram of FIG. 18 receives digital video signals from the external to input analog signal voltage to the source signal lines.

The source signal line driving circuit 1801 is composed of a shift register 1802, a latch circuit (hereinafter referred to as LAT) 1 (denoted by 1803), an LAT2 1804, and a DAC 1805.

The amount of information digital video signals have are n (n is an arbitrary natural number) bits.

Digital video signals of the respective bits out of n bits are inputted to the LAT1 1803. Digital video signals inputted from the external are subjected to serial/parallel conversion in advance and groups of n-bit signals to be sent to their respective source signal lines are simultaneously inputted to the LAT. Input of signals for the first source signal line S1 is followed by input of signals for the second source signal line S2, and similar operation is repeated until signals for the x-th source signal line Sx are inputted to complete receiving signals for x source signal lines. In this way signals for one horizontal period are all inputted to the LAT1 1803. The signals held in the LAT1 1803 are then sent to the LAT2 at once in response to a latch pulse LS.

When the source signal line driving circuit 1801 for outputting signals to x source signal lines handles n-bit digital video signals, the LAT1 1803 and the LAT2 1804 each have to store xn bits digital video signals.

The n-bit digital video signals to be sent to their respective source signal lines are held in the LAT2 1804 and their digital signal voltages VD are inputted to the DAC 1805 to be converted into corresponding analog signal voltages. The source signal line driving circuit 1801 thus outputs analog signal voltages to the source signal lines.

A case of driving pixels by an analog method is described. The description is given with reference to the pixel circuit diagrams in FIGS. 13 and 14.

In analog driving, signals inputted to source signal lines are expressed as analog voltages. These analog signals are inputted to the gate electrode of the driving TFT 142 through the switching TFT 141 that has been turned ON and change the electric potential of the gate electrode of the driving TFT 142. This causes a change in gate voltage of the driving TFT 142 and a drain current flows in an amount according to the changed gate voltage into the light emitting element 144.

A driving method for this analog display device is explained with reference to timing charts of FIGS. 15A and 15B. Also reference is made to FIG. 18.

In the timing chart, a period necessary for preparing display of one image is expressed as a frame period (F). Here the length of one frame period is set to about ⅟₆₀ second. With this length, human eye does not see flickering in animation displayed.

Operations up through inputting analog signal voltages to the source signal lines S1 to Sx at once are described first.

In FIG. 15A, digital signal voltages VD of groups of n-bit signals are simultaneously inputted to the LAT1 1803 of the source signal line driving circuit 1801 in response to sampling pulses from the shift register 1802 (during the sampling period in FIGS. 15A and 15B). After the sampling period, the digital signal voltages VD held in the LAT1 1803 are inputted to the LAT2 1804 at once in response to latch pulse LP to be held in the LAT2.

After outputting the signals to the LAT2 1804, the LAT1 1803 starts holding digital video signals VD for the next horizontal period in order.

The signal voltages inputted and held in the LAT2 1804 are inputted to the DAC 1805 to be converted into corresponding analog signal voltages. This digital/analog conversion processing is conducted in the retrace period after the sampling period. The signal voltages subjected to analog conversion are inputted to the source signal lines S1 to Sx at once.

The description above is about the operations up through inputting analog signal voltages to the source signal lines S1 to Sx at once.

Described next are operations of inputting to pixels the analog signal voltages inputted to the source signal lines.

FIG. 15B is a timing chart illustrating pixels in horizontal periods respectively associated with the gate signal lines. In a first frame period F1, the gate signal lines G1 to Gy are selected in order. During one gate signal line is selected, analog signal voltages are inputted to the source signal lines S1 to Sx at once.

Thus the analog voltages inputted to the source signal lines are inputted to the gate electrodes of the driving TFTs in the pixels that are connected to the selected gate signal line. A period in which this operation takes place is called a writing period.

A period in which a light emitting element emits or does not emit light in accordance with signals inputted during the writing period is called a display period.

The length of writing period is the same in each horizontal period but the starting point of the writing period varies from one horizontal period to another. The length of display period is the same in each horizontal period but the starting point of the display period varies from one horizontal period to another.

The lengths of writing period and display period are set so that the writing period of the preceding frame period does not overlap the writing period of the following frame period.

A display period is started as soon as signals are inputted in a writing period in each horizontal period.

In this way analog signal voltages are inputted to all the pixels to display one image.

The description on the driving method for the analog display device is concluded as above.

In an analog driving method, the driving TFT 142 usually operates in a range in which the drain current is changed greatly by a change in gate voltage. This range corresponds to the vicinity of the saturation range. For conveniences' sake, it is assumed here that the driving TFT 142 operates in the saturation range.

However, in an analog driving method as this, fluctuation in characteristic of the switching TFT 141 and the driving TFT 142 makes the amount of current flowing into the light emitting element 144 vary to cause uneven display.

To counter this problem, digital driving methods have been proposed.

A digital driving method is described next.

The following description is about a case of digitally driving the pixels structured as shown in FIGS. 13 and 14.

Here the switching TFT 141 may be an n-channel TFT or a p-channel TFT and the same applies to the driving TFT 142. When the anode of the light emitting element 144 serves as the pixel electrode whereas the cathode serves as the opposite electrode, the driving TFT 142 is preferably a p-channel TFT. When the cathode of the light emitting element 144 serves as the pixel electrode whereas the anode serves as the opposite electrode, on the other hand, it is preferable to use an n-channel TFT for the driving TFT 142.

This is because it is desirable for the driving TFT 142 to operate with the electric potential of its source region fixed.

To simplify the explanation of the digital driving method, the switching TFT 141 and the driving TFT 142 here are both n-channel TFTs.

The operation of the pixels is described below.

When signals are inputted to a gate signal line, the signals are inputted to the gate electrode of each switching TFT 141 that is connected to the gate signal line. The signal voltages of the signals are set to a level that turns the switching TFT 141 ON when the signals are inputted to the gate electrode of the switching TFT 141.

Digital driving and analog driving display devices are identical in terms of using signals inputted to a gate signal line to turn ON or OFF the switching TFT.

In digital methods, signals inputted to source signal lines are '1' or '0' and have either Hi voltage or Lo voltage.

Here, a '1' signal corresponds to Hi signal voltage and a '0' signal corresponds to Lo signal voltage.

In a pixel whose switching TFT 141 is turned ON, digital video signals inputted to the source signal lines are inputted to the gate electrode of the driving TFT 142. If the inputted digital video signals are Hi signals and the voltage of Hi signal is set in advance to the level that turns the driving TFT 142 ON upon input of Hi signal to the gate electrode of the driving TFT 142, a current flows into the light emitting element 144 from the power supply line V.

Here, a writing period is a period for inputting digital voltages that have been inputted to source signal lines to the gate electrode of the driving TFT of a pixel that is connected to a selected gate signal line.

A period in which a light emitting element emits or does not emit light in accordance with signals inputted during the writing period is called a display period.

The description above is about the operation of pixels in digital methods.

Described next is a gradation display method in digital methods.

Digital methods are divided into area ratio gradation methods, time ratio gradation methods, and others.

In area ratio gradation methods, one pixel is divided into a plurality of sub-pixels and whether or not light is emitted is decided for each sub-pixel. The luminance of one pixel is set by the total area of its sub-pixels that are chosen to emit light.

On the other hand, in time ratio gradation methods, a period for displaying one image is divided into a plurality of periods and the gradation of a pixel is determined by the length of time during which the pixel emits light.

A detailed description is given here on a time ratio gradation method. Reference is made to the timing chart of FIG. 16, the block diagram of FIG. 19, and the pixel portion circuit diagram of FIG. 14. The driving method described here obtains gradations using n-bit digital video signals.

The structure of a display device that uses the time ratio gradation method is described first. The description is given with reference to the block diagram of FIG. 19.

In FIG. 19, the display device is composed of a source signal line driving circuit 1901, a gate signal line driving circuit 1907, a time ratio gradation data signal generating circuit 1908, and a pixel portion 1900. The source signal line driving circuit 1901 is composed of a shift register 1902, an LAT1 1903, and an LAT2 1904.

The operation of the display device structured as shown in FIG. 19 is described with reference to the timing chart of FIG. 16. The pixel portion and its components are denoted by the symbols used in FIG. 14.

In the riming chart, a period necessary for preparing display of one image is expressed as a frame period (F). Here the length of one frame period is set to about 1/60 second. With this length, human eye does not see flickering in animation displayed.

One frame period is divided into n sub-frame periods SF1 to SFn. The sub-frame period SF1 is divided into a writing period Taa1 and a display period Ts1.

In FIG. 16, a writing period Taa in each sub-frame period is the sum of a writing period Ta of a first horizontal period to a writing period Ta of the y-th horizontal period. In other words, the sum of writing periods (periods for writing signal into pixels) respectively associated with the first gate signal line to the y-th gate signal line is the writing period Taa of each sub-frame period.

The operation in the sub-frame period SF1 of the frame period F1 is described first. Here, the sub-frame period SF1 is the period for the first bit signal (uppermost bit digital signal). In this specification, the first bit is the uppermost bit and the n-th bit is the lowermost bit.

Digital signal voltages VD are inputted to the LAT1 1903 of the source signal line driving circuit 1901 through the time ratio gradation data signal generating circuit 1908. The time ratio gradation data signal generating circuit 1908 converts digital video signals into signals for displaying an image by a time ratio gradation method.

In response to sampling pulses from the shift register 1902, the source signal line driving circuit 1901 holds the first bit signal of the digital video signals VD in the LAT1 1903. Thereafter, the signals held in the LAT1 1903 are inputted to the LAT2 1904 at once in response to latch pulse LP to be outputted to the source signal lines.

If the display device is to input digital video signals to x source signal lines, it is sufficient if the LAT1 1903 and LAT2 1904 each can hold x bits digital video signals.

Assume that the gate signal line G1 is selected when the digital video signals are outputted to the source signal lines. Then the signals inputted to the source signal lines S1 to Sx are held in the storage capacitor 143 of each pixel in which the gate electrode of the switching TFT 141 is connected to the gate signal line G1.

In the writing period Taa1 for digital signals of the first bit, the electric potential of the opposite electrode of the light emitting element 144 is kept at almost the same level as the electric potential of the power supply lines V1 to Vx. Therefore the light emitting element 144 receives no current and does not emit light even when the driving TFT 142 is turned ON by the digital signals inputted to the source signal lines S1 to Sx.

After outputting the signals to the LAT2 1904, the LAT1 1903 starts holding digital video signals VD for the next horizontal period in order. Then the digital signals held in the LAT1 1903 are inputted to the LAT2 1904 at once in response to latch pulse LP to be outputted to the source signal lines S1 to Sx.

At this point, the gate signal line G2 is selected and the signals inputted to the source signal lines S1 to Sx are held in the storage capacitor 143 of each pixel in which the gate electrode of the switching TFT 141 is connected to the gate signal line G2. In the writing period Taa1, the above operation is repeated to select the gate signal lines G1 to Gy in order and input digital video signals to pixels. The inputted signals are held in the pixels. When the signals are inputted to all the pixels, the writing period Taa1 is ended. Then in the display period Ts1 for the first bit, the electric potential of the opposite electrode of the light emitting element 144 is changed such that the difference between that and the electric potential of the power supply lines V1 to Vx is large enough to cause the light emitting element 144 to emit light. The light emitting element 144 thus emits light only in each pixel whose driving TFT 142 is turned ON by the signals inputted from the source signal lines S1 to Sx.

Next, the electric potential of the opposite electrode of the light emitting element 144 is returned to almost the same level as the electric potential of the power supply lines V1 to Vx and the light emitting element 144 stops emitting light in every pixel. A writing period Taa2 in the second sub-frame period SF2 is thus started.

In the second sub-frame period, the gate signal lines G1 to Gy are selected in order similar to the first sub-frame period. This time, digital signals for the second bit are inputted to the gate electrode of the driving TFT 142 through the switching TFT 141. When the digital signals are inputted to all the pixels, the writing period Taa2 is ended. Then in the display period Ts2, the electric potential of the opposite electrode is changed such that the difference between it and the electric potential of the power supply lines V1 to Vx is large enough to cause the light emitting element 144 to emit light. The light emitting element 144 thus emits light in each pixel whose driving TFT 142 is turned ON.

Similar operation is conducted for the rest of digital signals until digital signals for the n-th bit are processed to complete the sub-frame periods SF1 to SFn. One frame period is thus finished. The lengths of the display periods Ts1 to Tsn of the sub-frame periods SF1 to SFn are set, for example, in accordance with the bits of signals inputted in the respective sub-frame periods and satisfy Tsn: Tsn−1: ... :Ts3:Ts2:Ts1=$2^0$: $2^1$:$2^2$: ... :$2^{n-2}$:$2^{n-1}$. The writing periods Taa1 to Taan each have the same length.

The gradation of a pixel in one frame period is determined by the sum of lengths of display periods in the one frame period in which the light emitting element 144 of the pixel emits light. When n=8, for instance, the luminance of a pixel is 100% if the pixel emits light in all of the display periods. If the pixel emits light in Ts8 and Ts7, the luminance thereof is 1%. If the pixel emits light in Ts6, Ts4, and Ts1, the luminance thereof is 60%.

Described above is the basic method in the time ratio gradation driving method.

Another method in the driving method is to allow pixels emit light for a display in the writing periods Taa1 to Taan as well as display periods.

In this method, the electric potential of the opposite electrode of the light emitting element 144 is set such that the difference between that and the electric potential of the power supply lines V1 to Vx is large enough to cause the light emitting element 144 to emit light also in the writing periods Taa1 to Taan. In other words, the display device is driven without changing the electric potential of the opposite electrode during one frame period in this method. A timing chart of this driving method is shown in FIG. 17.

In a writing period Taj (j is a natural number equal to or smaller than n) of one sub-frame period, the gate signal line G1 is selected to input signals to pixels on Row One (the first horizontal period). The pixels on Row One start or stop emitting light as soon as the signals are inputted in accordance with the inputted signals. The gate signal line G2 is selected next and signals are inputted to each pixel having a switching TFT whose gate electrode is connected to G2 (pixels on Row Two) (the second horizontal period). The pixels on Row Two start or stop emitting light as soon as the signals are inputted in accordance with the inputted signals. After conducting the above operation for all of the gate signal lines G1 to Gy is finished and the first to y-th horizontal periods are completed, one sub-frame period is ended.

In a sub-frame period, a period for writing in pixels connected to one gate signal line and a period for writing in pixels connected to another gate signal line are both denoted by Ta.

In the timing chart of FIG. 17, the starting point of writing signals in pixels varies between horizontal periods in a sub-frame period and therefore the starting point for a pixel to emit light also varies between horizontal periods. However, the length of the writing period Ta in one horizontal period is the same as the length of the writing period Ta in another horizontal period. Also, in a sub-frame period, the length of the display period Ts in one horizontal period is the same as the length of the display period Ts in another horizontal period.

In the above driving method, the lengths of the sub-frame periods SF1 to SFn may be set in accordance with the bits of signals inputted in the respective sub-frame periods and satisfy SFn:SFn−1: ... :SF3:SF2:SF1=$2^0$:$2^1$:$2^2$: ... :$2^{n-2}$:$2^{n-1}$, for example.

The description given in the above is about a digital gradation display method.

Now, a drive range of a driving TFT of a pixel in the digital method is shown in the graph of FIG. 28. For comparison, the operation range of the driving TFT 142 in the analog driving method described above is also shown in the graph.

In the analog method, the driving TFT operates in the vicinity of the saturation range.

On the other hand, the driving TFT in the digital method operates in a range equal to or lower than the threshold where no drain current flows and in a linear range. This makes it possible to use the switching TFT 141 and the driving TFT 142 as switches.

Therefore, in the digital driving method, fluctuation in characteristic of the switching TFT 141 and the driving TFT 142 does not cause much variation in the amount of current flowing into the light emitting element 144. Uneven display due to fluctuation in characteristic of the switching TFT 141 and the driving TFT 142 thus can be reduced.

However, the above digital method has the following problems.

One problem is that the driving circuits consume a large amount of power in the digital method. This is because the driving circuits have to operate at high speed especially when a high gradation is to be obtained.

Another problem is that the amount of current flowing in the light emitting element is changed to change the luminance even when a constant voltage is applied to the light emitting element. In the digital method, the driving TFT operates as a switch for applying a constant voltage between the anode and the cathode of the light emitting element of each pixel to make the light emitting element emit light. However, characteristics of the light emitting element are changed by a temperature change in the surroundings of the display device and this causes the luminance to vary.

FIG. 26 is a graph showing current-voltage curves at different temperatures. The voltage (applied voltage in the graph) in the curves is the voltage between the electrodes (anode and cathode) of the light emitting element, and the current in the curves is the current flowing between the electrodes of the light emitting element. The temperatures are of the surroundings of the display device and denoted by T1, T2, and T3. T1 is higher than T2 and T2 is higher than T3.

In FIG. 26, the current flowing in the light emitting element is increased in amount as the temperature rises even when the voltage applied between the electrodes of the light emitting element is kept constant. Since the luminance of the light emitting element is substantially in proportion to the amount of current flowing in the light emitting element, a temperature rise causes a change in luminance of the light emitting element. An increase in power consumption is also caused.

In the above analog or digital method, analog or digital voltage signals are inputted to source signal lines to display an image. This method is called a voltage drive method. On the other hand, a method of displaying an image by inputting a current to source signal lines has been proposed. This one is called a current drive method.

The current drive method provides a display device in which light is emitted at a constant luminance irrespective of a change in temperature of the surroundings.

The structure of this display device is described below.

A pixel structured as shown in FIG. 3 has been proposed in order to obtain the display device that is not affected by a temperature change.

The pixel having this structure is characterized in that uneven display between pixels is greatly reduced if TFTs of the pixels have uniform characteristics.

The structure of the pixel shown in FIG. 3 is described below.

The pixel has a first switching TFT 402, a second switching TFT 403, a TFT 404, a TFT 405, a storage capacitor 406, and a light emitting element 407. The TFTs 404 and 405 constitute a current mirror circuit. The storage capacitor 406 is not always necessary if the device makes a positive use of gate capacitances of the TFTs 404 and 405. A detailed description is given below on the structure of this pixel.

A gate electrode of the first switching TFT 402 is connected to a gate signal line G. The first switching TFT 402 has a source region and a drain region one of which is connected to a source signal line S and the other of which is connected to a source region or drain region of the second switching TFT 403 and to a source region or drain region of the TFT 404. Of the source region and drain region of the second switching TFT 403, the one that is not connected to the first switching TFT is connected to gate electrodes of the TFTs 404 and 405 and to the storage capacitor 406. A gate electrode of the second switching TFT 403 is connected to a selection line C. One side of the TFT 404 that is not connected to the second switching TFT 403 is connected to a power supply line V. One side of the storage capacitor 406 that is not connected to the gate electrodes of the TFTs 404 and 405 is connected to the power supply line V. The TFT 405 has a source region and a drain region one of which is connected to the power supply line V and the other of which is connected to one of electrodes of the Light emitting element 407.

A method of driving the pixel structured as above is described below. FIG. 4 is a circuit diagram showing the structure of a pixel portion in which pixels each structured as shown in FIG. 3 are arranged to form a matrix. The description is given with reference to the timing chart of FIG. 21. The reference symbols in FIGS. 3 and 4 are also used.

The first switching TFT and the second switching TFT here are n-channel TFTs. However, no problem arises if the first switching TFT and the second switching TFT are p-channel TFTs because they function as simple switches.

Signals are inputted to a gate signal line Gk (k is a natural number equal to or smaller than y) to turn the first switching TFT 402 ON. A selection line Ck also receives signals to turn the second switching TFT 403 ON, which causes a signal current $I_{in}$ to flow to source signal lines S1 to Sx from the pixels. The signal current $I_{in}$ flowing in the source signal lines is set to a given value by a source signal line driving circuit.

The signal current $I_{in}$ flows first through the first switching TFT 402, the second switching TFT 403, and the storage capacitor 406 between the source signal line S and the power supply line V. As a result, electric charges are held in the storage capacitor 406. When the electric charges held push the gate/source voltage of the TFT 404 over the threshold, a current starts to flow through the TFT 404. After a sufficient period of time passes, the current flowing in the TFT 404 reaches the level of the signal current $I_{in}$. The gate voltage of the TFT 404 at this point is held in the storage capacitor 406.

The second switching TFT 403 connects the drain region of the TFT 404 to the gate electrode thereof. Therefore the gate/source voltage (gate voltage) of the TFT 404 is equal to the source/drain voltage thereof to make the TFT 404 operate in a saturation range. In a TFT that operates in a saturation range, the drain current takes an almost constant value once the gate voltage corresponding thereto is fixed.

The gate voltage of the TFT 404 is kept equal to the gate voltage of the TFT 405.

The TFT 404 and the TFT 405 that constitute a current mirror circuit have identical characteristics.

Accordingly, the signal current $I_{in}$ flowing in the TFT 404 is equal to a current I inputted to the light emitting element 407 through the drain/source of the TFT 405 from the power supply line V.

After the gate voltage of when the signal current $I_{in}$ flows in the TFT 404 is held in the storage capacitor 406, the second switching TFT 403 is turned OFF. If the first switching TFT 402 is also turned OFF at this point, it does not stop the TFTs 404 and 405 from maintaining the electric potential of their gate electrodes and the current I is kept inputted to the light emitting element 407. In this way the light emitting element continues to emit light at a luminance according to the current I, namely, the signal current $I_{in}$.

If an adjustment is made so that the next signal current $I_{in}$ flows in the source signal line in the same pixel in the second frame period F2 after the first frame period is ended, the electric potential according to the new signal current $I_{in}$ is held in the storage capacitor 406. The current inputted to the light emitting element 407 is therefore changed to a current I according to the new signal. Then the light emitting element 407 emits light at a luminance according to the signal current $I_{in}$.

Before allowing the signal current $I_{in}$ for the next frame period to flow in the source/drain of the TFT 404, each pixel may discharge the voltage previously held in the storage capacitor, namely the previous gate voltage of the TFTs 404 and 405 that constitute a current mirror circuit. In order to discharge the electric charges held in the storage capacitor 406, electric potentials of two electrodes of the storage capacitor 406 are made equal to each other by, for example, connecting wiring lines using a switch or the like.

FIG. 20 is a block diagram of the display device that has pixels each structured as shown in FIGS. 3 and 4 when the device is driven in accordance with the timing chart of FIG. 21.

In FIG. 20, the display device is composed of a source signal line driving circuit 2001, a gate signal line driving circuit 2007a, a selection line driving circuit 2007b, and a pixel portion 2000. The source signal line driving circuit 2001 is composed of a shift register 2002, an LAT1 2003, an LAT2 2004, a DAC 2005, and a constant current circuit 2006.

The shift register 2002 receives clock pulses CLK and start pulses SP and outputs sampling pulses. In response to the sampling pulses, the LAT1 2003 holds signal voltages of digital video signals VD in order.

The amount of information the digital video signals here have is n bits.

Digital video signals of the respective bits out of n bits are inputted to the LAT1 2003. Digital video signals inputted from the external are subjected to serial/parallel conversion in advance using an SPC (serial-to-parallel conversion circuit) or the like, and n bits signals are simultaneously inputted to the LAT1 2003. After signals for one horizontal period are all inputted to the LAT1 2003, the signals are then inputted to the LAT2 2004 at once in response to latch pulses LP. When the source signal line driving circuit for outputting signals to x source signal lines handles n-bit digital video signals, the LAT1 2003 and the LAT2 2004 each have to store xn bits digital signals.

The SPC (not shown in the drawing) for converting these signals may be formed on the same substrate on which the pixel portion is formed. Alternatively, the SPC may be an IC chip attached to the top face of the substrate on which the pixel portion is formed.

The n bits digital video signals VD associated with one source signal line are held in the LAT2 2004 and their signal voltages are inputted to the DAC 2005 to be converted into corresponding analog signal voltages.

The analog signal voltages obtained by the conversion are inputted to the constant current circuit 2006. The constant current circuit 2006 outputs a signal current according to the analog signal voltages to the source signal lines.

A circuit having a known structure can be used as the constant current circuit 2006 that outputs a constant current according to an inputted analog signal voltage.

The pixels structured as shown in FIG. 4 are thus driven in accordance with the tinting chart of FIG. 21 to display an image.

An example of the display device using the current drive method is described as above.

In the above-described driving method that uses an analog signal current inputted to source signal lines to control a current inputted to a light emitting element, the value of the current inputted to the light emitting element is set. The method is therefore free from the problem of fluctuated luminance of the light emitting element which is caused by a change in temperature of the surroundings.

However, in the display device of the current drive method as above, the amount of current flowing in the circuits is increased as the gradation becomes higher to raise a new problem of increased power consumption.

In the case where an analog method is used in a display device of conventional voltage drive method, fluctuation in characteristics of TFTs of pixels causes the problem of uneven display.

In the case where a digital method and a time ratio gradation method are employed in a display device of conventional voltage drive method, one frame period has to be divided into many sub-frame periods in order to obtain a large gradation number. The driving circuits accordingly have to operate at high speed to raise the problem of increased power consumption.

When there is a large shift in temperature of the surroundings in which the display device is used, the temperature characteristic of the light emitting element is greatly changed to change the amount of current flowing in the light emitting element and make it difficult to keep the luminance of the display device constant.

On the other hand, a display device of conventional current drive method is not suitable for higher gradation.

SUMMARY OF THE INVENTION

The present invention has been made in view of the above and an object of the present invention is therefore to provide a driving method that does not allow a change in temperature of the surroundings to change the luminance of a light emitting element of a pixel for a display device with less uneven display, higher gradation, and reduced power consumption.

A time ratio gradation driving method is applied to a pixel that is structured as shown in FIG. 3 to have a current mirror circuit and use the current drive method. The bit number of digital video signals to be sampled by a source signal line driving circuit is reduced with the use of a switching signal, thereby saving the power consumption when high gradation display is not necessary.

The method of driving a display device which is free from uneven display, extra power consumption, and influence of temperature change is thus obtained.

The structure of the present invention is described below.

The present invention provides a method of driving a display device, said method comprising the steps of:
 inputting a constant signal current into a pixel;
 wherein the pixel emits a light with a constant luminance by the constant signal current;
 dividing one frame period into a plurality sub-frame periods,
 wherein whether the pixel emits the light or not is determined in each of the plurality of sub-frame periods.

The present invention provides a method of driving a display device, said method comprising the steps of:
 inputting a first current into a pixel;
 converting the first current into a voltage;
 holding the voltage;
 converting the voltage into a second current;
 inputting the second current into a light emitting element of the pixel;
 wherein the light emitting element emits a light with a constant luminance;
 dividing one frame period into a plurality of sub-frame periods,
 wherein whether the pixel emits the light or not is determined in each of the plurality of sub-frame periods.

The present invention provides a method of driving a display device,
 said display device comprising:
  a pixel including a first thin film transistor, a second thin film transistor and a light emitting element;
 said method comprising the steps of:
  inputting a first current into the pixel;
  wherein the first current is a first drain current of the first thin film transistor operated in a saturation range;
  holding a first gate voltage of the first thin film transistor;
  wherein the first gate voltage of the thin film transistor is a second gate voltage of the second thin film transistor;
  inputting a second drain current of the second thin film transistor into the light emitting element;
  wherein the light emitting element emits a light with a constant luminance;
  dividing one frame period into a plurality of sub-frame periods,
 wherein whether the pixel emits the light or not is determined in each of the plurality of sub-frame periods.

The present invention provides a method of driving a display device,
 said display device comprising:
  a plurality of pixels;
  a driver circuit inputted with n bits digital signals, wherein n is a natural number;
 said method comprising the steps of:
  inputting a constant signal current into each of the plurality of pixels;

wherein each of the plurality of pixels emits a light with a constant luminance by the constant signal current;

dividing one frame period into a plurality of sub-frame periods;

selecting an output of a constant current into each of the plurality of pixels in accordance with each of a first bit digital signal to an n-th bit digital signal among the n bits digital signals by the driver circuit in each of the plurality of sub-frame periods, wherein whether the pixel emits the light or not is determined.

The method of driving the display device is characterized in that:

wherein an m-th bit digital signal to the n-th digital signal among the n bits digital signals are not sampled by the driver circuit, wherein m is a natural number smaller than n.

The method of driving the display device is characterized in that:

wherein the m-th bit digital signal to the n-th digital signal correspond to lower m bits digital signals of then bits digital signals.

The method of driving the display device is characterized in that:

the display device is in combination with an electronic apparatus.

The present invention provides a method of driving a display device that has a source signal line driving circuit, a gate signal line driving circuit, and a pixel portion, the pixel portion having a plurality of pixel, a plurality of source signal lines, a plurality of gate signal lines, and a plurality of power supply lines, the plural pixels each having a switching TFT (thin film transistor), a first TFT, a second TFT, and a light emitting element, the first TFT and the second TFT constituting a current mirror circuit, the first TFT having a gate electrode connected to a gate electrode of the second TFT, the plural source signal lines receiving a signal current from the source signal line driving circuit, the gate signal line driving circuit selecting one of the plural gate signal lines, and the light emitting element emitting light by receiving a current from its associated power supply line through the source/drain of the second TFT that constitutes the current mirror circuit in the pixel in which the source/drain of the switching TFT is turned conductive, and the driving method is characterized in that:

whether or not the signal current is outputted to the plural source signal lines is chosen to decide whether the light emitting element emits light or not; and the luminance is determined by the total length of time the light emitting element emits light in one frame period.

The present invention provides a method of driving a display device that has a source signal line driving circuit, a gate signal line driving circuit, a selection line driving circuit, and a pixel portion, the pixel portion having a plurality of pixels, a plurality of source signal lines, a plurality of gate signal lines, a plurality of power supply lines, and a plurality of selection lines, the plural pixels each having a first switching TFT, a second switching TFT, a first TFT, a second TFT, and a light emitting element, the first TFT and the second TFT constituting a current mirror circuit, the first switching TFT having a source region and a drain region one of which is connected to one of the source signal lines, and the other of which is connected to a source region or drain region of the second switching TFT and to a source region or drain region of the first TFT, the first switching TFT having a gate electrode connected to one of the plural gate signal lines, one of the source region and drain region of the second switching TFT that is not connected to the first switching TFT being connected to gate electrodes of the first and second TFTs, one of the source region and drain region of the first TFT that is not connected to the source region or drain region of the second switching TFT being connected to one of the plural power supply lines, the second switching TFT having a gate electrode connected to one of the plural selection lines, the second TFT having a source region and a drain region one of which is connected to one of the plural power supply lines and the other of which is connected to the light emitting element, the plural source signal lines receiving a signal current from the source signal line driving circuit, the gate signal line driving circuit selecting one of the plural gate signal lines, the selection line driving circuit selecting one of the plural selection lines, in the pixel in which the source/drain of the first switching TFT is turned conductive and the source/drain of the second switching TFT is turned conductive, the signal current flowing between the source and drain of the first TFT that constitutes the current mirror circuit, and the light emitting element emitting light by receiving a current from its associated power supply line through the source/drain of the second TFT that constitutes the current mirror circuit, and the driving method is characterized in that:

whether or not the signal current is outputted to the plural source signal lines is chosen to decide whether the light emitting element emits light or not; and the luminance is determined by the total length of time the light emitting element emits tight in one frame period.

The method of driving a display device is characterized in that:

the one frame period is divided into a plurality of sub-frame periods; and each of the plural sub-frame periods has a display period in which whether or not the light emitting element in each pixel emits light is determined.

The method of driving a display device is characterized in that:

n-bits (n is a natural number) digital video signals are inputted from the external;

the plural sub-frame period include r (r is a natural number equal to or larger than n) sub-frame periods; and n periods are combined with the display periods of the r sub-frame periods to obtain gradations, the ratio of lengths of the n periods being set to $2^0:2^{-1}:2^{-2}: \ldots 2^{-(n-2)}:2^{-(n-1)}$.

The method of driving a display device is characterized in that:

n-bits (n is a natural number) digital video signals are inputted from the external;

the plural sub-frame periods include n sub-frame periods; and the ratio of lengths of display periods of the n sub-frame periods is set to $2^0:2^{-1}:2^{-2}:\ldots 2^{-(n-2)}:2^{-(n-1)}$.

The method of driving a display device is characterized in that m (m is a natural number smaller than n) bits digital video signals are not sampled by the source signal line driving circuit.

The method of driving a display device is characterized in that the m bits digital video signals correspond to m bits digital video signals, m bit being lower out of the n-bit digital video signals.

The method of driving a display device is characterized in that sub-frame periods for the lower m bits digital video signals have no-sampling-pulse periods in which a shift register constituting the source signal line driving circuit stops outputting sampling pulses.

The method of driving a display device is characterized in that sub-frame periods for the lower m bits digital video signals have reset periods and no-sampling-pulse periods in which a shift register constituting the source signal line driving circuit stops outputting sampling pulses.

The method of driving a display device is characterized in that:
the display device further includes a reset circuit for changing the digital video signals into an output of a constant electric potential; and
a '0' signal is inputted from the reset circuit to the source signal line driving circuit during the reset period to be sampled and outputted to the plural source signal lines.

The method of driving a display device is characterized in that the display device further includes a start pulse controlling circuit for changing a start pulse to be inputted to the shift register into an output of a constant electric potential during the no-sampling-pulse period.

The method of driving a display device is characterized in that the display device further includes a clock puke controlling circuit for changing a clock pulse to be inputted to the shift register into an output of a constant electric potential during the no-sampling-pulse period.

The method of driving a display device is characterized in that the display device further includes a sampling pulse controlling circuit for changing a sampling pulse to be outputted from the shift register into an output of a constant electric potential during the no-sampling-pulse period.

The method of driving a display device is characterized in that:
the reset circuit has a NAND and an inverter;
the digital video signals and switching signals are inputted to the NAND; and
signals outputted from the NAND are outputted from the reset circuit through the inverter.

The method of driving a display device is characterized in that:
the start pulse controlling circuit has a NAND and an inverter;
the start pulses and switching signals are inputted to the NAND; and
signals outputted from the NAND are outputted from the start pulse controlling circuit through the inverter.

The method of driving a display device is characterized in that:
the clock pulse controlling circuit has a NAND and an inverter;
the clock pulses and switching signals are inputted to the NAND; and
signals outputted from the NAND are outputted from the clock pulse controlling circuit through the inverter.

The method of driving a display device is characterized in that:
the sampling pulse controlling circuit has a NAND and an inverter;
the sampling pubes and switching signals are inputted to the NAND; and
signals outputted from the NAND are outputted from the sampling pulse controlling circuit through the inverter.

The method of driving a display device is characterized in that a light emitting layer of the light emitting element is formed of an organic material.

The method of driving a display device is characterized in that a light emitting layer of the light emitting element is formed of an inorganic material.

The present invention provides a portable information terminal, a personal computer, an image reproducing device, a television, a head-mounted display, or a video camera to which the method of driving a display device is applied.

BRIEF DESCRIPTION OF THE DRAWINGS

FIG. 18 is a block diagram showing the structure of a display device in prior art;

FIGS. 23A to 23C are diagrams showing a process of manufacturing a display; device of Embodiment 5;

FIGS. 27A to 27F are diagrams of electronic equipment of Embodiment 7;

DETAILED DESCRIPTION OF THE PREFERRED EMBODIMENTS

Embodiment Mode 1

A method of driving a display device in accordance with the present invention is described.

Figure 1:
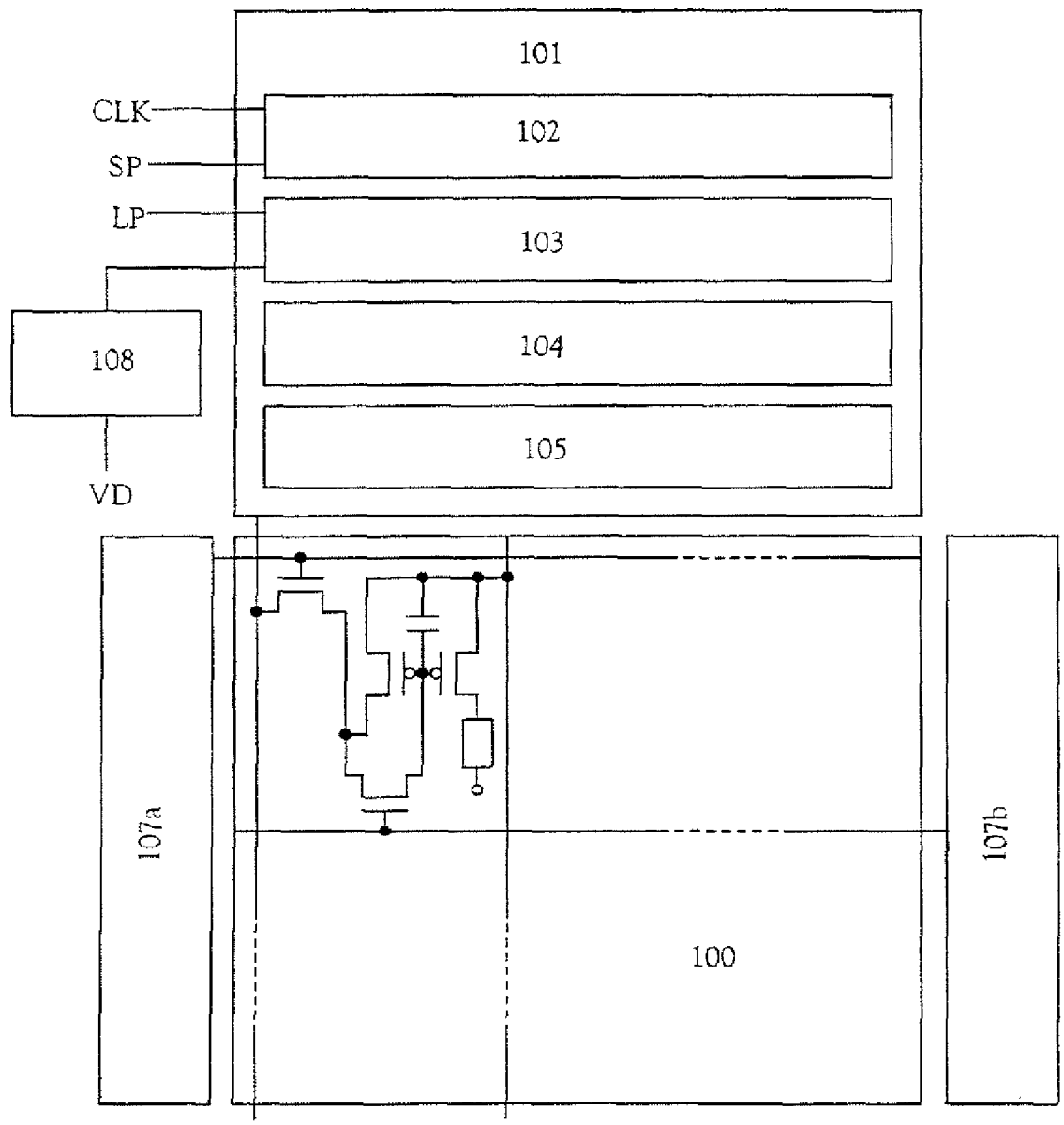
FIG. 1 is a block diagram showing the structure of a display device of the present invention.

FIG. 1 is a block diagram of a display device of the present invention.

The display device is composed of a source signal line driving circuit 101, a gate signal line driving circuit 107a, a selection line driving circuit 107b, a time ratio gradation data signal generating circuit 108, and a pixel portion 100. The source signal line driving circuit 101 is composed of a shift register 102, an LAT1 103, an LAT2 104, and a constant current circuit 105. Circuits having known structures can freely be used for the time ratio gradation data signal generating circuit 108, the gate signal line driving circuit 107a, and the selection line driving circuit 107b. The display device may have a level shifter, a buffer, and the like though they are omitted in FIG. 1.

The source signal line driving circuit 101 is placed on one side of the pixel portion 100 in FIG. 1. However, a source signal line driving circuit may be placed on each side of the pixel portion 100. This arrangement (in which the pixel portion 100 is flanked with source signal line driving circuits) is preferred in terms of drive efficiency and reliability of the display device.

Figure 3:
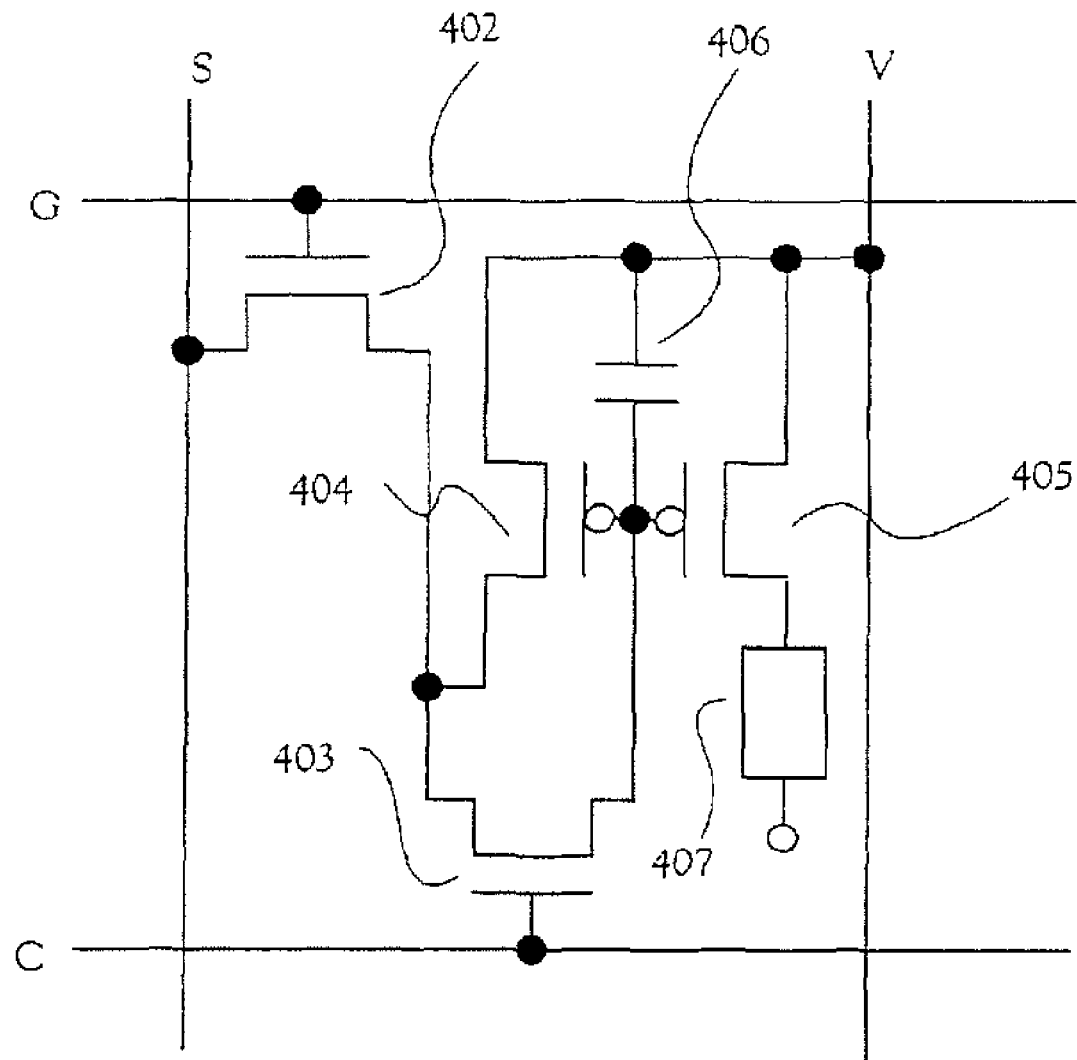
FIG. 3 is a diagram showing the structure of a pixel in a display device of the present invention.
Figure 4:
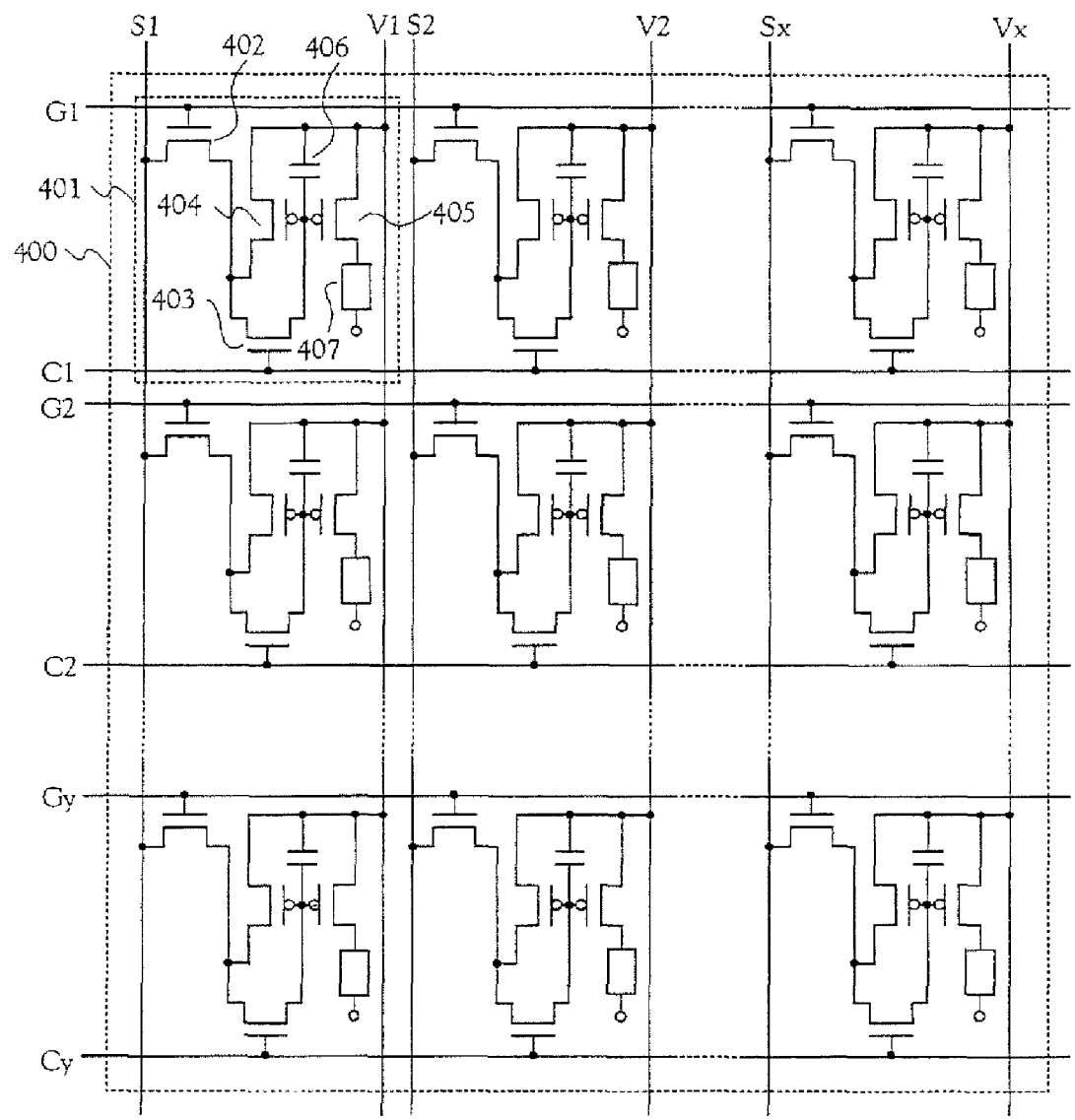
FIG. 4 is a circuit diagram showing the structure of a pixel portion in a display device of the present invention.

The structure of the pixel portion 100 and the structure of pixels in the pixel portion are identical with those in prior art shown in FIGS. 3 and 4. Therefore, a detailed description on the pixel structure is omitted here.

The description given in the above is about the structure of the display device.

Next, a method of driving the display device in accordance with the present invention is described.

Signals inputted to pixels are digital current signals and the device displays an image using a time ratio gradation method. That is, whether a display is carried out or not is selected by whether a predetermined signal current is inputted into a pixel or not.

The time ratio gradation method is described first.

A period necessary for preparing display of one image is expressed as a frame period (F). Here, the length of one frame period is set to about 1/60 second. With this length, human eye does not see flickering in animation displayed.

One frame period is divided into n sub-frame periods SF1 to SFn. The sub-frame period SF1 is a period for the first bit signals. In this embodiment mode, the first bit is the uppermost bit and the n-th bit is the lowermost bit.

In each sub-frame period, a light emitting element of each pixel emits or does not emit light.

The lengths of the sub-frame periods SF1 to SFn may be set in accordance with the bits of signals inputted in the respective sub-frame periods and satisfy SFn SFn-1: . . . :SF3:SF2: SF1=$2^0$:$2^1$:$2^2$: . . . :$2^{n-2}$:$2^{n-1}$, for example.

The gradation of a pixel in one frame period is determined by the sum of lengths of display periods in the one frame period in which the light emitting element of the pixel emits light. When n=8, for instance, the luminance of a pixel is 100% if the pixel emits light in all of the sub-frame periods. If the pixel emits light in SF8 and SF7, the luminance thereof is 1%. If the pixel emits light in SF6, SF4, and SF1, the luminance thereof is 60%.

The description given in this embodiment mode takes as an example the case in which the display device is driven by the time ratio gradation method while dividing one frame period into n sub-frame periods and using inputted n-bit digital video signals to obtain 2 gradations. However, the present invention is not limited thereto.

In short, the driving method of this embodiment mode can be used in a general case in which one frame period is divided into r is a natural number equal to or larger than n) sub-frame periods using n-bit digital video signals to obtain $2^n$ gradations. Lengths of the sub-frame periods SF1 to SFr are set to suit individual cases.

For instance, the length of a display period for an upper bit may be equal to cumulation of display periods of plural sub-frame periods.

In the timing chart of this embodiment mode, the sub-frame period for the upper bit comes first and then sub-frame periods for progressively lower bits follow to complete one frame period. However, in the method of driving the display device in accordance with the present invention, the order of sub-frame periods in one frame period may be arbitrarily irrespective of their lengths.

That is the basics of the method of driving the display device in accordance with the present invention.

Now, the operation of the source signal line driving circuit when the above time ratio gradation method is employed is described.

In the display device of the present invention, the source signal line driving circuit has to choose whether to output a constant current to source signal lines or not in order to choose whether or not the light emitting element emits light.

Described below are operations of the circuits in the source signal line driving circuit 101 shown in FIG. 1.

Clock pulses CLK and start pulses SP are inputted to the sift register 102. The shift register 102 also receives inverted clock pulses CLKB obtained by inverting the polarity of clock pulses CLK. Inverted clock pulses CLKB are not shown in FIG. 1. The shift register 102 outputs sampling pulses in response to clock pulses CLK, inverted clock pulses CLKB, and start pulses SP. In response to the sampling pulses, digital video signals VD inputted from the external are held in order in stages of the LAT1 103 which are respectively associated with the source signal lines.

Digital video signals inputted from the external are converted by the time ratio gradation data signal generating circuit 108 into signals for driving the display device by the time ratio gradation method, and then inputted to the LAT1.

After all of digital video signals VD for one horizontal period are held in the LAT1, latch pulses LP are inputted to output the digital video signals VD held in the LAT1 103 to the LAT2 104 at once. The digital video signals VD held in the LAT2 104 are then inputted to the constant current circuit 105 at once. Based on the inputted digital signal voltages VD, the constant current circuit 105 decides whether to input a constant current to source signal lines S1 to Sx or not. A digital signal current is thus outputted to the source signal lines S1 to Sx.

Circuits having known structures can freely be used as the shift register 102, the LAT1 103, the LAT2 104, and the constant current circuit 105.

The description above is about the basic operations of the circuits in the source signal line driving circuit 101 shown in FIG. 1.

Next, a detailed description is given on the method of driving the display device in accordance with the present invention referring to timing charts.

Figure 2:
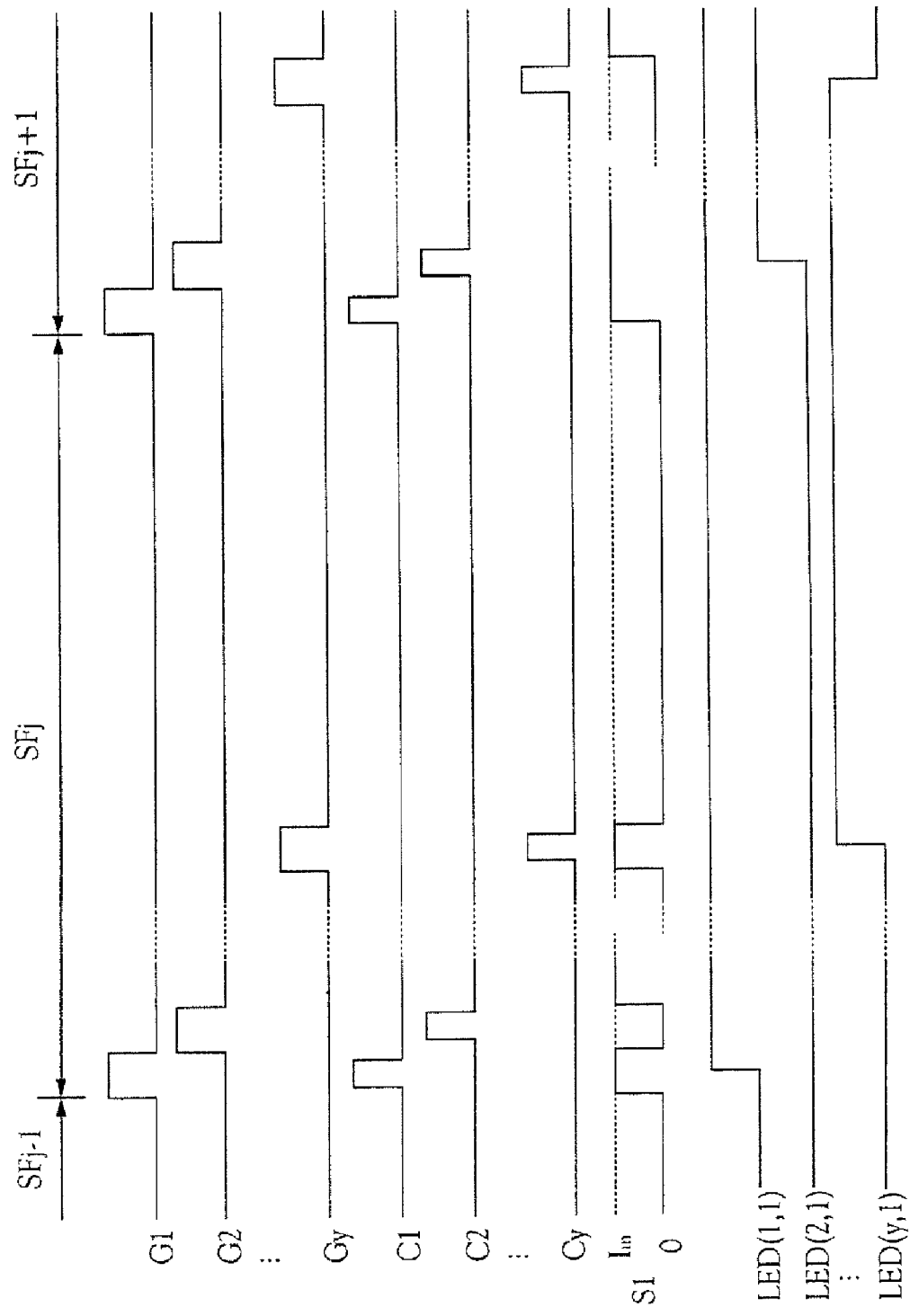
FIG. 2 is a timing chart showing a method of driving a display device in accordance with the present invention.

FIG. 2 is a timing chart showing the method of driving the display device in accordance with the present invention. The explanation employs reference symbols used in FIGS. 1, 2, 3, and 4.

Operations of sampling digital video signal voltages VD in the source signal line driving circuit 101, holding the digital signal voltages in the LAT1 103, and outputting them to the LAT2 104 at once are exactly as the above-described basic operations of the circuits in the source signal line driving circuit 101. The explanation is therefore not repeated here.

The operation in a sub-frame period SFj is described in detail below.

The digital signal voltages VD held in the LAT2 104 are inputted to the constant current circuit 105. Based on the inputted digital signal voltages VD, the constant current circuit 105 decides whether to output a constant signal current or not. To elaborate, the constant current circuit 105 outputs a constant current to the source signal line when the signals inputted from the LAT2 104 are '1' signals. On the other hand, the constant current circuit 105 does not output a current to the source signal line when the digital signal voltages VD inputted from the LAT2 104 are '0' signals.

In this way, a light emitting element 407 receives a signal current and emits light only in a selected pixel in a sub-frame period.

An input to the source signal line S1 is shown as a representative in FIG. 2. However, the same operation is conducted for all of the source signal lines.

To make the light emitting element 407 of each pixel 401 to emit light, a first switching TFT 402, a second switching TFT 403, and TFTs 404 and 405 that constitute a current mirror circuit operate the same way as the TFTs in the conventional example. Therefore the explanation is omitted here.

When the signal is inputted to the source signal line S1 and a gate signal line G1 and a selection line C1 are selected, in the pixel on Row One and Column One (hereinafter referred to as pixel (1, 1)), its light emitting element, LED (1, 1), emits light. This light emitting element, LED (1, 1), continues to emit light during SFj, at least.

When a gate signal line G2 and a selection line C2 are selected and the signal current is not inputted to the source signal line S1, a light emitting element, LED (2, 1) of a pixel (2, 1) does not emit light. The light emitting element, LED (2, 1), of the pixel (2, 1) continues to emit no light at least until the gate signal line G2 and the selection line C2 are selected in the next sub-frame period.

Similar operation is conducted for all of the gate signal lines G1 to Gy and selection lines C1 to Cy to complete one sub-frame period.

The luminance of light emitted from a pixel is determined by summing up light emission periods in sub-frame periods in one frame period during which the pixel emits light.

The method of driving the display device in accordance with the present invention is described as above.

A description given next is about the structure of the constant current circuit in the source signal line driving circuit of the display device.

Figure 29A:
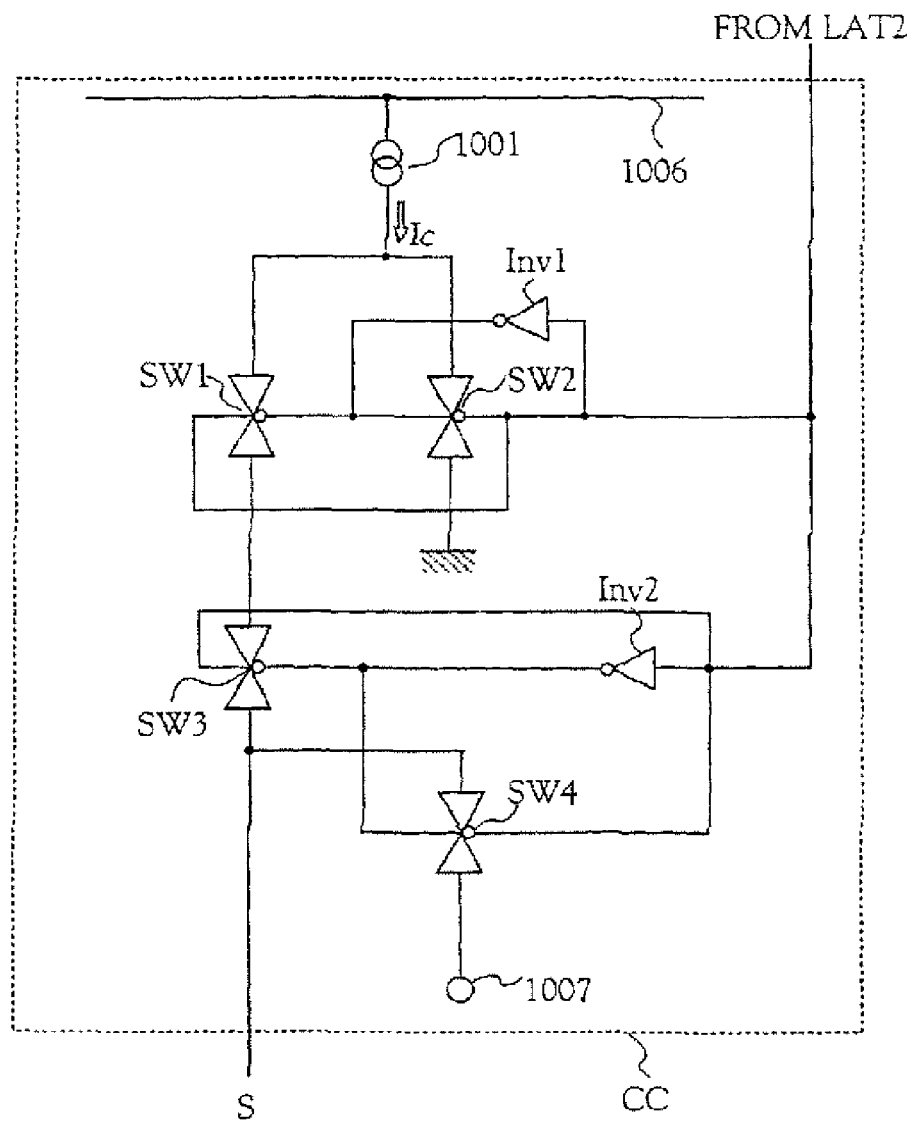
FIGS. 29A and 29B are circuit diagrams showing the structure of a constant current circuit in a display device of the present invention.
Figure 29B:
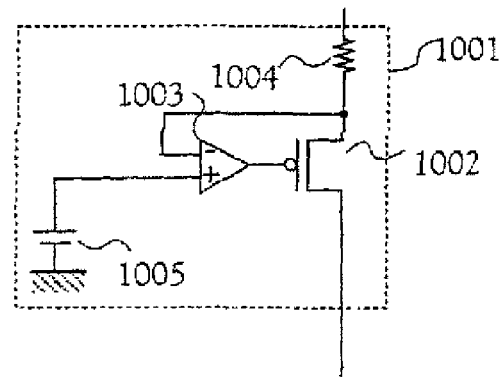

FIGS. 29A and 29B show an example of the actual structure of the constant current circuit in the display device of the present invention.

In FIG. 29A, a constant current circuit CC is composed of a constant current supply 1001, a power supply line 1006, switches SW1 to SW4, inverters Inv1 and Inv2, and a terminal 1007. FIG. 29B shows details of the structure of the constant current supply 1001 of FIG. 29A. In FIG. 29B, the constant current supply 1001 is composed of a TFT 1002, an operation amplifier 1003, a resistor 1004, and a constant voltage supply 1005.

How the constant current circuit of FIGS. 29A and 29B operates is described in detail below.

In digital methods, signals are '1' or '0' and have either Hi voltage or Lo voltage.

Of signals outputted from the LAT2, ones having Hi voltages correspond to '1' signals and ones having Lo voltages correspond to '0' signals in the example here, but this embodiment mode is not limited thereto. The present invention can readily applied to the case in which signals having Hi voltages correspond to '0' signals and signals having Lo voltages correspond to '1' signals.

In FIG. 29A, signal voltages outputted from the LAT2 are inputted to the switches SW2 and SW4, or inputted to the switch SW1 through the inverter Inv1 and to the switch SW3 through the inverter Inv2. When signals outputted from the LAT2 are '1' signals, namely, Hi signals, the switch SW1 and the switch SW3 are turned ON whereas the switch SW2 and the switch SW4 are turned OFF. Then a constant current Ic is outputted from the power supply line 1006 through the constant current supply 1001, the switch SW1 and the switch SW3 to the source signal line S.

When a pixel structured as shown in FIG. 3 is used, the constant current Ic is a negative current. In other words, the current actually flows from the source signal line S to the power supply line 1006.

On the other hand, when signals inputted from the LAT2 are '0' signals, namely, Lo signals, the switch SW1 and the switch SW3 are turned OFF whereas the switch SW2 and the switch SW4 are turned ON. Then a constant current Ic flows from the power supply line 1006 through the constant current supply 1001 and the switch SW2 to the ground portion. A terminal 1007 receives a power supply electric potential V0. The power supply electric potential V0 is inputted to the source signal line S through the switch SW4.

Here, the power supply electric potential V0 is set to a level almost the same as the electric potential of the power supply lines in the pixel portion. This keeps the light emitting element of the pixel from emitting light when the LAT2 outputs '0' signal voltages to turn the first switching TFT and the second switching TFT ON.

The operation of the constant current supply shown in FIG. 29B is described in detail below.

A voltage is applied to a source region of the TFT 1002 through the resistor 1004 that is connected to the power supply line 1006. The constant voltage supply 1005 applies a constant voltage to a non-inversion input terminal of the operation amplifier 1003. The source region of the TFT 1002 is connected to the inversion input terminal of the operation amplifier 1003. An output terminal of the operation amplifier 1003 is connected to a gate electrode of the TFT 1002.

The voltage level of the constant voltage supply 1005 and the electric potential of the power supply line 1006 are set so as to allow a current to flow between the source and the drain of the TFT 1002.

The structure of the constant current supply 1001 is not limited to the one in FIG. 29B, and the present invention can freely use a constant current supply having a known structure.

Embodiment Mode 2

This embodiment mode describes how the power consumption is reduced in a method of driving a display device in accordance with the present invention. To reduce power consumption, an operation of sampling information of lower bits is stopped with a switching signal so that driving circuits (a source signal line driving circuit and a gate signal line driving circuit) conduct less operations.

The display device here obtains gradations using n-bit (n is a natural number equal to or larger than 2) digital video signals that are inputted from the external.

Of the inputted digital video signals, signals of lower bits (here, lower bits are m bit to n bit; m is a natural number equal to or larger than 2 and equal to or less than n) are distinguished from the rest, namely, (m−1) bits signals. Only signals of (m−1) bits are used to obtain gradations of luminance.

Figure 7:
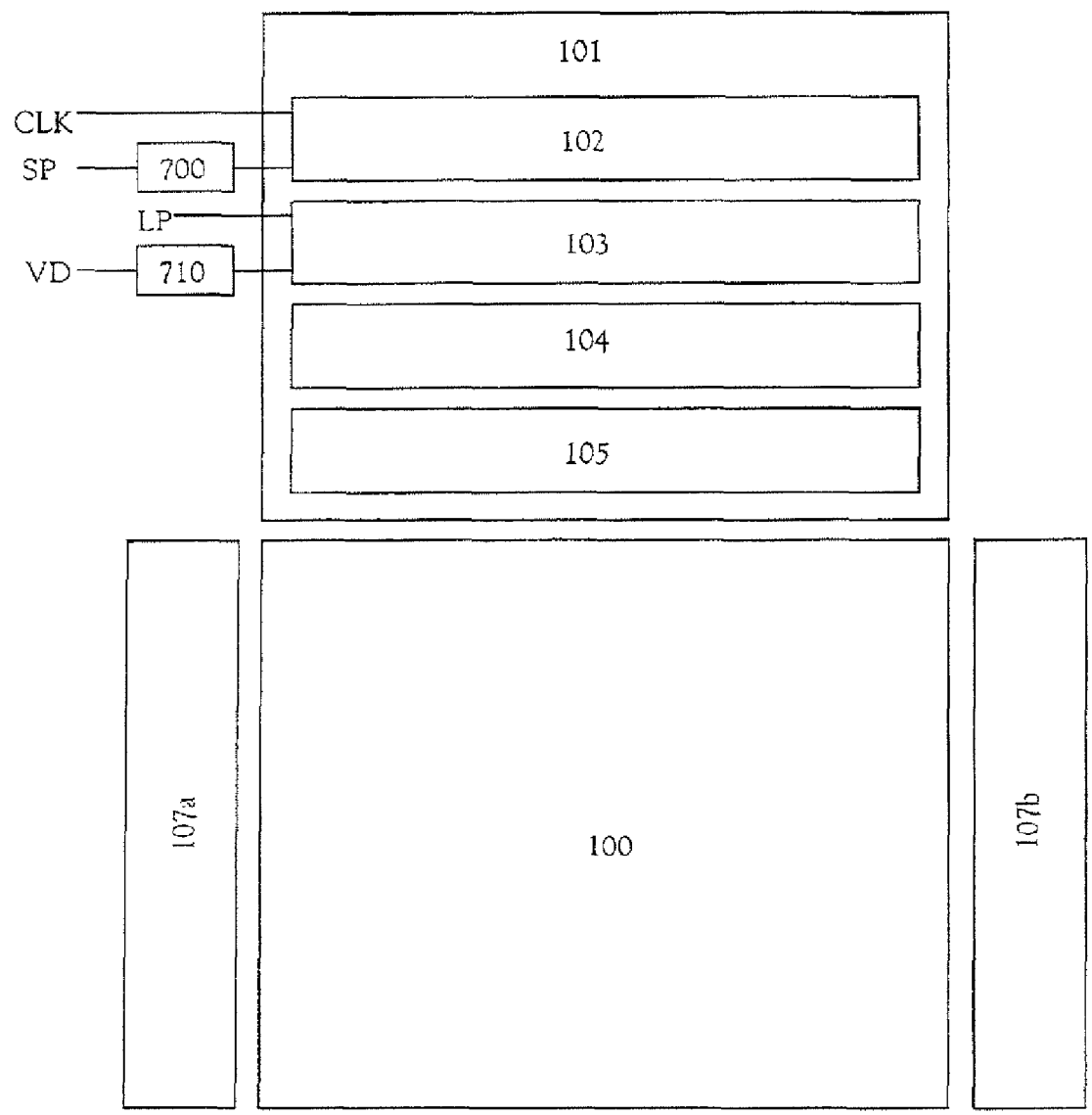
FIG. 7 is a block diagram showing the structure of a display device of the present invention.

The structure of the display device of this embodiment Mode is shown in block diagram in FIG. 7.

Components of the display device that are identical with those shown in FIG. 1 are denoted by the same reference symbols and explanations thereof are omitted. Start pulses SP, which are to be inputted to a source signal line driving circuit 101, are inputted through a start pulse controlling circuit 700 to a shift register 102 of the source signal line driving circuit 101. The start pulse controlling circuit 700 switches between outputting start pulses SP and outputting a constant signal electric potential.

A reset circuit 710 switches between inputting digital video signals VD to the source signal line driving circuit 101 as they are and inputting only '0' signals to the circuit 101.

A pixel portion 100 here has x source signal lines S1 to Sx, x power supply lines V1 to Vx, y gate signal lines G1 to Gy, and y selection lines C1 to Cy.

The structure of the pixel portion 100 is the same as the one shown in FIG. 4, and its description is therefore omitted here.

Figure 5:
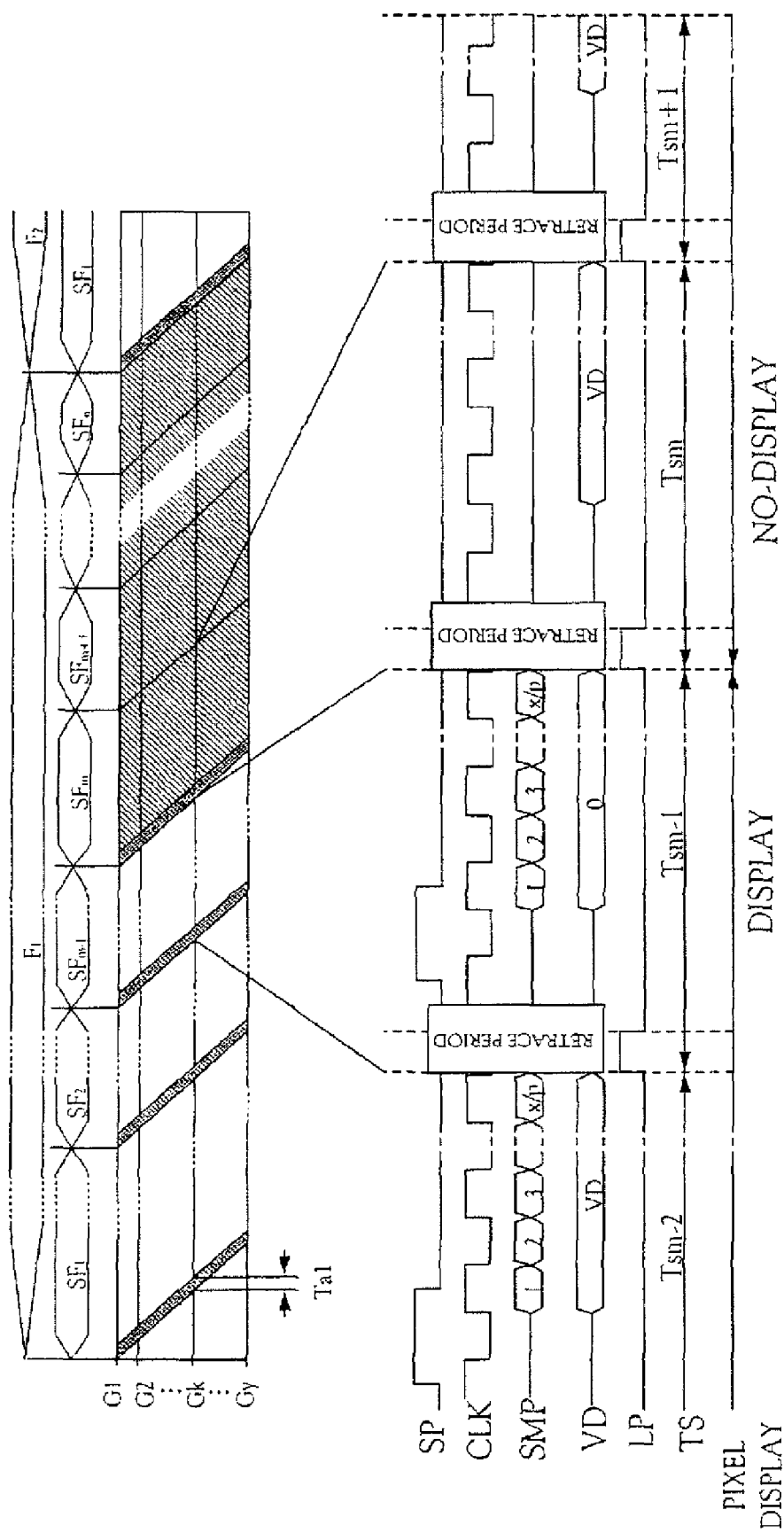
FIG. 5 is a timing chart showing a method of driving a display device in accordance with the present invention.

FIG. 5 is a timing chart showing the method of driving the display device in accordance with this embodiment mode. The explanation uses the reference symbols in FIG. 7. Also, reference is made to FIG. 4.

In a first sub-frame period SF1, the start pulse controlling circuit 700 outputs start pulses SP as they are to the shift register 102 of the source signal line driving circuit 101. This operation in the first sub-frame period is the same as Embodiment Mode 1.

In the first sub-frame period SF1, start pulses (SP), clock signals (CLK), and the like are inputted and, in response to sampling pulses (SMP) outputted from the shift register 102, an LAT1 103 holds the first bit (the uppermost bit) digital video signals VD that are inputted from the external. After the LAT1 103 completes holding signals to be outputted to all the source signal lines S1 to Sx, the signals held in the LAT1 are inputted to an LAT2 104 at once in response to latch pulses (LP). The signals are held in the LAT2 104 and then inputted to a constant current circuit 105. The constant current circuit 105 decides whether to output a constant current to the source signal lines or not based on the inputted signal voltages.

The method of driving the constant current circuit 105 and the pixel portion is the same as Embodiment Mode 1 and the explanation is therefore omitted here.

The signals outputted to the source signal lines S1 to Sx are inputted to pixels that are connected to selected gate signal line and selection line and held in the pixels.

In a sub-frame period, a writing period Ta is a period in which the constant current circuit decides whether to flow a current or not and signals are inputted to pixels that are connected to selected gate signal line and selection line.

In a sub-frame period, a period in which pixels emit light for display after the writing period Ta is ended is called a display period Ts.

A writing period and a display period in the i-th (i is a natural number equal to or less than n) sub-frame period are particularly denoted by Tai and Tsi, respectively.

FIG. 5 shows as a representative the operation of when a gate signal line Gk is selected. The same operation is conducted for all the gate signal lines G1 to Gy.

In each writing period Ta associated with one of the gate signal lines in each sub-frame period, sampling of signals for the next writing period Ta associated with the next gate signal line is started immediately after digital video signals are outputted from the LAT1 to the LAT2 in response to latch pulses LP.

Lengths of writing period Ta and display period Ts in each sub-frame period have to be set such that the writing period Ta of the preceding sub-frame period does not overlap the writing period Ta of the following sub-frame period.

Operations in the second sub-frame period to the (m−1)-th sub-frame period are identical with the operation in the first sub-frame period.

The display period for the (m−1)-th bit is denoted by Tsm−1. The display period Tsm−1 is started as signals of a display period Tsm−2 for the (m−2)-th bit are replaced by the next signals through rewriting.

In the display periods Ts1 to Tsm−1, whether the light emitting element emits light or not is decided for each pixel in accordance with the respective bits of digital video signals VD. In FIG. 5, the word 'display' is used to indicate the state in which pixels emit light or does not emit light in accordance with digital video signals VD of the respective bits.

On the other hand, the m-th sub-frame period to the n-th sub-frame period include the following operations so that signals of lower bits are not sampled.

As sampling of digital video signals of the (m−1)-th sub-frame period is ended, signals inputted from the reset circuit 710 to the source signal line driving circuit 101 are changed to '0' signals. Signal voltages of the '0' signals are sampled by the LAT1 103. After a '0' signal is held in every latch that constitutes the LAT1 103, the signals are transferred to the LAT2 104 in response to latch pulses LP.

Thus no signal current is inputted to the source signal lines in the writing period Ta of the m-th sub-frame period. Therefore electric charges are not stored in the storage capacitor in every pixel that is connected to a selected gate signal line and selection line. Accordingly no current flows in a TFT 405 and the light emitting element of the pixel does not emit light.

In the m-th sub-frame period, the same operation is conducted for all of the gate signal lines G1 to Gy and selection lines C1 to Cy so that none of the pixels emit light.

When the writing period Ta is ended for every pixel in the m-th sub-frame period, signals held in the LAT1 103 and the LAT2 104 are all signal voltages associated with '0' signals. The storage capacitor 406 in every pixel at this point holds a voltage that does not cause a drain current to flow in the TFTs (TFT 404 and TFT 405) for constituting a current mirror circuit of the pixel.

The LAT1 samples signal voltages of '0' signals alone no matter what digital video signals are inputted from the external and outputs the sampled signals to the source signal lines to make the LAT1 and LAT2 to hold only signal voltages of '0' signals. This operation is called a reset operation in the present invention. A period in which the reset operation takes place is called a reset period.

After the reset period is ended, the stat pulse controlling circuit 700 begins to input a constant electric potential to the shift register 102 instead of start pulses SP. Therefore the shift register 102 no longer outputs sampling pulses. The LAT1 103 accordingly does not hold digital video signals for the (m+1)-th sub-frame period.

In this specification, outputting no sampling pulses means to keep outputting a constant electric potential.

The signals for the m-th sub-frame period are therefore kept outputted in the (m+1)-th sub-frame period. In other words, the light emitting element continues to emit no light in every pixel.

Similarly, the start pulse controlling circuit 700 continues to input a constant electric potential to the shift register 102 during digital video signals for the (m+2)-th sub-frame period are inputted to the LAT1. Therefore the shift register 102 does not output sampling pulses and the LAT1 does not hold digital video signals.

Accordingly, the signals for the m-th sub-frame period are again kept outputted also in the (m+2)-th sub-frame period. In other words, every pixel continues to emit no light.

The above operation is repeated until the n-th sub-frame period is ended. In this way, digital video signals for the (m+1)-th sub-frame period to the n-th sub-frame periods are not inputted to the LAT1 and the no-light-emission state of the m-th sub-frame period is maintained.

In this specification, a period in which sampling pulses are not outputted is called a no-sampling-pulse period.

The reset circuit 710 in this embodiment mode outputs digital video signals VD as they are during the (m+1)-th to the n-th sub-frame periods. However, the present invention is not limited thereto. The reset circuit 710 may output either digital video signals VD as they are or signal voltages of '0' signals.

From the sub-frame period SFm for the m-th bit to the sub-frame period SFn for the n-th bit, the light emitting element in each pixel does not emit light irrespective of inputted digital video signals VD of the respective bits. In FIG. 5, the word 'no-display' indicates the state in which the light emitting element in each pixel does not emit light irrespective of inputted digital video signals VD of the respective bits.

As sampling of digital video signals for the first sub-frame period of the next frame period is started, the output of the start pulse controlling circuit 700 is changed so that start pulses SP are again inputted to the shift register 102. Accordingly the signals for the first bit are held in the LAT1.

Subsequent operations are the same as the above-described operations of the previous frame period.

Sampling of information of the lower bits are stopped in this way.

Now, the reason why the reset operation is carried out before stopping output of sampling pulses from the shift register to cease sampling of digital video signals in the sub-frame periods for the lower bits is described.

Consider a case where the reset operation is not carried our. In this case, when the shift register no longer outputs sampling pulses and sampling of digital video signals VD is stopped, light emitting elements in pixels respectively continue light emission or non-light emission in accordance with the signals held in the LAT1 and LAT2 in the last horizontal period of the previous subframe period. Since the signals held at this point in the LAT1 and LAT2 are arbitrary signals, it is impossible to bring all pixels to non-light emission state. Accordingly, the luminance is affected. The reset operation is to avoid this situation.

Discharging electric charges held in the storage capacitor of each pixel to flow a current in the current mirror circuit does not induce sampling of new signals by itself, and signals that have been held in the LAT1 are outputted to the source signal lines in response to latch pulses. This does not solve the above problem. Therefore the reset operation for sampling '0' digital video signals and replacing signals held in the LAT1 and LAT2 with signal voltages of '0' signals through rewriting is necessary.

In this embodiment mode, signal voltages of '0' signals are sampled in all of horizontal periods in a sub-frame period that requires the reset operation. However, the reset operation is achieved by replacing signals held in the LAT1 and LAT2 of the source signal line driving circuit with signal voltages of '0' signals through rewriting once.

To elaborate, in a sub-frame period that requires the reset operation, if sampling pulses are outputted to sample signal voltages of '0' signals inputted from the reset circuit in the horizontal period for the gate signal line G1, output of sampling pulses is unnecessary in subsequent horizontal periods. Without outputting sampling pulses in the subsequent horizontal periods, '0' signals are kept outputted to the source signal lines S1 to Sx irrespective of inputted digital video signals and the light emitting element in each pixel continues to emit no light.

The description given in this embodiment mode takes as an example the case in which the display device is driven by the time ratio gradation method while dividing one frame period into n sub-frame periods and using inputted n-bit digital video signals to obtain $2^n$ gradations. However, the present invention is not limited thereto.

In short, the driving method of this embodiment mode can be used in a general case in which one frame period is divided into r (t is a natural number equal to or larger than n) sub-frame periods using inputted n-bit digital video signals to obtain $2^n$ gradations. Lengths of the sub-frame periods SF1 to SFr are set to suit individual cases.

For instance, the length of a display period for an upper bit may be equal to cumulation of display periods of plural sub-frame periods.

In the timing chart of this embodiment mode, sub-frame periods for the upper bit comes first and then sub-frame periods for progressively lower bits follow to complete one frame period. However, in the method of driving the display device in accordance with the present invention, the order of sub-frame periods in one frame period may be at random irrespective of their lengths.

If a sub-frame period for digital video signals of a lower bit immediately follows a sub-frame period for digital video signals of another lower bit, '0' digital video signals alone are inputted instead of digital video signals VD in the former of these two successive sub-frame periods in order to reset and bring the light emitting element in every pixel to the non-light emission state. Then, in the latter of the successive sub-frame periods, the start pulse controlling circuit 700 inputs a constant electric potential to the shift register instead of outputting start pulses This takes the operation of holding signals in the LAT1 and LAT2 unnecessary, and power consumption of the source signal line driving circuit thus can be reduced.

Thereafter, the start pulse controlling circuit 700 continues to output a constant electric potential until a sub-frame period for a upper bit is started.

Embodiment Mode 3

An example of removing video signals of lower bits by a method different from the one in Embodiment Mode 2 is described below.

In this embodiment mode, clock pulses and inverted clock pulses that are to be inputted to the source signal line driving circuit of the present invention are not inputted to the shift register while digital video signals of the sub-frame period for lower bits are sampled. In other words, a constant electric potential is inputted to the shift register during sampling of digital video signals of sub-frame periods for lower bits.

Figure 8:
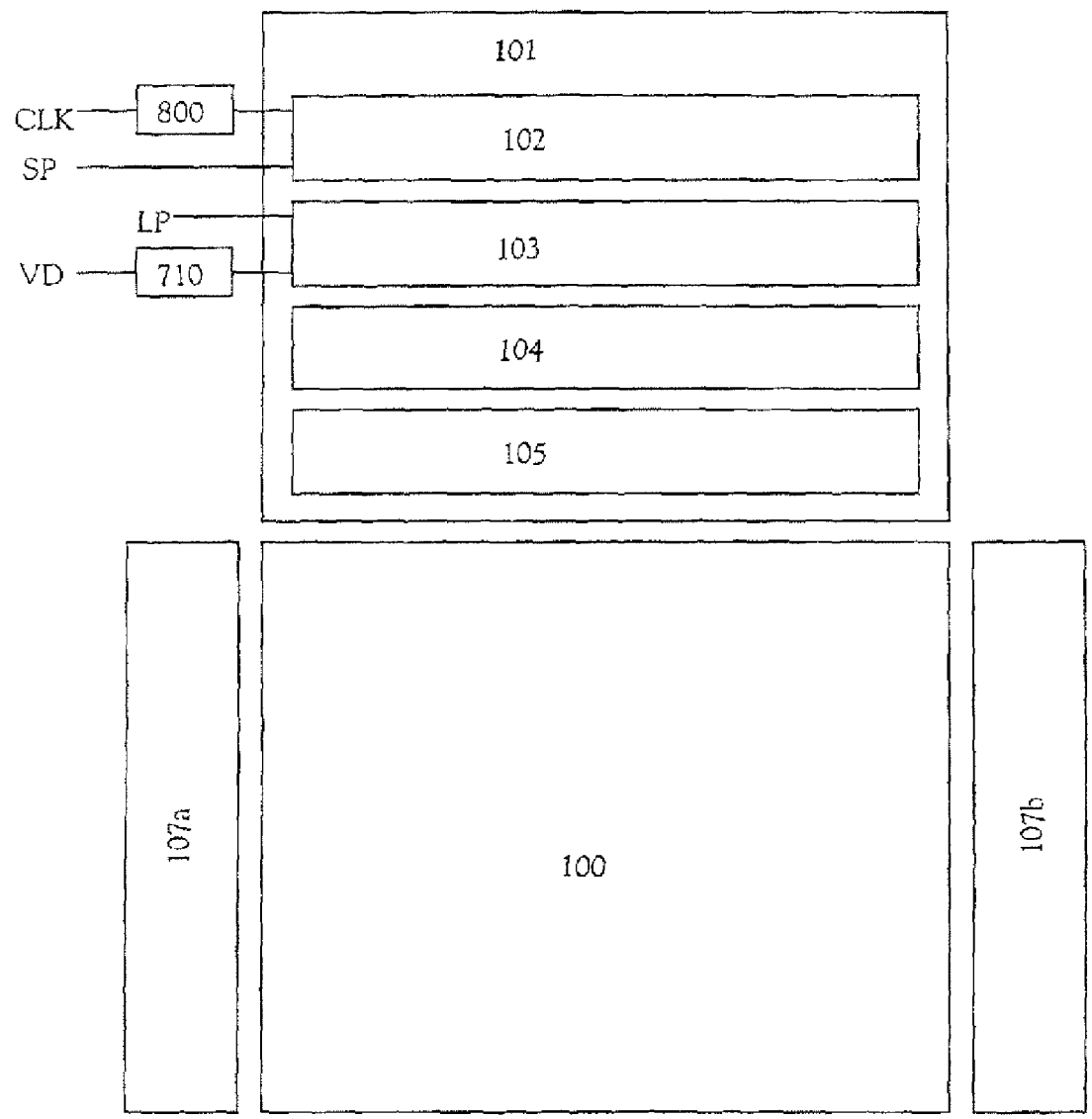
FIG. 8 is a block diagram showing the structure of a display device of the present invention.

The structure of a display device of this embodiment mode is shown in block diagram in FIG. 8.

Components of the display device that are identical with those in Embodiment Mode 2 shown in FIG. 7 are denoted by the same reference symbols and explanations thereof are omitted. Although FIG. 7 shows clock pulses whereas inverted clock pulses are omitted, inverted clock pulses go through the same processing.

Clock pulses to be inputted to the source signal line driving circuit are inputted to a shift register 102 of the source signal line driving circuit through a clock pulse controlling circuit 800. The clock pulse controlling circuit 800 switches between outputting clock pulses and outputting a constant signal electric potential.

When the clock pulse controlling circuit 800 outputs a constant signal electric potential instead of clock pulses, the shift register of the source signal line driving circuit 101 does not output sampling pulses and the LAT1 stops holding digital video signals.

It is necessary to bring the light emitting element of every pixel to non-light emission state (a reset operation) before the clock pulse controlling circuit 800 outputs a constant electric potential to stop holding digital video signals.

A reset circuit 710 is provided for the reset operation.

This embodiment mode employs a different method from the one in Embodiment Mode 2 to stop outputting sampling pulses. However, the rest of the operations are identical with those in Embodiment Mode 2 and therefore the explanations are omitted here.

In this way, sampling of information of lower bits is stopped.

Embodiment Mode 4

This embodiment mode describes removal of video signals of lower bits by a method different from the ones in Embodiment Modes 2 and 3.

Figure 6:
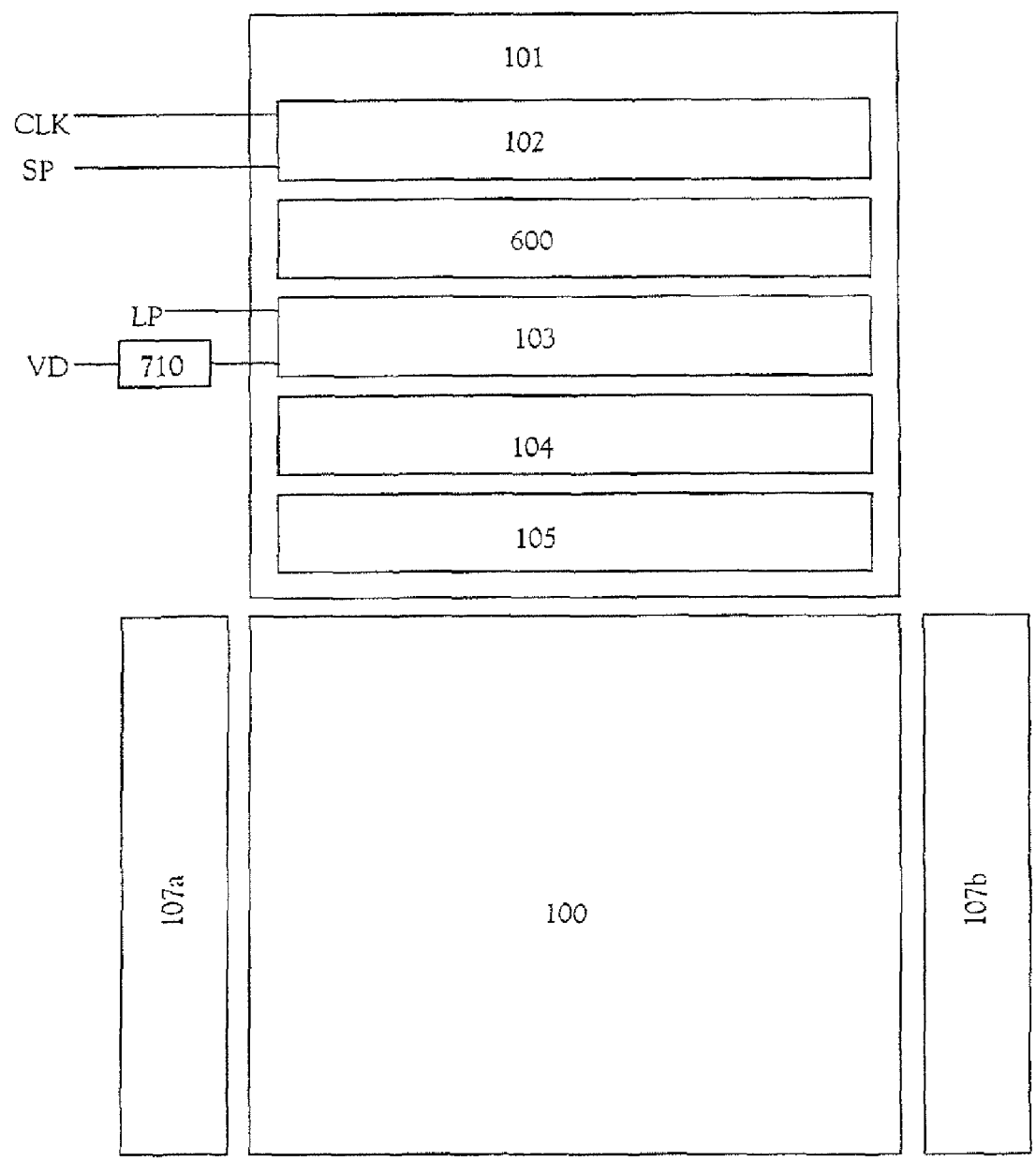
FIG. 6 is a block diagram showing the structure of a display device of the present invention.

The structure of a display device of this embodiment mode is shown in block diagram in FIG. 6.

Components of the display device that are identical with those in Embodiment Mode 2 shown in FIG. 7 and those in Embodiment Mode 3 shown in FIG. 8 are denoted by the same reference symbols and explanations thereof are omitted.

Unlike Embodiment Modes 2 and 3, a shift register 102 in a source signal line driving circuit of this embodiment mode outputs sampling pulses. However, sampling pulses inputted to an LAT1 103 have a fixed signal electric potential during display periods for lower bits. In this way, sampling of signal voltages is avoided.

A source signal line driving circuit 101 is provided with a sampling pulse controlling circuit 600 for switching signals from the shift register. The sampling pulse controlling circuit 600 switches between outputting sampling pulses and outputting a constant electric potential.

The sampling pulse controlling circuit 600 outputs a constant signal electric potential instead of sampling pulses so that the shift register 102 does not output sampling pulses. Before the sampling pulse controlling circuit 600 outputs a constant signal electric potential, the reset operation for bringing the light emitting element of every pixel to non light emission state is required.

A reset circuit 710 is provided for the reset operation.

This embodiment mode employs a different method from the one in Embodiment Mode 1 to stop sampling digital video signals. However, the rest of the operations are identical with those in Embodiment Mode 1 and therefore the explanations are omitted here.

In this way, sampling of information of lower bits is avoided.

Embodiment 1

This embodiment shows an example of source signal line driving circuit in a display device to which a driving method of the present invention is applied.

An example of detailed structure for the source signal line driving circuit of Embodiment Mode 1 shown in FIG. 1 is described with reference to FIG. 9.

In a source signal line driving circuit 2600, a shift register 2601 is composed of clocked inverters 2602 and 2603, inverters 2604, switches 2605 and 2606, and NANDs 2607. Start pulses SP and clock pulses CLK are inputted to the shift register 2601. In the shift register 2601, start pulses are inputted and the clocked inverters 2602 and 2603 are turned conductive or unconductive by clock pulses CLK and inverted clock pulses CLKB, which are signals obtained by inverting the polarity of the clock pulses. Then the NANDs 2607 sequentially output sampling pulses to LAT1s.

The switches 2605 and the switches 2606 switch the operation direction of the shift register between left and right in the drawing. When left and right switching signals SL/R are Lo signals, the shift register sequentially outputs sampling pulses starting from the left side toward the right side of the drawing. When left and right switching signals SL/R are Hi signals, on the other hand, the shift register sequentially outputs sampling pulses starting from the right side toward the left side of the drawing.

LAT1s 2613 in the respective stages are composed of clocked inverters 2614 and 2615 and inverters 2616 and 2617.

The LAT1 in each stage means an LAT1 for holding one video signal.

Here, digital video signals VD are converted by a time ratio gradation data signal generating circuit (not shown) into signals for displaying an image by a time ratio gradation method and divided by a serial/parallel conversion circuit (not shown) into p (p is a natural number) sections before inputted. In short, signals to be outputted to p source signal lines are inputted in parallel. As sampling pulses are inputted to the clocked inverters 2614 and 2615 of p stages of LAT1s 2612 through buffers 2608 to 2611 at once, input signals divided into p sections are simultaneously sampled in the p stages of LAT1s 2612.

The description here takes as an example the source signal line driving circuit 2600 that outputs a signal current to x source signal lines. Therefore the shift register sequentially outputs x/p sampling pulses per horizontal period. In response to the respective sampling pulses, the p stages of LAT1s 2612 simultaneously sample digital video signals that are to be outputted to p source signal lines.

This method of dividing digital video signals that are inputted from the external into p phase parallel signals and taking p digital video signals in at once in response to one sampling pulse is called a p division driving in this specification.

The division driving as above allows a margin in sampling by the shift register of the source signal line driving circuit. The reliability of the display device is thus improved.

After all of signals for one horizontal period are inputted to the LAT1s 2613 of the respective stages, latch pulses LS and inverted latch pulses LSB obtained by inverting the polarity of the latch pulses are inputted. In response to LS and LSB, signals in the LAT1s 2613 of the respective stages are outputted to LAT2s 2619 of the respective stages at once. Note, reference numeral 2618 denotes p stages of LAT2s.

The LAT2s of the respective stages here are LAT2 circuits to which signals are inputted from the LAT1s of the respective stages.

The LAT2s 2619 of the respective stages are composed of clocked inverters 2620 and 2621 and inverters 2622 and 2623. Signals outputted from the LAT1s 2613 of the respective stages are held in the LAT2s and at the same time inputted to a constant current circuit 2660.

The constant current circuit 2660 can have the structure of FIGS. 29A and 29B described in Embodiment Mode 1.

The structure of the constant current circuit 2660 is not limited to the one shown in FIGS. 29A and 29B and a constant current circuit having a known structure can be used as the circuit 2660.

When digital video signals inputted from the LAT2s to the constant current circuit 2660 are '1' signals, a constant current Ic is outputted to the source signal lines. On the other hand, when they are '0' signals, an electric potential of almost the same level as the electric potential of an opposite electrode of the light emitting element is outputted to the source signal lines and no current flows in the source signal lines.

Though omitted here, a level shifter, a buffer, and the like may be provided in the source signal line driving circuit.

Figure 9:
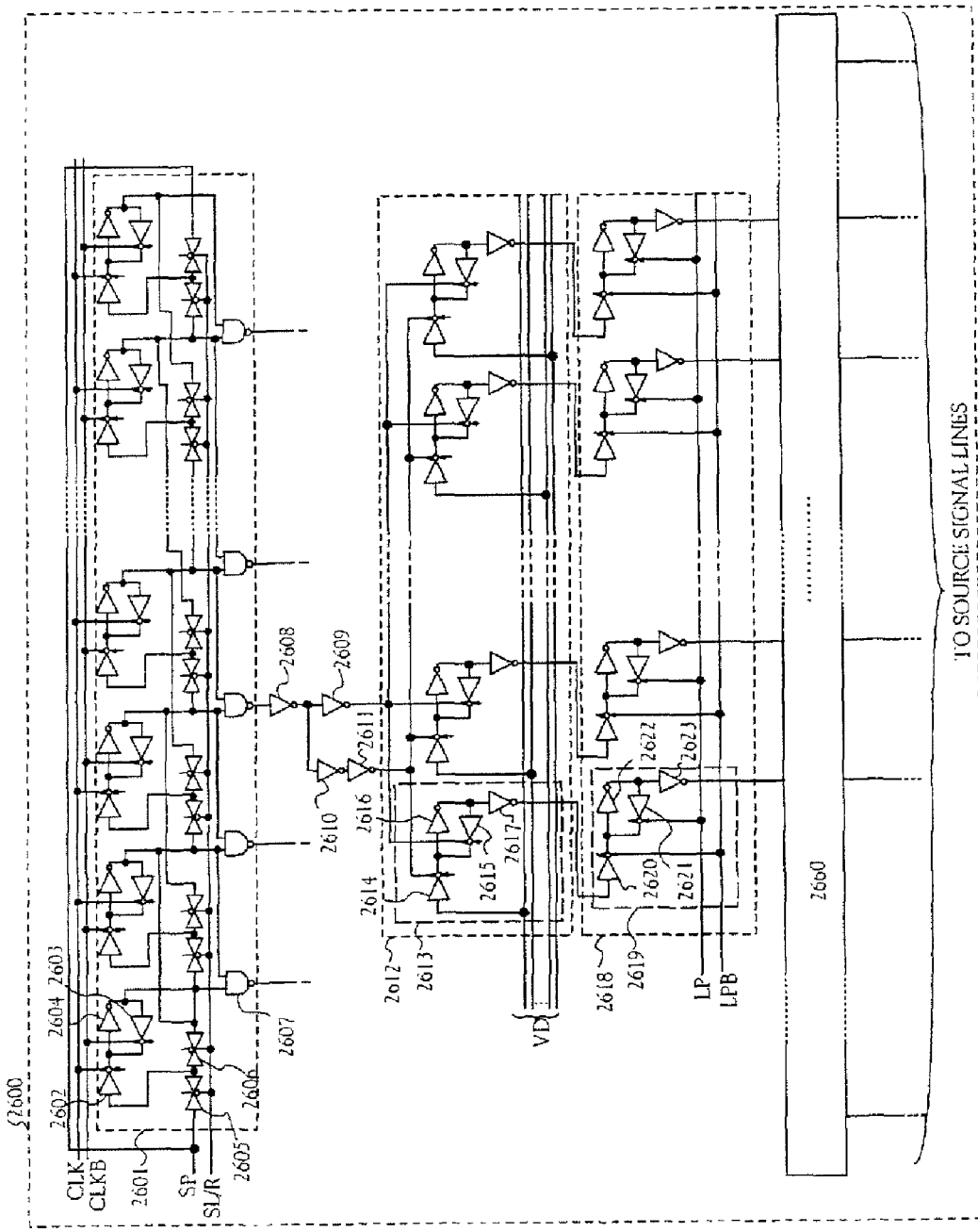
FIG. 9 is a diagram showing the structure of a source signal line driving circuit in a display device of Embodiment 1.

The structures of the shift register, LAT1, and LAT2 are not limited to those in FIG. 9, and circuits of known structures can freely be employed.

Embodiment 2

This embodiment gives a description on an example of detailed structure for a source signal line driving circuit that uses the method explained in Embodiment Mode 2 to stop sampling signals of lower bits.

Figure 10:
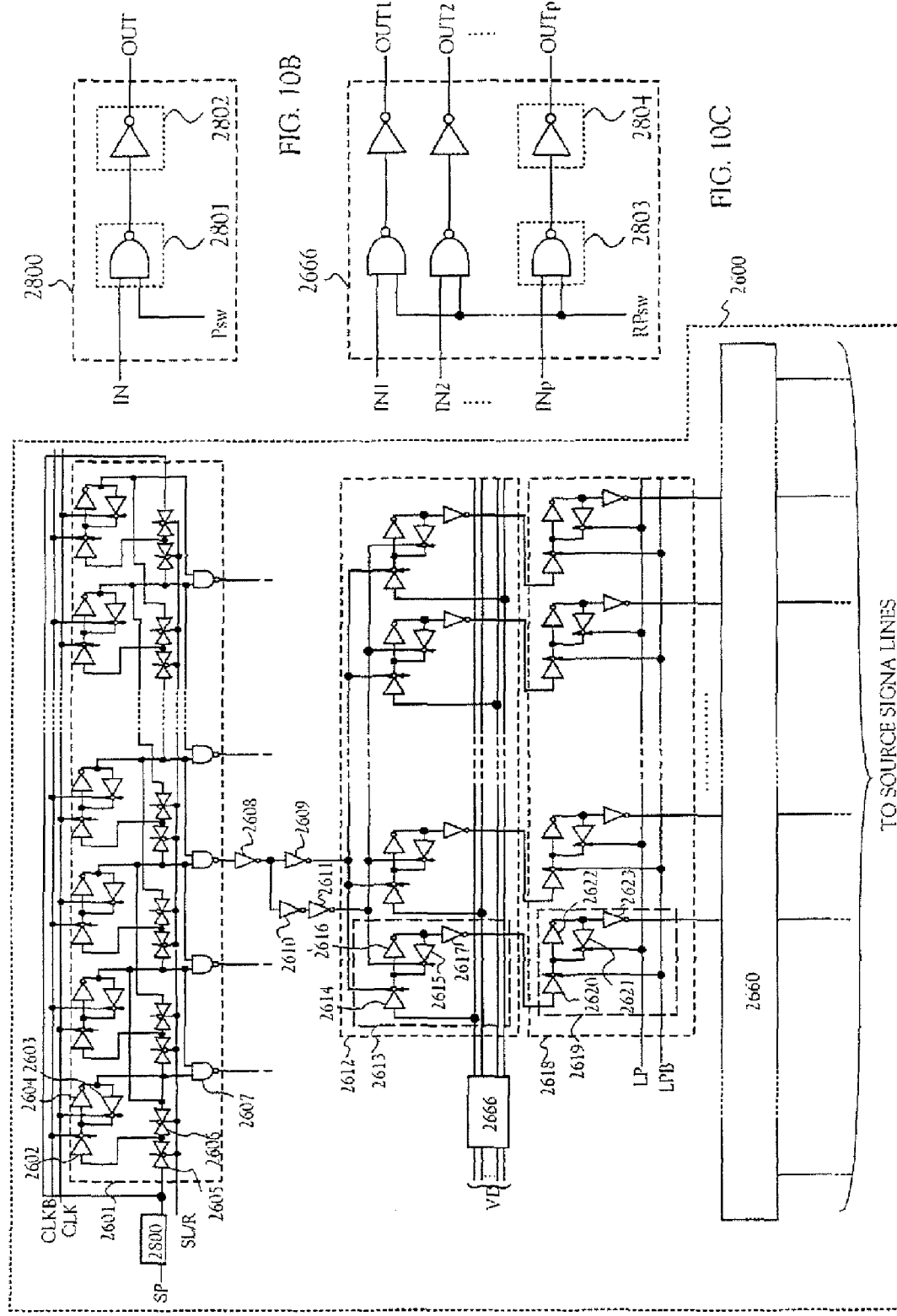
FIGS. 10A to 10C are diagrams showing the structure of a source signal line driving circuit in a display device of Embodiment 2.

The description is given with reference to FIGS. 10A to 10C. In FIG. 10A, components identical with those in FIG. 9 are denoted by the same reference symbols and explanations thereof are omitted.

In FIG. 10A, start pulses SP are inputted to a shift register through a start pulse controlling circuit 2800. FIG. 10B shows an example of the structure of the start pulse controlling circuit 2800.

The start pulse controlling circuit 2800 is composed of a NAND 2801 and an inverter 2802. Start pulses SP are inputted to a terminal IN of the circuit 2800 and an output from the circuit 2800 to a shift register 2601 is sent through a terminal OUT. Switching signals Psw are inputted to the start pulse controlling circuit 2800.

The operation of the start pulse controlling circuit 2800 is described.

When switching signals Psw have signal voltages of '1' signals, signals of start pulses SP inputted from the terminal IN are outputted from the terminal OUT. On the other hand, when switching signals Psw have signal voltages of '0' signals, signal voltages of '0' signals are outputted from the terminal OUT irrespective of the signals of start pulses SP inputted from the terminal IN.

Switching signals Psw are all '1' signals during sub-frame periods for upper bits and periods in which the reset operation takes place. During sub-frame periods for lower bits, except periods in which the reset operation takes place, switching signals Psw are all '0' signals. In this way, sampling pulses are not outputted only in given sub-frame periods. Sampling of information of digital video signals of lower bits is thus avoided and the information is not held in the LAT1s.

FIG. 10C shows an example of the structure of a reset circuit 2666.

The reset circuit 2666 is composed of NANDs 2803 and inverters 2804. Digital video signals VD divided into p sections are inputted to terminals IN1 to INp of the circuit 2666. Outputs from the circuit 2666 to LAT1s 2612 are sent through terminals OUT1 to OUTp. Switching signals RPsw are inputted to the reset circuit 2666.

The operation of the reset circuit 2666 is described.

When switching signals RPsw have signal voltages of '1' signals, digital video signals VD inputted from the terminals IN1 to INp are outputted from the terminals OUT1 to OUTp, respectively. On the other hand, when switching signals RPsw have signal voltages of '0' signals, signal voltages of '0' signals are outputted from the terminals OUT1 to OUTp irrespective of digital video signals VD inputted from the terminals IN1 to INp.

Switching signals RPsw are all '1' signals during sub-frame periods for upper bits. During periods (reset periods) prior to periods in which output of sampling pulses are prevented (no-sampling-pulse periods), switching signals RPsw are all '0' signals. In this way, signals held in the LAT1s and LAT2s are all replaced with '0' signals through rewriting.

The number of bits participating in display is thus reduced to make the source signal line driving circuit conduct less sampling operations. Accordingly, the display device consumes less power.

This embodiment may be combined with Embodiment 1.

Embodiment 3

This embodiment describes an example of detailed structure for a circuit for removing signals of lower bits using the method described in Embodiment Mode 3. The description is given with reference to FIGS. 11A to 11C.

Figure 11:
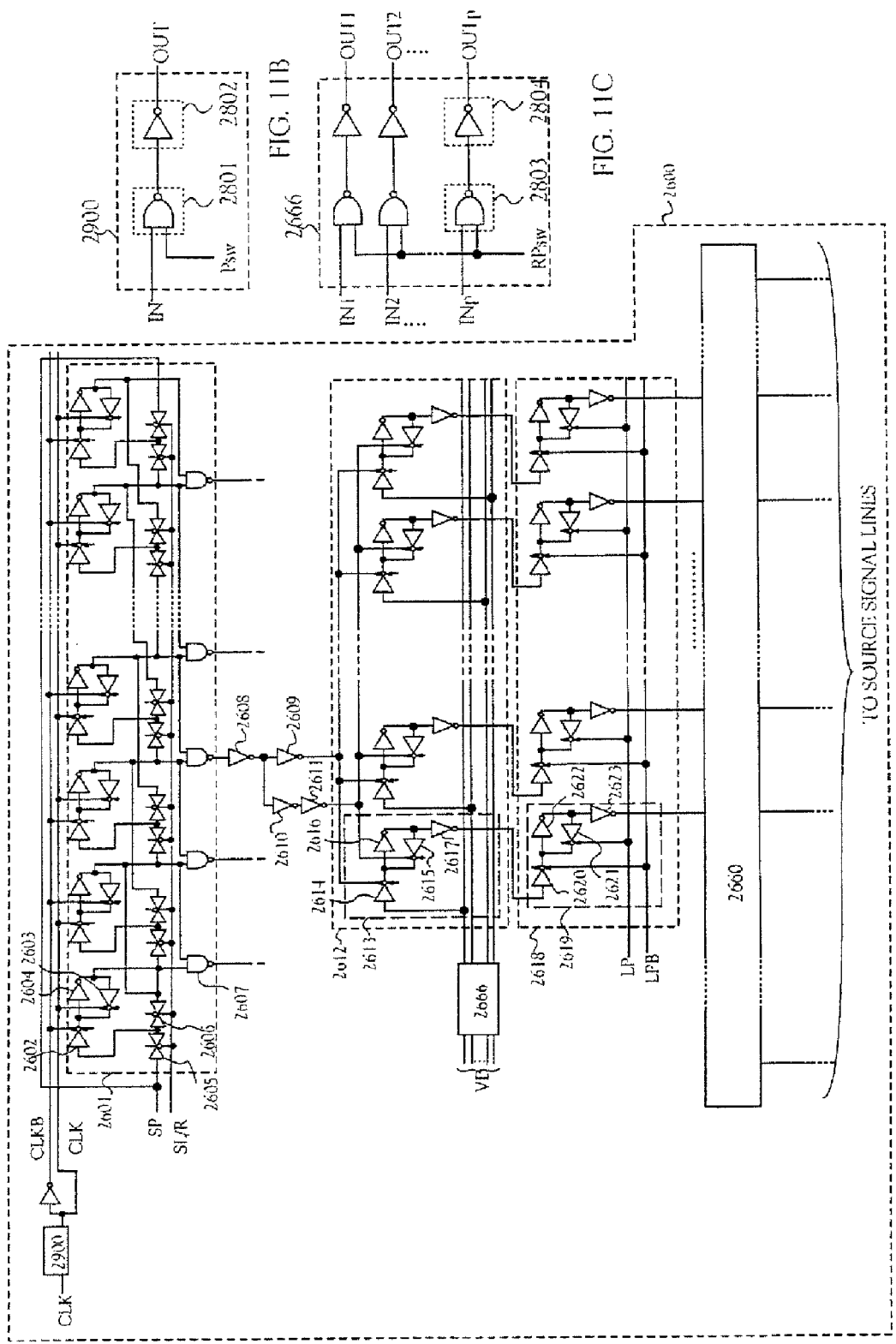
FIGS. 11A to 11C are diagrams showing the structure of a source signal line driving circuit in a display device of Embodiment 3.

In FIG. 11A, components identical with those in FIG. 9 of Embodiment 1 and in FIGS. 10A to 10C of Embodiment 2 are denoted by the same reference symbols and explanations are omitted.

Clock pulses CLK are inputted to a shift register 2601 through a clock pulse controlling circuit 2900 in FIG. 11A. FIG. 11B shows an example of the structure of the clock pulse controlling circuit 2900.

The clock pulse controlling circuit 2900 is composed of a NAND 2801 and an inverter 2802. Clock pulses CLK are inputted to a terminal IN of the circuit 2900 and an output from the circuit 2900 to the shift register 2601 is sent through a terminal OUT. Switching signals Psw are inputted to the clock pulse controlling circuit 2900.

The operation of the clock pulse controlling circuit 2900 is described.

When switching signals Psw have signal voltages of '1' signals, clock pulses CLK inputted from the terminal IN are outputted from the terminal OUT. On the other hand, when switching signals Psw have signal voltages of '0' signals, signal voltages of '0' signals are outputted from the terminal OUT in respective of the clock pulses CLK inputted from the terminal IN.

Switching signals Psw are all '1' signals during sub-frame periods for upper bits and periods in which the reset operation takes place. During sub-frame periods for lower bits, except periods in which the reset operation takes place, switching signals Psw are all '0' signals. In this way, sampling pulses are nor outputted only in given sub-frame periods. Sampling of information of digital video signals of lower bits is thus avoided and the information is not held in LAT1s.

FIG. 11C shows an example of the structure of a reset circuit 2666.

The reset circuit 2666 is composed of NANDs 2803 and inverters 2804. Digital video signals VD divided into p sections are inputted to terminals IN1 to INp of the circuit 2666. Outputs from the circuit 2666 to LAT1s 2612 are sent through terminals OUT1 to OUTp. Switching signals RPsw are inputted to the reset circuit 2666.

The operation of the reset circuit 2666 is described.

When switching signals RPsw have signal voltages of '1' signals, digital video signals VD inputted from the terminals IN1 to INp are outputted from the terminals OUT1 to OUTp, respectively. On the other hand, when switching signals RPsw have signal voltages of '0' signals, signal voltages of '0' signals are outputted from the terminals OUT1 to OUTp irrespective of digital video signals VD inputted from the terminals IN1 to INp.

Switching signals RPsw are all '1' signals during sub-frame periods for upper bits. During periods (reset periods) prior to periods in which output of sampling pulses are prevented (no-sampling-pulse periods), switching signals RPsw are all '0' signals. In this way, signals held in the LAT1s and LAT2s are all replaced with '0' signals through rewriting.

The number of bits participating in display is thus reduced to make the source signal line driving circuit conduct less sampling operations. Accordingly, the display device consumes less power.

This embodiment may be combined with Embodiment 1.

Embodiment 4

This embodiment describes an example of the structure of a circuit for removing signals of lower bits using the method described in Embodiment Mode 4.

Figure 12:
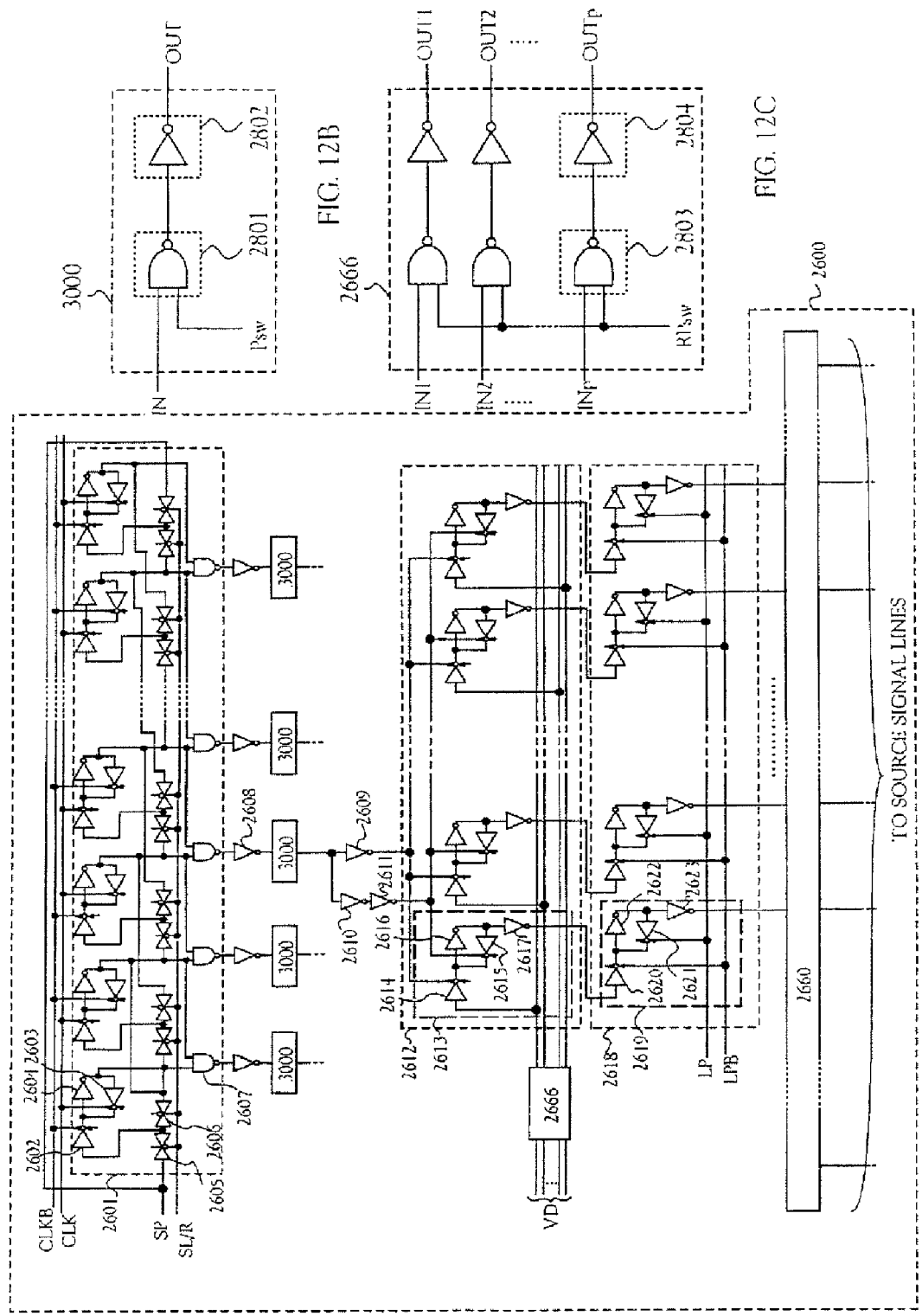
FIGS. 12A to 12C are diagrams showing the structure of a source signal line driving circuit in a display device of Embodiment 4.
Figure 13:
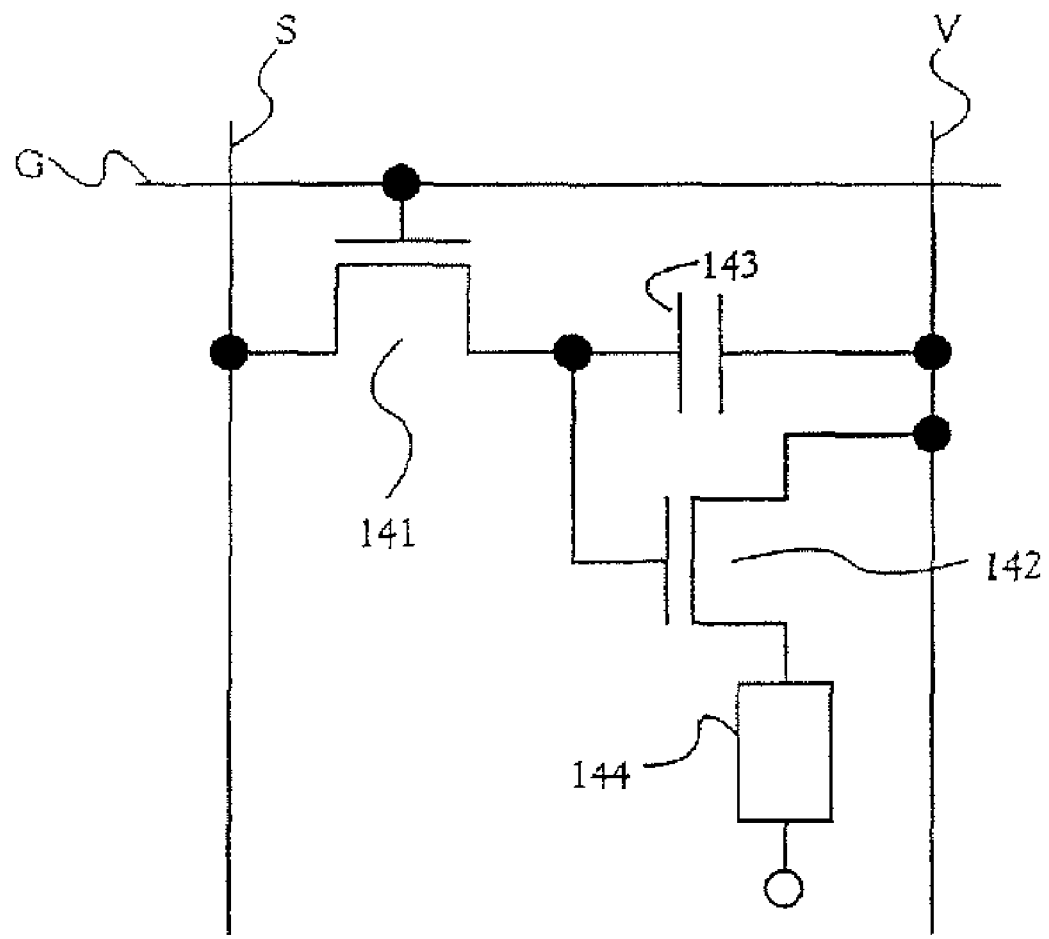
FIG. 13 is a diagram showing the structure of a pixel of a display device in prior art.
Figure 14:
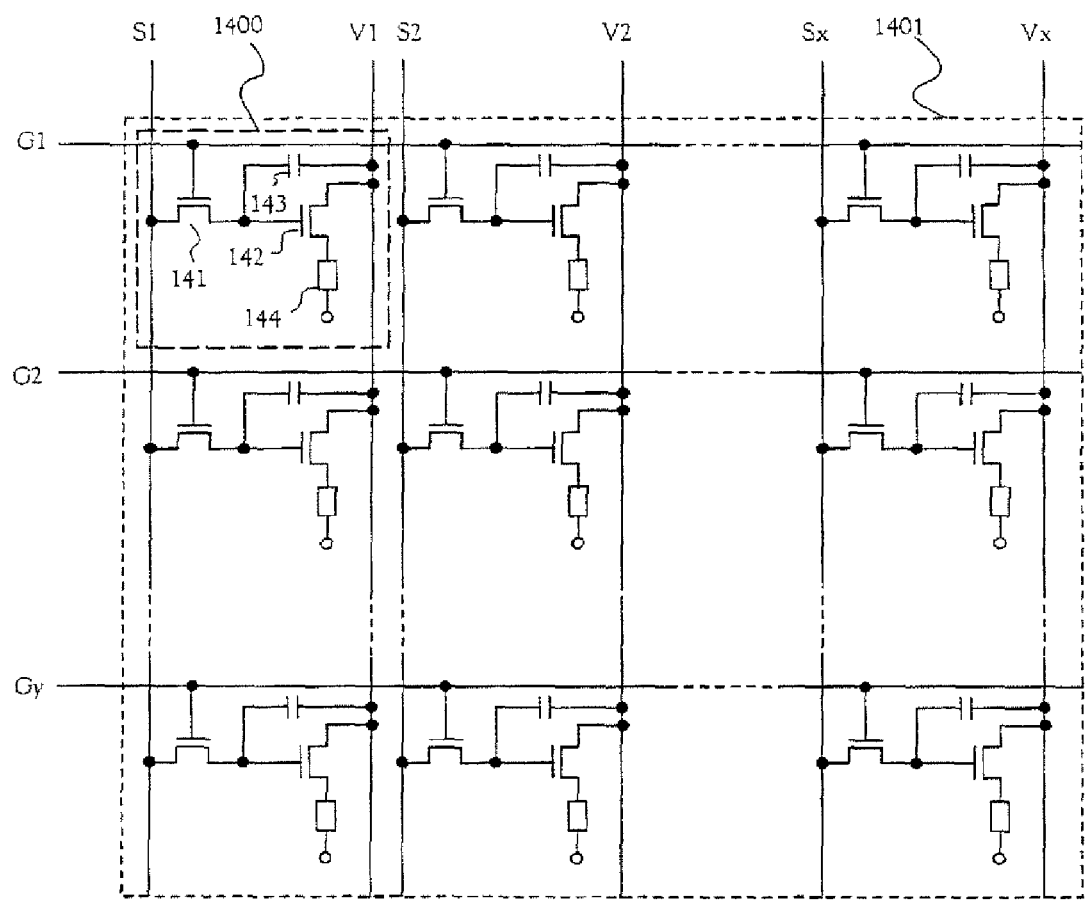
FIG. 14 is a diagram showing the structure of a pixel portion of a display device in prior art.
Figure 15A:
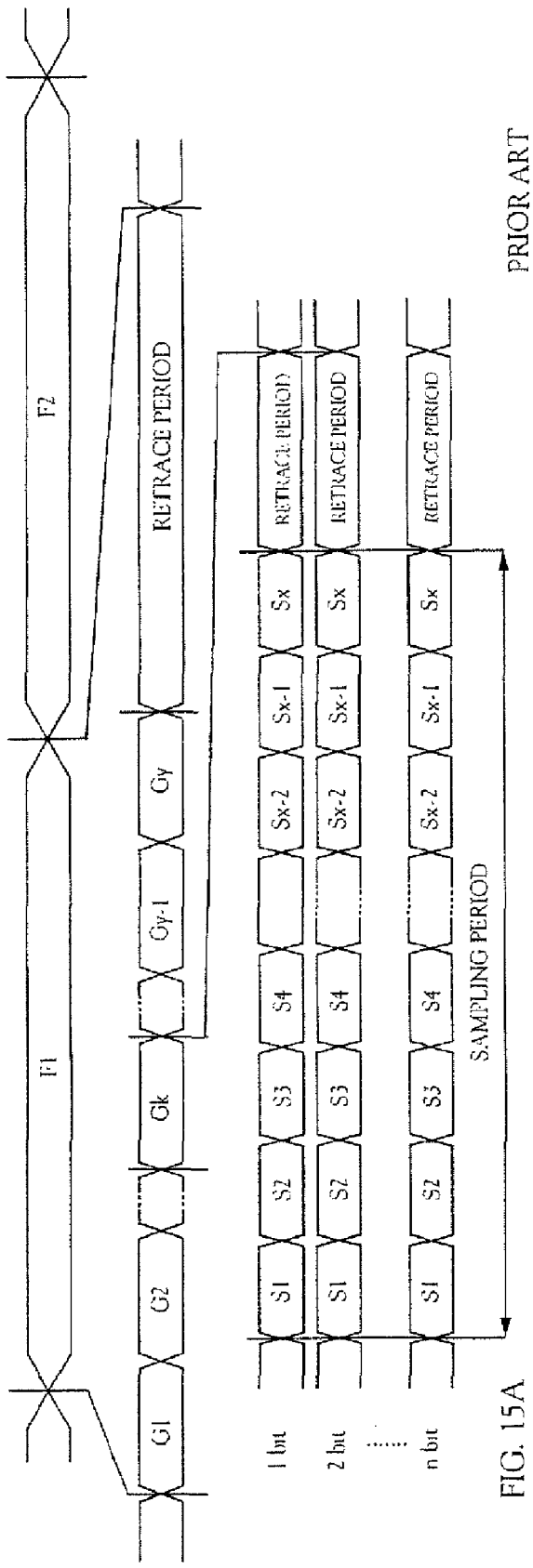
FIGS. 15A and 15B are timing charts showing a method of driving a display device in prior art.
Figure 15B:
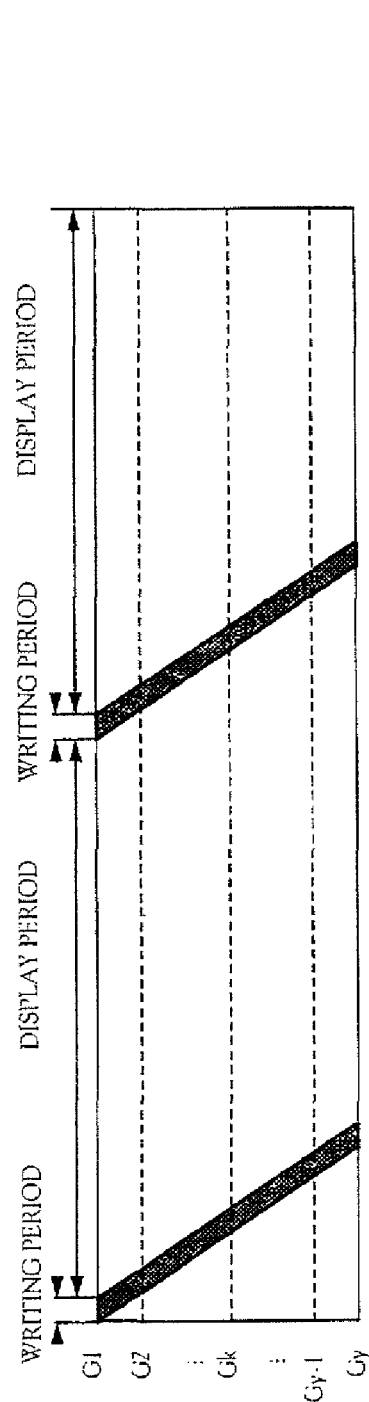
Figure 16:
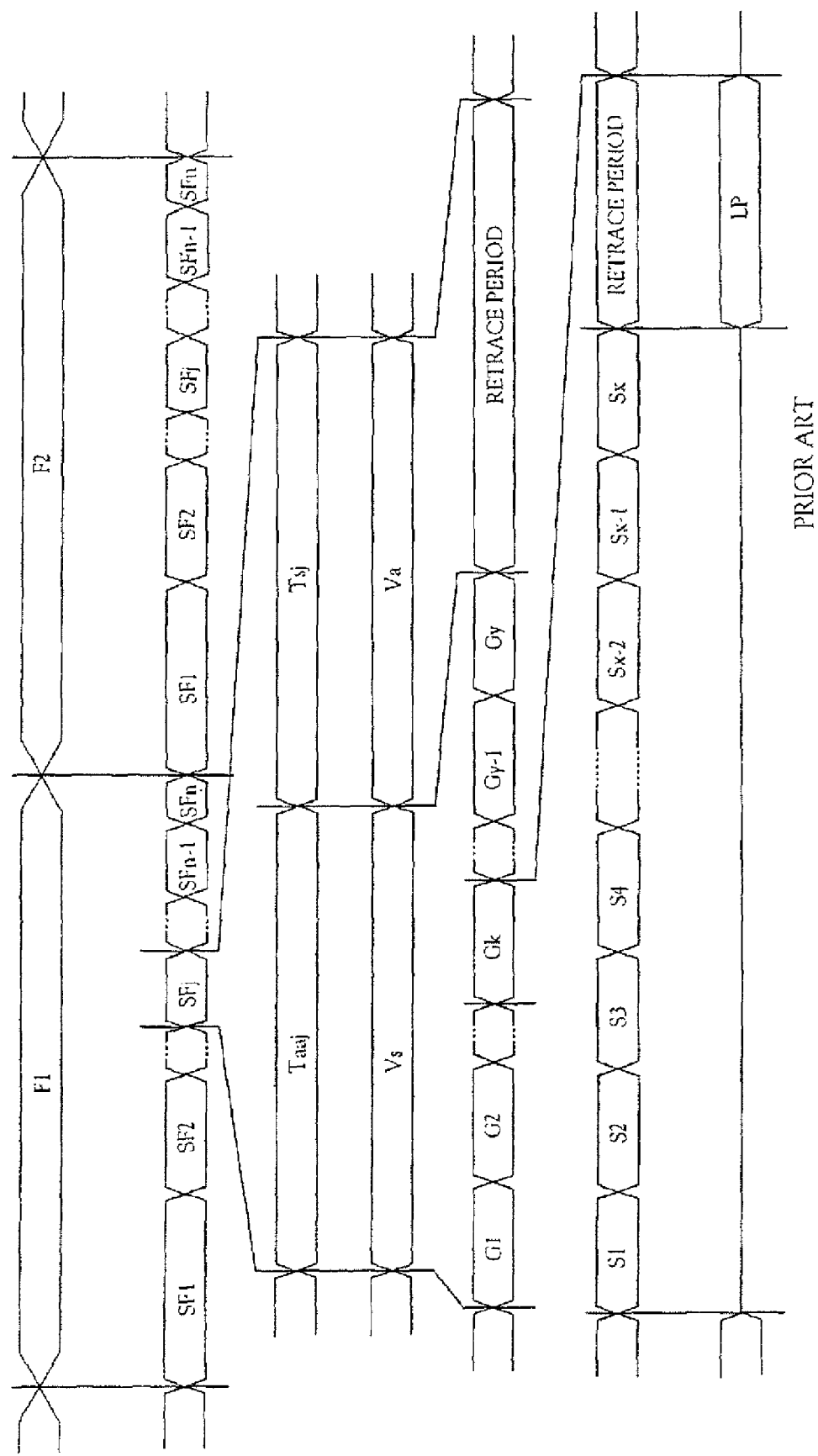
FIG. 16 is a timing chart showing a method of driving a display device in prior art.
Figures 17A, 17B:
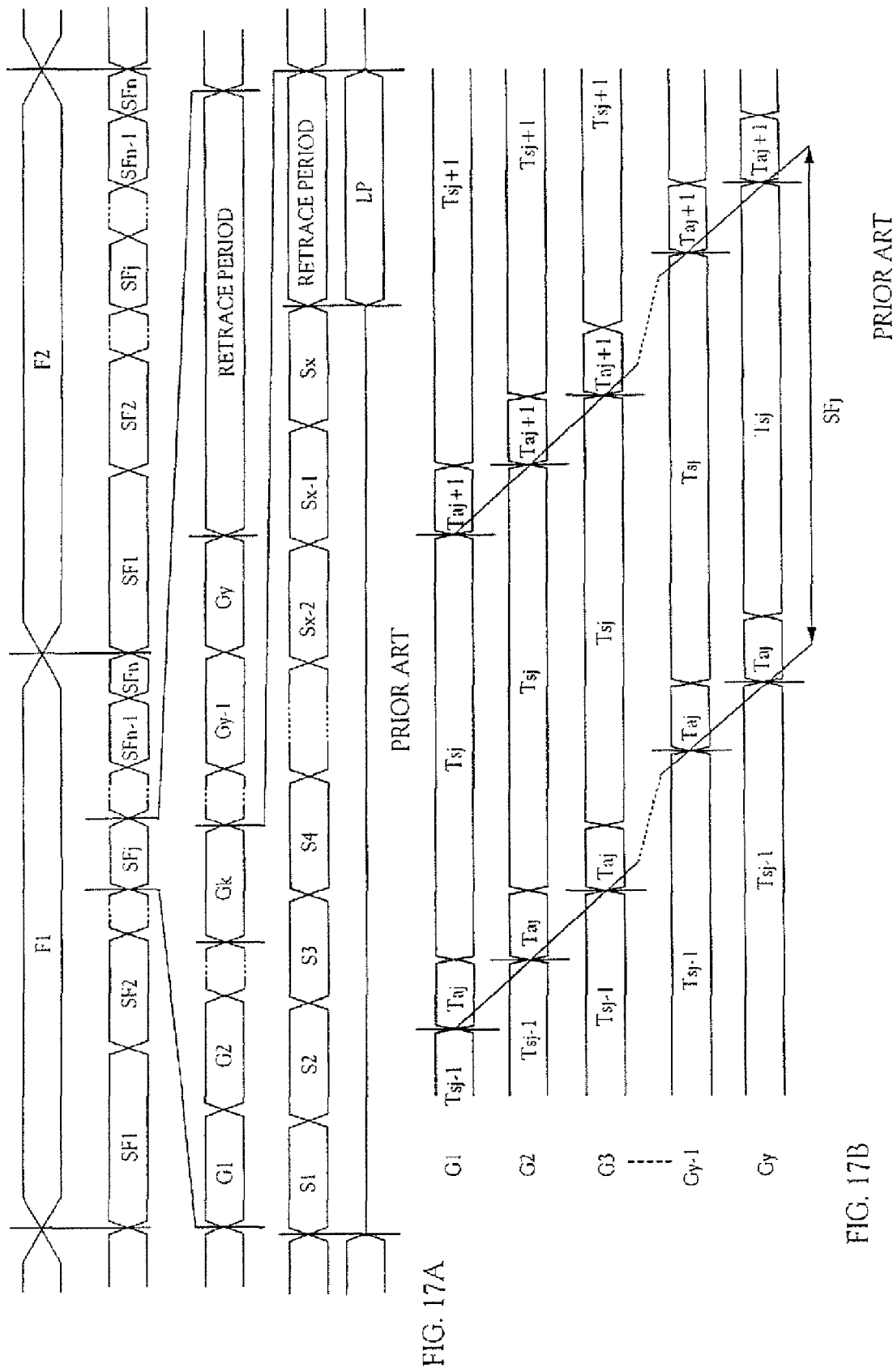
FIGS. 17A and 17B are riming charts showing a method of driving a display device in prior art.
Figure 19:
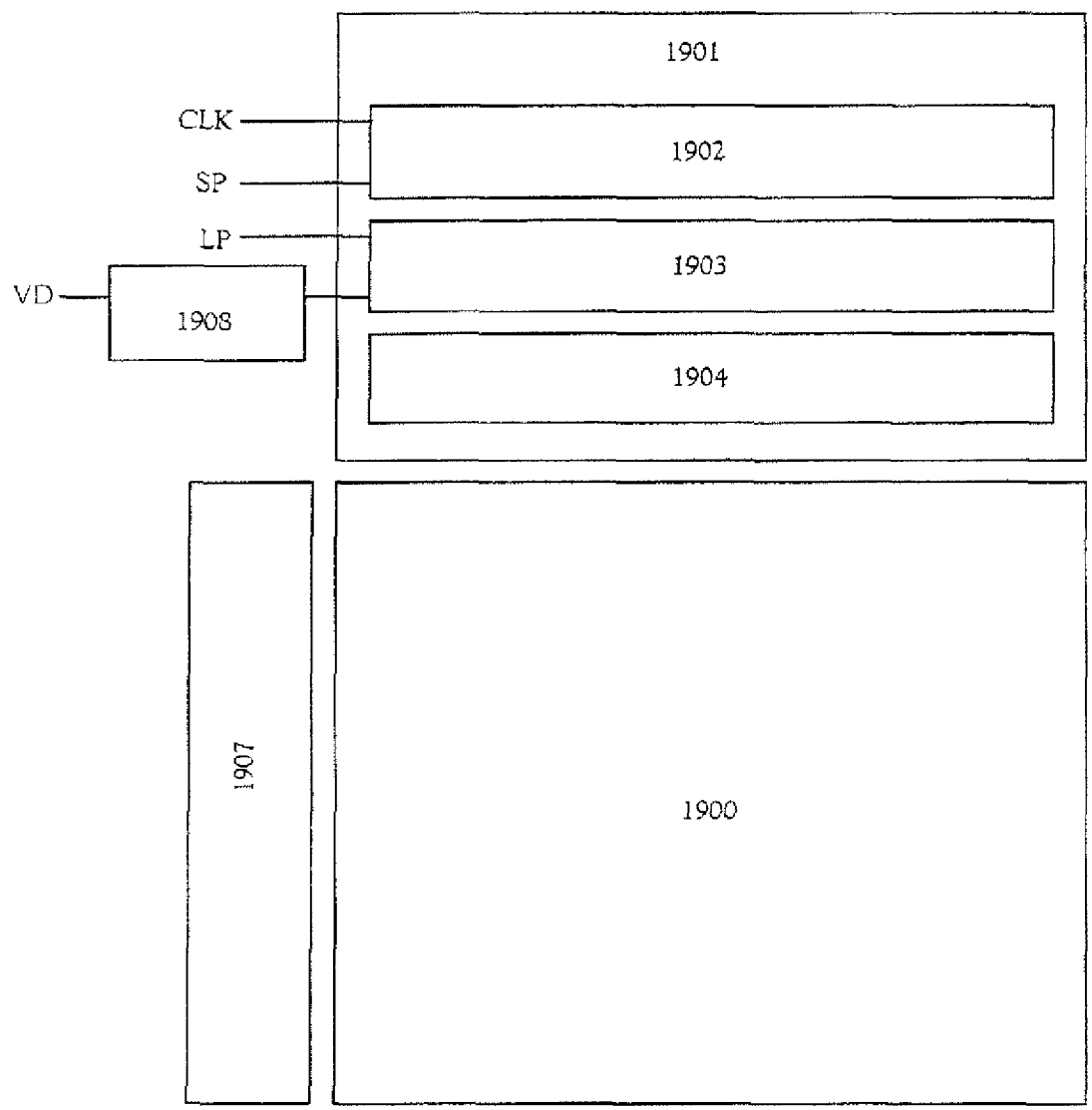
FIG. 19 is a block diagram showing the structure of a display device in prior art.
Figure 20:
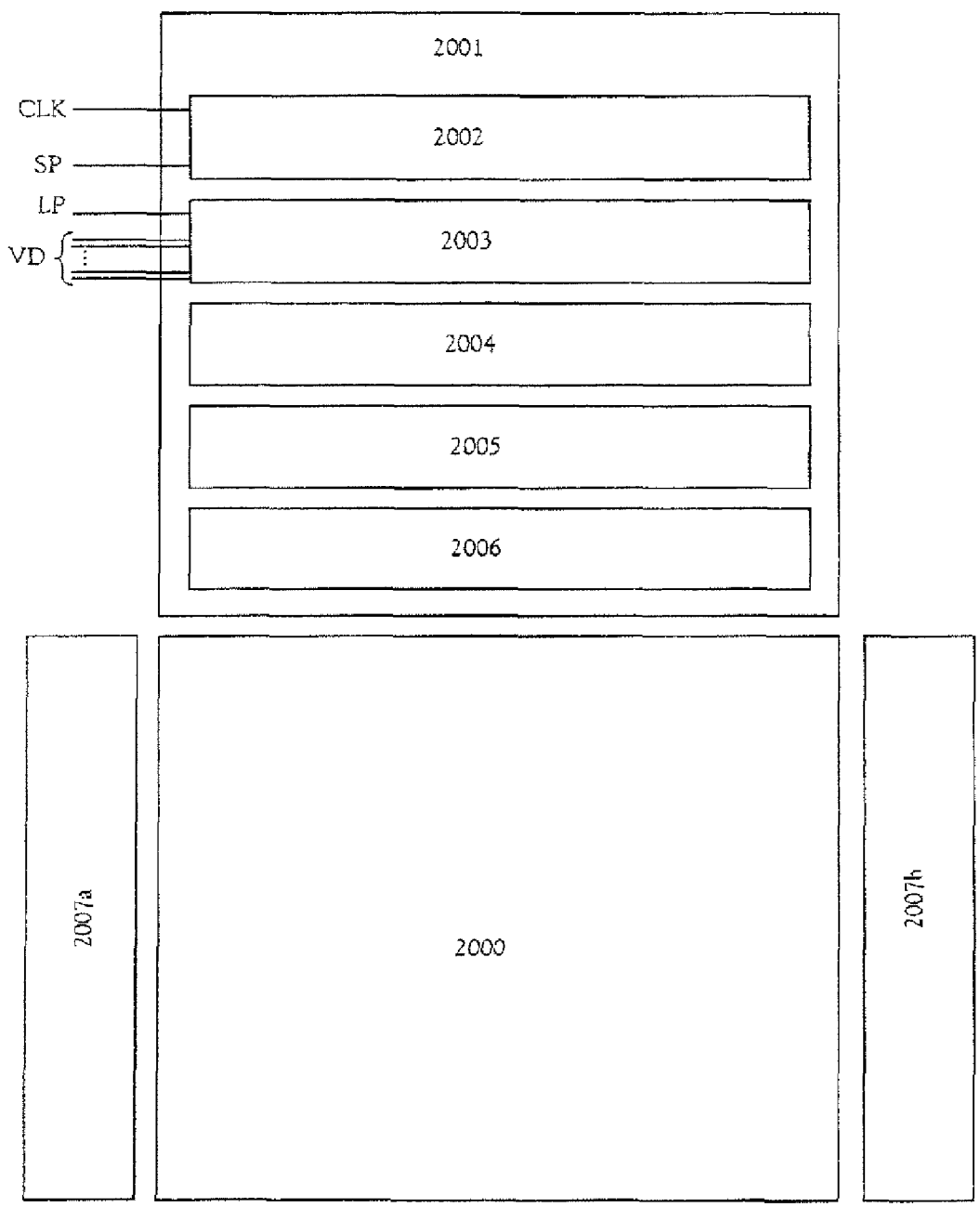
FIG. 20 is a block diagram showing the structure of a display device in prior art.
Figure 21:
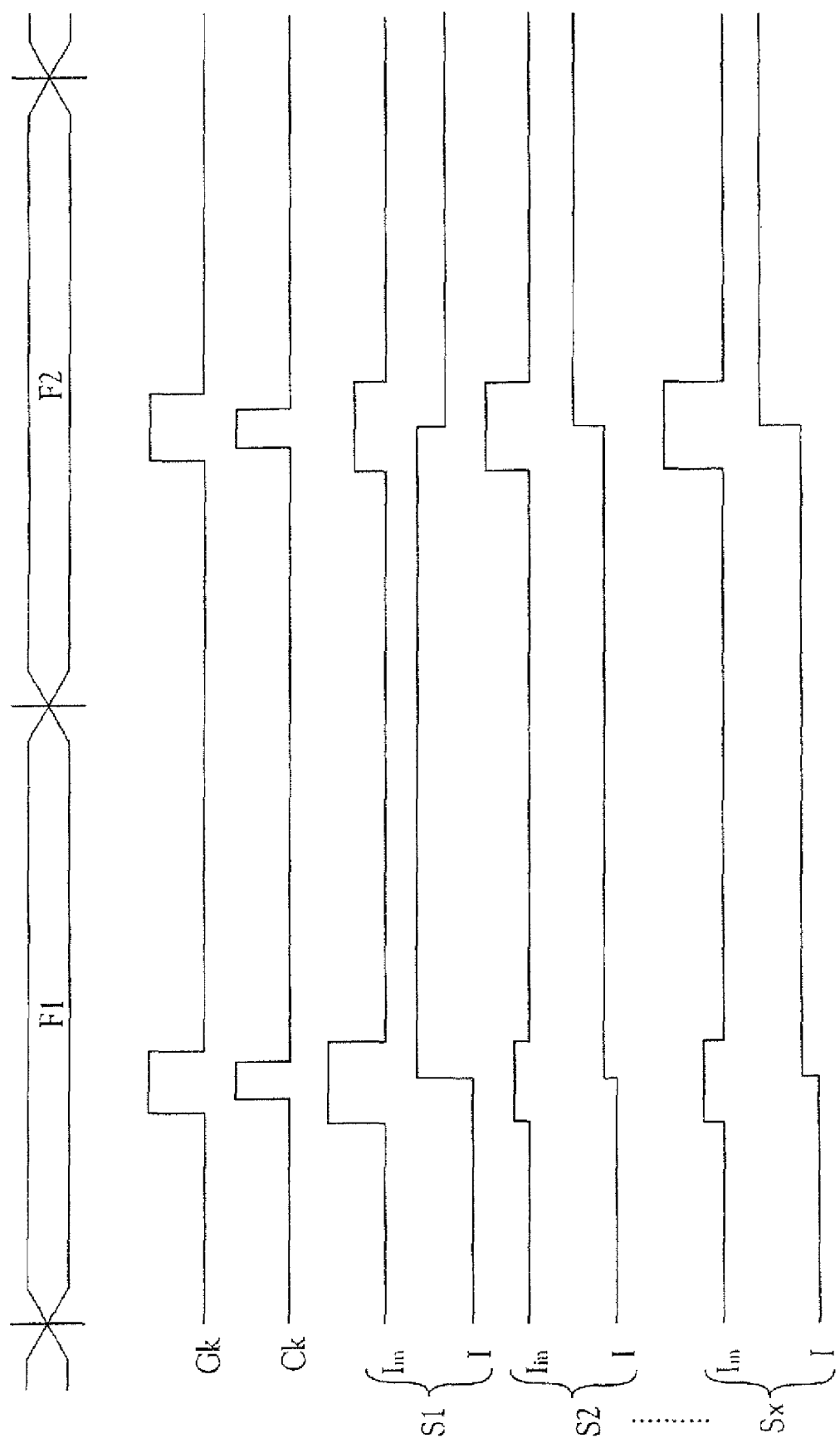
FIG. 21 is a timing chart showing a method of driving a display device in prior art.

In FIG. 12A, components identical with those in FIG. 9 of Embodiment 1, those in FIGS. 10A to 10C of Embodiment 2, and those in FIGS. 11A to 11C of Embodiment 3 are denoted by the same reference symbols and explanations are omitted.

Sampling pulses outputted from a shift register 2601 are inputted to LAT1s through a sampling pulse controlling circuit 3000 in FIG. 12A. FIG. 12B shows an example of the structure of the sampling pulse controlling circuit 3000.

The sampling pulse controlling circuit 3000 is composed of a NAND 2801 and an inverter 2802. Sampling pulses are inputted to a terminal IN of the circuit 3000 and an output from the circuit 3000 to the LAT1s is sent through a terminal OUT. Switching signals Psw are inputted to the sampling pulse controlling circuit 3000.

The operation of the sampling pulse controlling circuit 3000 is described.

When switching signals Psw have signal voltages of '1' signals, sampling pulses inputted from the terminal IN are outputted from the terminal OUT. On the other hand, when switching signals Psw have signal voltages of '0' signals, signal voltages of '0' signals are outputted from the terminal OUT irrespective of sampling pulses inputted from the terminal IN.

Switching signals Psw are all '1' signals during sub-frame periods for upper bits and periods in which the reset-operation takes place. During sub-frame periods for lower bits, except periods in which the reset operation takes place, switching signals Psw are all '0' signals. In this way, sampling pulses are not outputted only in given sub-frame periods. Sampling of information of digital video signals of lower bits is thus avoided and the information is not held in the LAT1s.

FIG. 12C shows an example of the structure of a reset circuit 2666.

The reset circuit 2666 is composed of NANDs 2803 and inverters 2804. Digital video signals VD divided into p sections are inputted to terminals IN1 to INp of the circuit 2666. Outputs from the circuit 2666 to LAT1s 2612 are sent through terminals OUT1 to OUTp. Switching signals RPsw are inputted to the reset circuit 2666.

The operation of the reset circuit 2666 is described.

When switching signals RPsw have signal voltages of '0' signals, digital video signals VD inputted from the terminals IN1 to INp are outputted from the terminals OUT1 to OUTp, respectively. On the other hand, when switching signals RPsw have signal voltages of '0' signals, signal voltages of '0' signals are outputted from the terminals OUT1 to OUTp irrespective of the digital video signals VD inputted from the terminals IN1 to INp.

Switching signals RPsw are all '1' signals during sub-frame periods for upper bits. During periods (reset periods) prior to periods in which output of sampling pulses are prevented (no-sampling-pulse periods), switching signals RPsw are all '0' signals. In this way, signals held in the LAT1s and LAT2s are all replaced with '0' signals through rewriting.

The number of bits participating in display is thus reduced to make the source signal line driving circuit conduct less sampling operations. Accordingly, the display device consumes less power.

This embodiment may be combined with Embodiment 1.

Embodiment 5

A method of manufacturing a pixel TFT of the display device using a driving method of the present invention and TFTs of a driving circuit (source signal line driving circuit and gate signal line driving circuit) provided in the periphery of a pixel portion is explained in this embodiment.

For simplicity of the explanation, with respect to the pixel portion 5070, the first switching TFT 5014 and the TFT (this TFT is referred to as driving TFT 5075 in this embodiment) which is connected to the light emitting element is shown representatively from among TFTs comprised in the current mirror circuit. Another TFTs can be formed in the same way. The CMOS circuit 5076, which is a basic unit concerning with the driving circuit 5071, comprising an n-channel TFT 5072 and a p-channel TFT 5073 is illustrated.

In addition, n-channel type TFT is used as the first switching TFT 5074 and p-channel type TFT is used as a driving TFT 5075. TFTs composing the pixel of the display device of the present invention is not limited thereto, the TFTs can use both p-channel type TFT or n-channel type TFT.

However, the polarity of two TFTs composing the current mirror circuit must be the same.

In addition, the TFT composing the CMOS circuit shown as an element composing the driving circuit uses the single gate type TFT. The double gate type TFT is used as the first switching type TFT and the single gate type TFT is used as the driving TFT. The structure of TFT composing the display device of the present invention is not limited thereto, the structure of TFT can be used both single gate type TFT and double gate type TFT, or triplet or more type TFT can also be used.

Further, the polarity of two TFTs composing the current mirror circuit is preferable to be the same.

First, as shown in FIG. 23A, a base film 5002 made of an insulating film such as a silicon oxide film, a silicon nitride film, or a silicon oxynitride film is formed on a substrate 5001 made from glass, such as barium borosilicate glass or aluminum borosilicate glass, typically Corning Corp. #7059 glass or #1737 glass. For example, a silicon oxynitride film 5002a manufactured from $SiH$, $NH_3$ and $N_2O$ by plasma CVD is formed with a thickness of 10 to 200 nm (preferably from 50 to 100 nm), and a hydrogenated silicon oxynitride film 5002b with a thickness of 50 to 200 nm (preferably between 100 and 150 nm), manufactured from $SiH_4$ and $N_2O$, is similarly formed and laminated. The base film 5002 with the two layer structure is shown in Embodiment 5, but the base film 5002 may also be formed as a single film or as a lamination film in which two or more layers are laminated.

Island shape semiconductor layers 5003 to 5006 are formed of crystalline semiconductor film manufactured by using a laser crystallization method or a known thermal crystallization method with a semiconductor film having an amorphous structure. The thickness of the island shape semiconductor layers 5003 to 5006 is set from 25 to 80 nm (preferably between 30 and 60 nm). There are no limitations on the crystalline semiconductor film material, but it is preferable to form the film from a semiconductor material such as silicon or a silicon germanium (SiGe) alloy.

A laser such as a pulse oscillation type or continuous emission (continuous oscillation) type excimer laser, a YAG laser, or a $YVO_4$ laser can be used as a laser light source in manufacturing the crystalline semiconductor film with the laser crystallization method. A method of condensing laser light emitted from a laser oscillator into a linear shape by an optical system and then irradiating the light to the semiconductor film may be employed when these types of lasers are used. The crystallization conditions may be suitably selected by the operator. However, the pulse oscillation frequency is set to 300 Hz, and the laser energy density is set from 100 to 400 $mJ/cm^2$ (typically between 200 and 300 $mJ/cm^3$) when using the excimer laser. Further, the second harmonic is utilized when using the YAG laser, the pulse oscillation frequency is set from 1 to 10 Hz, and the laser energy density may be set from 300 to 600 $mJ/cm^2$ (typically between 350 and 500 $mJ/cm^2$). The laser light which has been condensed into a linear shape with a width of 100 to 1000 μm, for example 400 μm, is then irradiated onto the entire surface of the substrate. This is performed with an overlap ratio of 80 to 98% for the linear laser light.

A gate insulating film 5007 is formed covering the island shape semiconductor layers 5003 to 5006. The gate insulating film 5007 is formed of an insulating film containing silicon having a thickness of 40 to 150 nm by plasma CVD or sputtering. A 120 nm thick silicon oxynitride film is formed in Embodiment 5. The gate insulating film is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHZ) electric power density of 0.5 to 0.8 $W/cm^2$. Good characteristics as a gate insulating film can be obtained by subsequently performing thermal annealing, at between 400 and 500° C., of the silicon oxide film thus manufactured.

A first conductive film 5008 and a second conductive film 5009 are then formed on the gate insulating film 5007 in order to form gate electrodes. The first conductive film 5008 is formed from Ta with a thickness of 50 to 100 nm, and the second conductive film 5009 is formed by W with a thickness of 100 to 300 nm, in Embodiment 5.

The Ta film is formed by sputtering, and sputtering with a Ta target is performed by using Ar. If appropriate amounts of Xe and Kr are added to the Ar during sputtering, the internal stress of the Ta film will be relaxed, and film peeling can be prevented. The resistivity of a phase Ta film is on the order of 20 μΩcm, and it can be used in the gate electrode, but the resistivity of β phase Ta film is on the order of 180 μΩcm and it is unsuitable for the gate electrode. The α phase Ta film can easily be obtained if a tantalum nitride film, which possesses a crystal structure near that of α phase Ta, is formed with a thickness of 10 to 50 nm as a base for Ta in order to form the α phase Ta film.

A W film is formed by sputtering with a W target. The W film can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 μΩcm. The resistivity can be lowered by enlarging the crystals of the W film, but for cases in which there are many impurity elements such as oxygen within the W film, crystallization is inhibited, and the film becomes high resistance. A W target having a purity of 99.9999% is thus used in sputtering. In addition, the W film is formed while sufficient care is taken in order that no impurities from within the gas phase are introduced at the time of film formation. Thus, a resistivity of 9 to 20 μΩcm can be achieved.

Note that, although the first conductive film 5008 is Ta and the second conductive film 5009 is W in Embodiment 5, the conductive films are not limited to these. Both the first conductive film 5008 and the second conductive film 5009 may also be formed from an element selected from the group consisting of Ta, W, Ti, Mo, Al, and Cu, from an alloy material having one of these elements as its main constituent, or from a chemical compound of these elements. Further, a semiconductor film, typically a polysilicon film, into which an impurity element such as phosphorous is doped may also be used. Examples of preferable combinations other than that used in Embodiment 5 include: a combination of the first conductive film 5008 formed from tantalum nitride (TaN) and the second conductive film 5009 formed from W; a combination of the first conductive film formed from tantalum nitride (TaN) and the second conductive film 5009 formed from Al; and a combination of the first conductive film 5008 formed from tantalum nitride (TaN) and the second conductive film 5009 formed from Cu.

A mask 5010 is formed next from resist, and a first etching process is performed in order to form electrodes and wirings. An ICP (inductively coupled plasma) etching method is used in Embodiment 5. A gas mixture of $CF_4$ and $Cl_2$ is used as an etching gas, and plasma is generated by applying a 500 W RF electric power (13.56 MHZ) to a coil shape electrode at 1 Pa. A 100 W RF electric power (13.56 MHZ) is also applied to the substrate side (test piece stage), effectively applying a negative self bias. The W film and the Ta film are both etched on the same order when $CF_4$ and $Cl_2$ are combined.

Edge portions of the first conducting layer and the second conducting layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011a to 5016a and second conductive layers 5011b to 5016b) composed of the first conducting layer and the second conducting layer are thus formed by the first etching process. Portions of the gate insulating film 5007 not covered by the first shape conductive layers 5011 to 5016 are etched on the order of 20 to 50 nm, forming thinner regions. (See FIG. 23B.)

A first doping process is then performed, and an impurity element which imparts n-type conductivity is added. Ion doping or ion injection may be performed as the doping method. Ion doping is performed at conditions in which the dosage is set to $1 \times 10^{13}$ to $5 \times 10^{14}$ atoms/cm$^2$, and an acceleration voltage is set between 60 and 100 keV. An element residing in group 15 of the periodic table, typically phosphorous (P) or arsenic (As), is used as the n-type conductivity imparting impurity element. Phosphorous (P) is used here. The conductive layers 5011 to 5015 become masks with respect to the n-type conductivity imparting impurity element, and first impurity regions 5017 to 5025 are formed in a self-aligning manner. The impurity element which imparts n-type conductivity is added to the first impurity regions 5017 to 5025 at a concentration within a range of $1 \times 10^{20}$ and $1 \times 10^{21}$ atoms/cm$^3$. (See FIG. 23B.)

A second etching process is performed without removing resist mask next as shown in FIG. 23C. The W film is etched selectively using a mixture of $CF_4$, $Cl_2$, and $O_2$ is used as the etching gas. At that time, by the second etching process, second shape conductive layers 5026 to 5031 (first conductive layers 5026a to 5031a and second conductive layers 5026b to 5031b) are formed. The gate insulating film 5007 is additionally etched on the order of 20 to 50 nm, forming thinner regions, in regions not covered by the second shape conductive layers 5026 to 5031.

The etching reaction of the W film or the Ta film in accordance with the mixed gas of $CF_4$ and $Cl_2$ can be estimated from the generated radicals, or from the ion types and vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore, the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions are generated. As a result, the etching speed of the W film having a high fluoride vapor pressure becomes high. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds of the W film and the Ta film, and it becomes possible to make the etching speed of the W film larger than that of the Ta film.

Figure 24A:
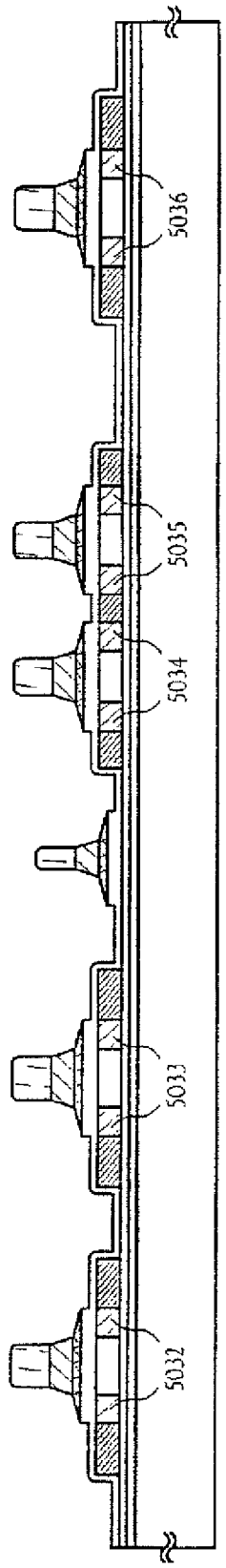
FIGS. 24A to 24C are diagrams showing a process of manufacturing a display device of Embodiment 5.

A second doping process is then performed as shown in FIG. 24A. In this case, an impurity element which imparts n-type conductivity is doped under conditions of a lower dosage than that in the first doping process, and at a higher acceleration voltage than that in the first doping process. For example, doping may be performed at an acceleration voltage of 70 to 120 keV and with a dosage of $1 \times 10^{13}$ atoms/cm$^2$, forming new impurity regions inside the first impurity regions formed in the island shape semiconductor layers of FIG. 23B. Doping is performed with the second shape conductive layers 5026 to 5030 as masks with respect to the impurity element, and doping is done such that the impurity element is also added to regions below the first conductive layers 5026a to 5030a. Third impurity regions 5032 to 5036 are formed. A concentration of phosphorus (P) added to the third impurity region 5032 to 5036 is provided with a gradual concentration gradient in accordance with a film thickness of the taper portion of the first conductive layer 5026a to 5030a. Further, in the semiconductor layer overlapping the taper portion of the first conductive layer 5026a to 5030a, from an end portion of the taper portion of the first conductive layer 5026a to 5030a toward an inner side, the impurity concentration is more or less reduced, however, the concentration stays to be substantially the same degree.

Figure 24B:
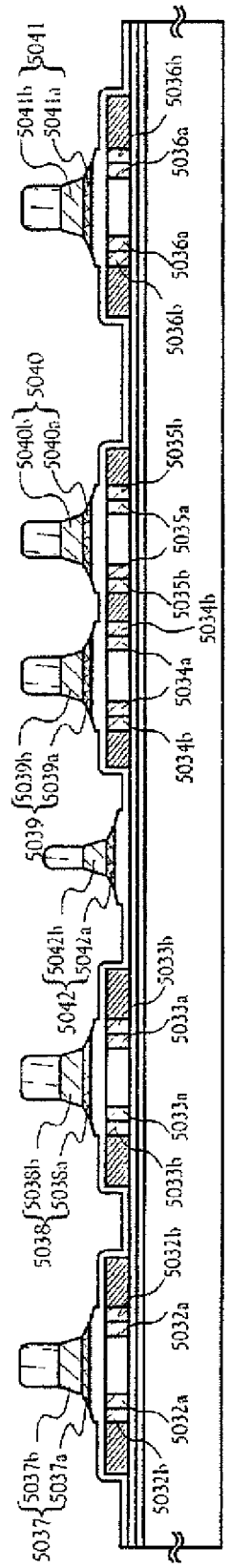

As shown in FIG. 24B, a third etching process is performed. This is performed by using a reactive ion etching method (RIE method) with an etching gas of $CHF_6$. The tapered portions of the first conductive layers 5026a to 5031a are partially etched, and the region in which the first conductive layers overlap with the semiconductor layer is reduced by the third etching process. Third shape conductive layers 5037 to 5042 (first conductive layers 5037a to 5042a and second conductive layers 5037b to 5042b) are formed. At this point, regions of the gate insulating film 5007, which are not covered with the third shape conductive layers 5037 to 5042 are made thinner by about 20 to 50 nm by etching.

By the third etching process, third impurity regions 5032a to 5036a, which overlap with the first conductive layers 5037a to 5041a, and second impurity regions 5032b to 5236b between the first impurity regions and the third impurity regions are formed in the third impurity regions 5032 to 5036.

Figure 24C:
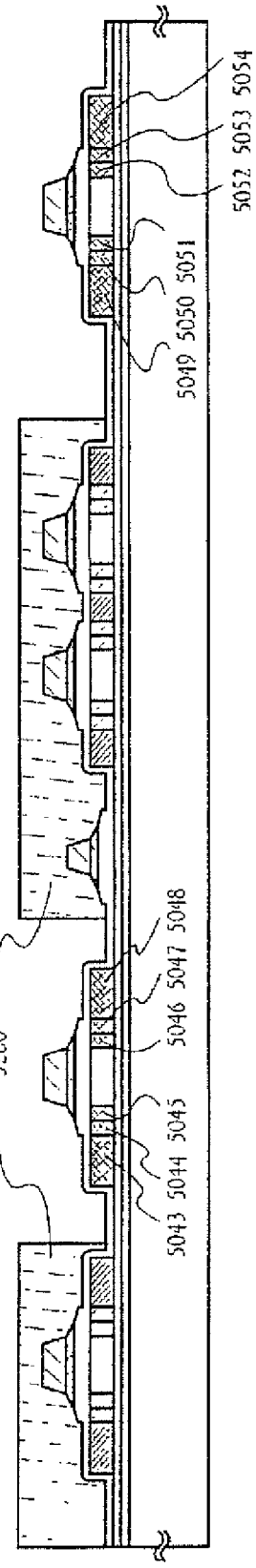

Then, as shown in FIG. 24C, the third doping process is performed to form the fourth impurity regions 5043 to 5054, which have a conductivity type opposite to the first conductivity type, in the island-like semiconductor layers 5004, 5006 forming p-channel TFTs. The third conductive layers 5038b and 5041b are used as masks to an impurity element, and the impurity regions are formed in a self-aligning manner. At this time, the whole surfaces of the island-like semiconductor layers 5003, 5005 and the wiring portion 5042, which form n-channel TFTs are covered with a resist mask 5200. Although phosphorus is added to the impurity regions 5043 to 5054 at different concentrations, respectively, the regions are formed by an ion doping method using diborane ($B_2H_6$) and the impurity concentration is made $2 \times 10^{20}$ to $2 \times 10^{21}$ atoms/cm$^3$ in any of the regions.

By the steps up to this, the impurity regions are formed in the respective island-like semiconductor layers. The third shape conductive layers 5037 to 5041 overlapping with the island-like semiconductor layers function as gate electrodes. The conductive layer 5042 functions as an island-like source signal line.

After the resist mask 5200 is removed, a step of activating the impurity elements added in the respective island-like semiconductor layers for the purpose of controlling the conductivity type is conducted. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 5, a heat treatment is conducted at 500° C. for four hours. However, in the case where a wiring material used for the third conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is a step of terminating dangling bonds in the semiconductor layer by thermally excited hydrogen. As another means for hydrogenation, plasma hydrogenation (using hydrogen excited by plasma) may be carried out.

Figure 25A:
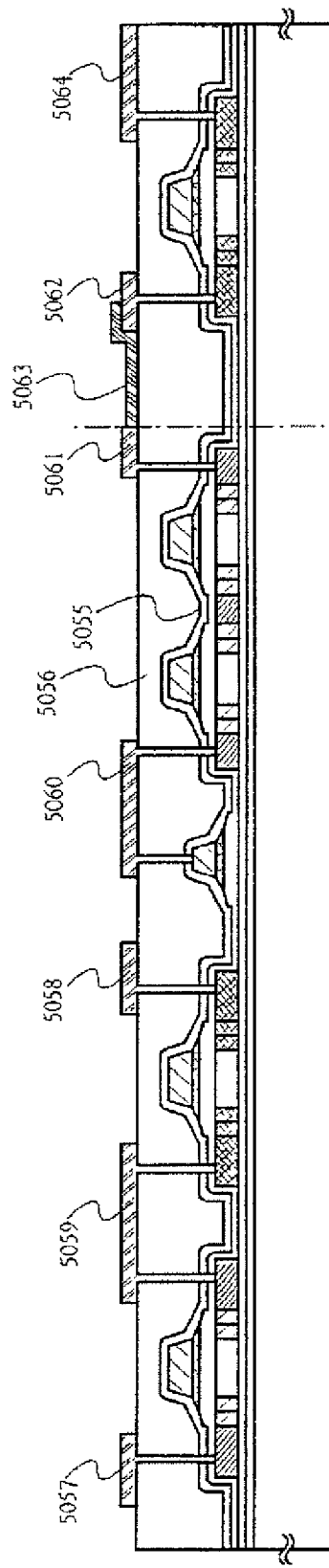
FIGS. 25A and 25B are diagrams showing a process of manufacturing a display device of Embodiment 5.

Next, as shown in FIG. 25A, a first interlayer insulating film 5055 made of a silicon nitride oxide film having a thickness of 100 to 200 nm is formed. A second interlayer insulating film 5056 made of an organic insulating material formed thereon. Contact holes are then formed with respect to the first interlayer insulating film 5055, the second interlayer insulating film 5056, and the gate insulating film 5007, respective wirings (including connection wirings and signal lines) 5057 to 5062, and 5064 are formed by patterning, and then, a pixel electrode 5063 that contacts with the connection wiring 5062 is formed by patterning.

Next, the film made from organic resin is used for the second interlayer insulating film 5056. As the organic resin, polyimide, polyamide, acryl, BCB (benzocyclobutene) or the like can be used. Especially, since the second interlayer insulating film 5056 has rather the meaning of flattening, acryl excellent in flatness is desirable. In Embodiment 5, an acryl film is formed to such a thickness that stepped portions formed by the TFTs can be adequately flattened. The thickness is preferably made 1 to 5 μm (more preferably 2 to 4 μm).

In the formation of the contact holes, dry etching or wet etching is used, and contact holes reaching the n-type impurity regions 5017, 5018, 5021 and 5023 or the p-type impurity regions 5043 to 5054, a contact hole reaching the wiring 5042, a contact hole reaching the power source supply line (not illustrated), and contact holes reaching the gate electrodes (not illustrated) are formed, respectively.

Further, a lamination film of a three layer structure, in which a 100 nm thick Ti film, a 300 nm thick aluminum film containing Ti, and a 150 nm thick Ti film are formed in succession by sputtering, is patterned into a desirable shape, and the resultant lamination film is used as the wirings (including connection wirings and signal lines) 5057 to 5062, and 5064. Of course, other conductive films may be used.

In this embodiment, further, an ITO film is formed maintaining a thickness of 110 nm as a pixel electrode 5063 and is patterned. The pixel electrode 5063 is overlapped on the connection wiring 5062 in contact therewith. It is also allowable to use a transparent electrically conducting film by mixing 2 to 20% of zinc oxide (ZnO) into indium oxide. The pixel electrode 5063 serves as an anode of the light emitting element. (See FIG. 25A.)

Figure 25B:
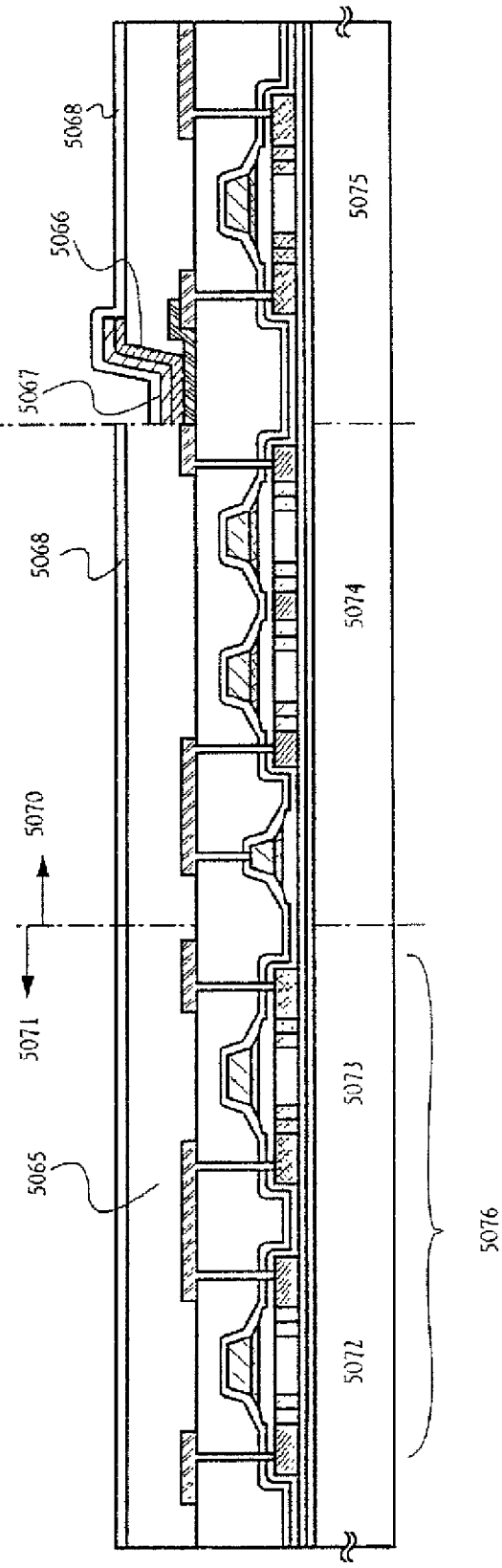
Figure 26:
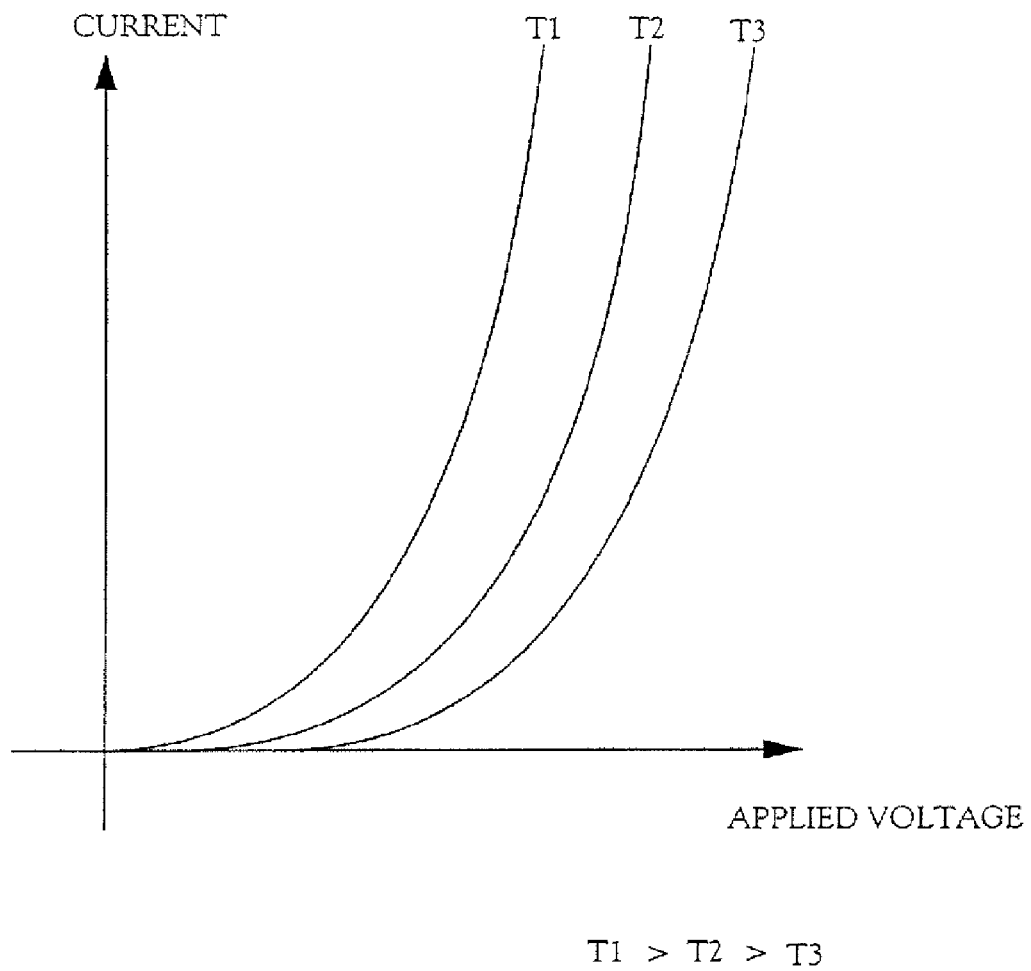
FIG. 26 is a graph showing a temperature characteristic of a light emitting element in prior art.
Figure 28:
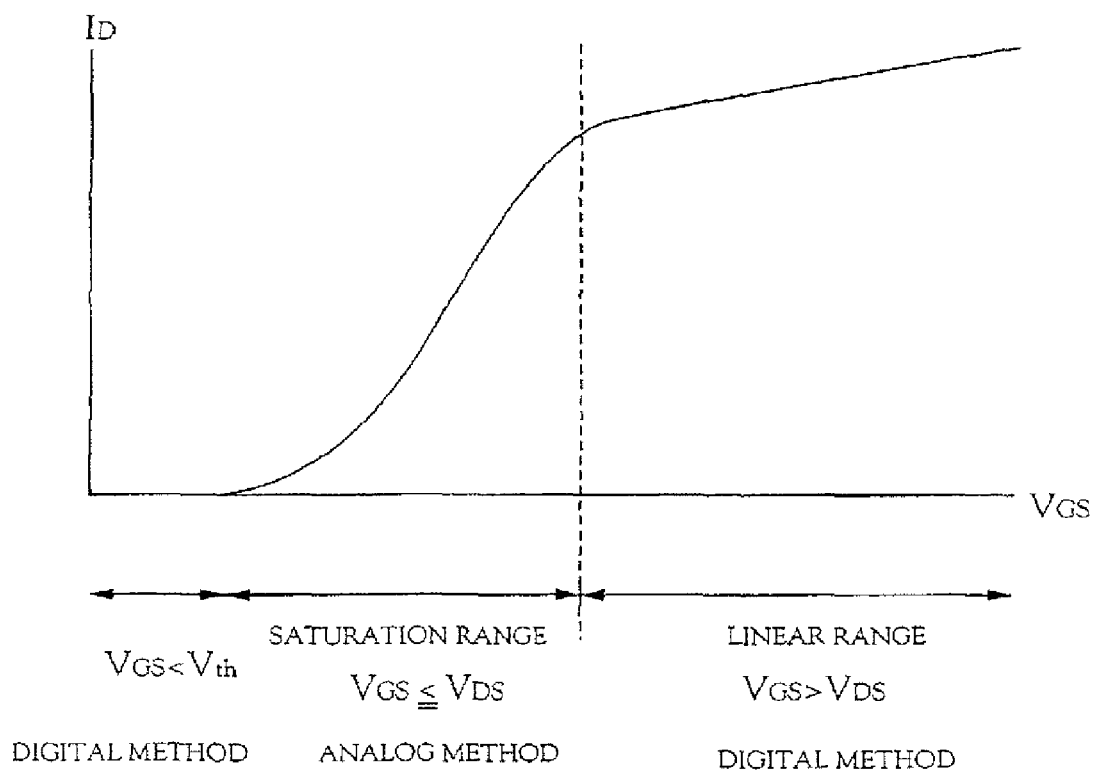
FIG. 28 is a graph showing the operation range of a driving TFT in prior art.

Referring next to FIG. 25B, the insulating film containing silicon (silicon oxide film in this embodiment) is formed maintaining a thickness of 500 nm, an opening is formed at a position corresponding to the pixel electrode 5063, and a third interlayer insulating film 5065 is formed to serve as a bank. The opening is formed by the wet etching method thereby to easily form the tapered side walls. Attention must be given to that unless the side walls of the opening portion are formed sufficiently mildly, the organic compound layer is deteriorated to a conspicuous degree due to a step.

Next, the organic compound layer 5066 and the cathode (MgAg electrode) 5067 are continuously formed by the vacuum evaporation method without being exposed to the open air. Here, the organic compound layer 5066 should have a thickness of 80 to 200 nm (typically, 100 to 120 nm) and the cathode 5067 should have a thickness of 180 to 300 nm (typically, 200 to 250 nm).

At this step, there are successively formed the organic compound layer and the cathode for the pixel corresponding to red color, for the pixel corresponding to green color and for the pixel corresponding to blue color. Here, however, the organic compound layer has a poor resistance against the solution and must be separately formed for each of the colors without relying upon the photolithography technology. It is therefore desired to employ a method such as evaporation method of selectively forming the organic compound layer and the cathode on the required portions only while concealing the areas except the desired pixels by using a metal mask.

First, a mask is set to conceal all areas except the pixels corresponding to red color, and the organic compound layer that emits red light is selectively formed by using the mask. Next, a mask is set to conceal all areas except the pixels corresponding to green color, and the organic compound layer that emits green light is selectively formed by using the mask. Then, a mask is set to conceal all areas except the pixels corresponding to blue color, and the organic compound layer that emits blue light is selectively formed by using the mask. Though different masks were used above, it is also allowable to use the same mask.

Though in the foregoing was used the system for forming light-emitting elements of three kinds corresponding to RGB, there may be used a system combining a white light-emitting element and a color filter, a system combining a blue light-emitting or blue-green light-emitting element and a fluorescent material (fluorescent color conversion layer: CCM) or a system using a transparent electrode as the cathode (opposing electrode) and overlapping thereon light-emitting elements corresponding to ROB.

Known materials can be used for forming the organic compound layer 5066. As the known material, there can be preferably used an organic material by considering the driving voltage. For example, four layers comprising a hole-injection layer, a hole-transporting layer, a light-emitting layer and an electron-injection layer may be used as the organic compound layer.

Next, a cathode 5067 is formed by using a metal mask on the pixels (pixels of the same line) having the first switching TFTs of which the gate electrodes are connected to the same gate signal line. Though MgAg which is a cathode material was used for the cathode 5067 in this embodiment, it should be noted that the invention is not limited thereto only, but any other known material may be used as the cathode 5067.

Further, the cathode 5067 can be common to all pixels.

Finally, a passivation film 5068 which is a silicon nitride film is formed maintaining a thickness of 300 nm. Upon forming the passivation film 5068, the organic compound layer 5066 is protected from the moisture so as to exhibit further improved reliability of light-emitting elements.

Thus, the light-emitting device of a structure shown in FIG. 25B is completed. In the step of forming the display device according to this embodiment, the source signal lines are formed by using Ta and W which are the materials forming the gate electrodes, and the gate signal lines are formed by using Al which is a wiring material forming the drain electrodes due to the circuit constitution and the steps. It is, however, allowable to use different materials, too.

Upon arranging TFTs of an optimum structure not only in the pixel portion 5070 but also in the driving circuit portion 5071, the light-emitting device of this embodiment exhibits a very high reliability and improved operation characteristics. In the step of crystallization, further, it is also allowable to add a metal catalyst such as Ni to enhance the crystallinity.

First, in order to prevent the drop in the operation speed as much as possible, the TFT of a structure which suppresses the injection of hot carriers is used as the n-channel TFT for the CMOS circuit that forms the driving circuit portion. The driving circuit referred to here includes shift registers, buffers, and level shifters, and includes latches.

In the case of this embodiment, the active layer of the n-channel TFTs each includes the source region, drain region, overlapped LDD region (referred to $L_{ON}$ region) overlapped on the gate electrode with the gate insulating film sandwiched therebetween, an offset LDD region (referred to $L_{OFF}$ region) which is not overlapped on the gate electrode with the gate insulating film sandwiched therebetween, and channel-forming region.

The p-channel TFT 5073 of the CMOS circuit 5076 needs not be particularly provided with the LDD region since it is not almost deteriorated by the injection of hot carriers. It is, of course, allowable to provide the LDD region like the n-channel TFT to cope with the hot carriers.

Further, when the driving circuit employs the CMOS circuit in which the current flows in both directions through the channel forming region, i.e., employs the CMOS circuit in which the roles of the source region and of the drain region are replaced by each other, it is desired that the n-channel TFT forming the CMOS circuit forms the LDD regions on both sides of the channel-forming region in such a manner that the LDD regions sandwich the channel-forming region.

In practice, further, when the device is completed up to the state of FIG. 25B, it is desired to package (seal) the device with a protection film (laminate film, ultraviolet curable resin film etc.) having high air-tightness permitting the gas to escape little or with a light-transmitting sealing member so that the device will not be exposed to the open air. In this case, the interior of the sealing member may be filled with an inert atmosphere or a hygroscopic material (e.g., barium oxide) may be arranged therein to improve the reliability of the light-emitting element.

After the air-tightness is enhanced by the treatment such as packaging, the device is completed as the product by attaching a connector (flexible printed circuit: FPC) for connecting the element formed on the substrate or for connecting the terminals drawn from the circuit to the external signal terminals. The device in a state that can be shipped is called display device in this specification.

By following the process shown in this embodiment, the number of photo masks needed in manufacturing a light-emitting device can be reduced. As a result, the process is cut short to reduce the manufacture cost and improve the yield.

This embodiment can be implemented by combining freely with Embodiments 1 to 4.

Embodiment 6

In this embodiment, a method of sealing a display device of the present invention will be described with reference to FIGS. 22A to 22C.

Figure 22A:
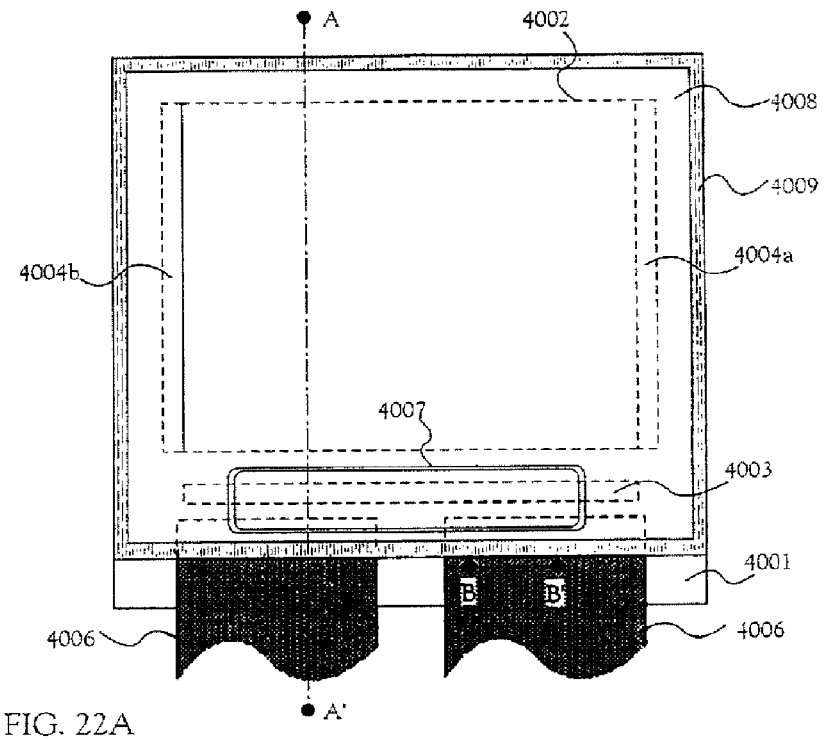
FIGS. 22A to 22C are diagrams showing a method of sealing a display device of Embodiment 6.
Figure 22B:
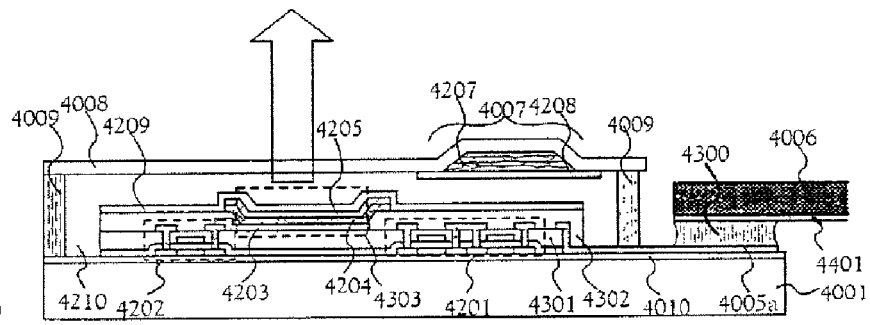
Figure 22C:
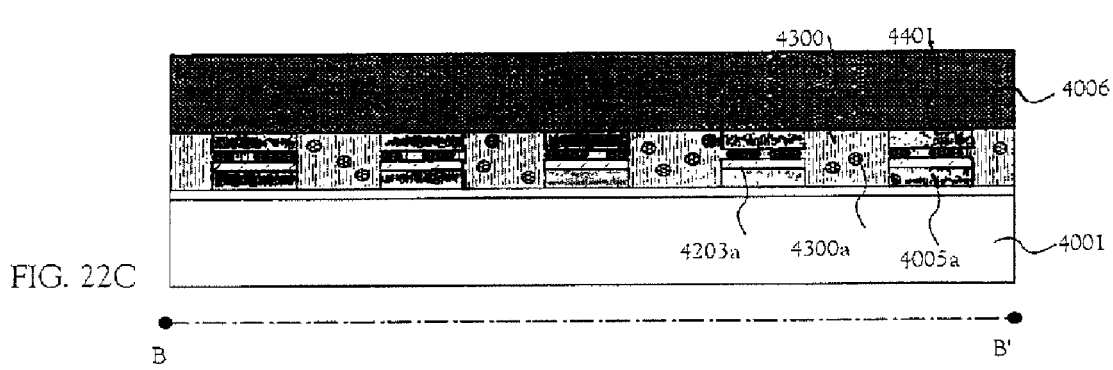

FIG. 22A is a top view of a display device, FIG. 22B is a sectional view taken along a line A-A' of FIG. 22A, and FIG. 22C is a sectional view taken along a line B-B' of FIG. 22A.

A seal member 4009 is provided so as to surround a pixel portion 4002, a source signal line driving circuit 4003, and first and second gate signal line driving circuits 4004a and 4004b, which are provided on a substrate 4001. Further, a sealing member 4008 is provided over the pixel portion 4002, the source signal line driving circuit 4003, and the first and the second gate signal line driving circuits 4004a and 4004b.

For example, the first gate signal line driving circuit 4004a corresponds to the gate signal line driving circuit 107a in FIG. 1. Further, the second signal line driving circuit 4004b corresponds to the selective driving circuit 107b.

Thus, the pixel portion 4002, the source signal line driving circuit 4003, and the first and the second gate signal line driving circuits 4004a and 4004b formed over the substrate 4001 and are sealed with a filler 4210 by the seal member 4009 and the sealing member 4008.

Further, the pixel portion 4002, the source signal line driving circuit 4003, and the first and the second gate signal line driving circuits 4004a and 4004b provided on the substrate 4001 include a plurality of TFTs. FIG. 22B typically shows driving TFTs (here, an n-channel TFT and a p-channel TFT are shown) 4201 included in the source signal line driving circuit 4003 and a driving TFT 4202 included in the pixel portion 4002, which are formed on an under film 4010. In this embodiment, the TFT which is connected to the light-emitting element is referred to as a driving TFT from among two TFTs composing a current mirror circuit of the pixel of the present invention.

In this embodiment, the p-channel TFT and the n-channel TFT fabricated by a well-known method are used as the driving TFT 4201, and a p-channel TFT fabricated by a well-known method is used as the driving TFT 4202. The storage capacitor (not illustrated) connected to the gate of the driving TFT 4202 is provided in the pixel portion 4002.

An interlayer insulating film (flattening film) 4301 is formed on the driving TFTs 4201 and the driving TFT 4202, and a pixel electrode (anode) 4203 electrically connected to a drain region of the driving TFT 4202 is formed thereon. A transparent conductive film having a high work function is used as the pixel electrode (anode) 4203. A compound of indium oxide and tin oxide, a compound of indium oxide and zinc oxide, zinc oxide, tin oxide, or indium oxide can be used for the transparent conductive film. Further, the transparent conductive film added with gallium may be used.

An insulating film 4302 is formed on the pixel electrode 4203, and an opening portion is formed in the insulating film 4302 over the pixel electrode 4203. In this opening portion, an organic compound layer 4204 is formed on the pixel electrode 4203. A well-known organic material or inorganic material can be used for the organic compound layer 4204. Although the organic material includes a low molecular system (monomer system) and a high molecular system (polymer system), either may be used.

As a formation method of the organic compound layer 4204, a well-known evaporation technique or coating technique may be used. The structure of the organic compound layer may be a laminate structure obtained by freely combining a hole-injection layer, a hole-transporting layer, a light-emitting layer, an electron-transporting layer, or an electron-injection layer, or a single layer structure.

A cathode 4205 made of a conductive film (typically, a conductive film containing aluminum, copper or silver as its main ingredient, or a laminate film of those and another conductive films) having a light shielding property is formed on the organic compound layer 4204. It is desirable that moisture and oxygen existing on the interface between the cathode 4205 and the organic compound layer 4204 are removed to the utmost. Accordingly, it is necessary to make such contrivance that the organic compound layer 4204 is formed in a nitrogen or rare gas atmosphere, and the cathode 4205 is formed while the organic compound layer is not exposed to oxygen or moisture. In this embodiment, a multi-chamber system (cluster tool system) film forming apparatus is used, so that the film formation as described above is enabled. A predetermined voltage is applied to the cathode 4205.

In the manner as described above, a light-emitting element 4303 constituted by the pixel electrode (anode) 4203, the organic compound layer 4204, and the cathode 4205 is formed. Then, a protection film 4209 is formed on the insulating film 4302 so as to cover the light-emitting element 4303. The protection film 4209 is effective to prevent oxygen, moisture and the like from penetrating into the light-emitting element 4303.

Reference numeral 4005a designates a drawing wiring line connected to a power supply line and is electrically connected to a source region of the driving TFT 4202. The drawing wiring line 4005a passes between the seal member 4009 and the substrate 4001, and is electrically connected to an FPC wiring line 4401 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet having such a structure that an aluminum foil is interposed between PVF films or Mylar films can also be used.

However, in the case where the radiation direction of light from the light-emitting element is directed toward the side of a cover member, the cover member must be transparent. In this case, a transparent material such as a glass plate, a plastic plate, a polyester film, or an acryl film is used.

As the filler 4210, in addition to an inert gas such as nitrogen or argon, ultraviolet ray curing resin or thermosetting resin can be used, and PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4103 to a hygroscopic material (preferably, barium oxide) or a material capable of adsorbing oxygen, a recess portion 4007 is provided on the surface of the sealing member 4008 on the side of the substrate 4001 and the hygroscopic material or the material 4207 capable of adsorbing oxygen is disposed. Then, in order to prevent the hygroscopic material or the material 4207 capable of adsorbing oxygen from scattering, the hygroscopic material or the material capable of adsorbing oxygen are held in the recess portion 4007 by a recess cover member 4208. Note that, the recess cover member 4208 is formed into a fine mesh, and has such a structure that air or moisture is permeated and the hygroscopic material or the material 4207 capable of adsorbing oxygen is not permeated. The deterioration of the light-emitting element 4303 can be suppressed by providing therewith the hygroscopic material or the material 4207 capable of adsorbing oxygen.

As shown in FIG. 22C, at the same time as the formation of the pixel electrode 4203, a conductive film 4203a is formed to be in contact with the drawing wiring line 4005a.

The anisotropic conductive film 4300 includes a conductive filler 4300a. The substrate 4001 and the FPC 4006 are thermally compressed, so that the conductive film 4203a on the substrate 4001 and the FPC wiring line 4301 on the FPC 4006 are electrically connected through the conductive filler 4300a.

This embodiment can be implemented by freely combining with Embodiments 1 to 5.

Embodiment 7

This embodiment describes electronic equipment (apparatus) of the present invention with reference to FIGS. 27A to 27F.

FIG. 27A is a schematic diagram of a portable information terminal according to the present invention. The portable information terminal is composed of a main body 2701a, operation switches 2701b, a power switch 2701c, an antenna 2701d, a display unit 2701e, and an external input port 2701f. A display device driven by one of the driving methods shown in Embodiment Modes 1 through 4 and Embodiments 1 through 6 is used in the display unit 2701e.

FIG. 27B is a schematic diagram of a personal computer according to the present invention. The personal computer is composed of a main body 2702a, a case 2702b, a display unit 2702c, operation switches 2702d, a power switch 2702e, and an external input port 2702f. A display device driven by one of the driving methods shown in Embodiment Modes 1 through 4 and Embodiments 1 through 6 is used in the display unit 2702c.

FIG. 27C is a schematic diagram of an image reproducing device according to the present invention. The image reproducing device is composed of a main body 2703a, a case 2703b, a recording medium (for example, DVD) 2703c, a display unit 2703d, an audio output unit 2703e, and operation switches 2703f. A display device driven by one of the driving methods shown in Embodiment Modes 1 through 4 and Embodiments 1 through 6 is used in the display unit 2703d.

FIG. 27D is a schematic diagram of a television according to the present invention. The television is composed of a main body 2704a, a case 2704b, a display unit 2704c, and operation switches 2704d. A display device driven by one of the driving methods shown in Embodiment Modes 1 through 4 and Embodiments 1 through 6 is used in the display unit 2704c.

FIG. 27E is a schematic diagram of a head mounted display according to the present invention. The head mounted display is composed of a main body 2705a, a monitor unit 2705b, a head band 2705c, a display unit 2705d, and an optical system 2705e. A display device driven by one of the driving methods shown in Embodiment Modes 1 through 4 and Embodiments 1 through 6 is used in the display unit 2705d.

FIG. 27F is a schematic diagram of a video camera according to the present invention. The video camera is composed of a main body 2706a, a case 2706b, a connection unit 2706c, an image receiving unit 2706d, an eye piece unit 2706e, a battery 2706f, an audio input unit 2706g, and a display unit 2706h. A display device driven by one of the driving methods shown in Embodiment Modes 1 through 4 and Embodiments 1 through 6 is used in the display unit 2706h.

The present invention is not limited to the above electronic equipment but can make various other electronic equipment.

With the above structures, the present invention drives a pixel of current drive type by a time ratio gradation method in which light emission periods of a light emitting element are changed by a digital method to vary the luminance. In this way, the present invention obtains a method of driving a display device capable of maintaining stable display against a change in temperature of the surroundings with less uneven display and reduced power consumption.

Power consumption of the display device is reduced by stopping sampling digital video signals in sub-frame periods for lower bits.

What is claimed is:

1. A method of driving a display device which comprises a plurality of pixels arranged in a matrix form and a driver circuit for driving the plurality of pixels, the method comprises the steps of:

inputting n-bits digital signals to the driver circuit in a frame period for displaying a first gradation display wherein the n is a natural number; and inputting a first bit digital signal to an (m−1)th bit digital signal among n bits digital signals to the driver circuit in the frame period for displaying a second gradation display which has a lower gradation than the first gradation than the first gradation display without inputting an m-th bit digital signal to an n-th bit digital signal to the driver circuit wherein the m is a natural number equal to or greater than 2 and smaller than n, wherein the frame period has a plurality of sub frame periods and whether the pixel emits light or not is determined in each of the plurality of sub frame periods.

2. The method of driving a display device according to claim 1 wherein among the n bits digital signals, the m-th bit digital signal to the n-th bit digital signal are lower bit digital signals.

3. The method of driving a display device according to claim 1 wherein the plurality of pixels are light emitting elements.

4. A method of driving a display device which comprises a plurality of pixels arranged in a matrix form and a driver circuit for outputting a signal current of a constant current value to the plurality of pixels, the method comprising the steps of:

inputting n-bits digital signals to the driver circuit in a frame period for displaying a first gradation display wherein the n is a natural number; and inputting n-bits digital signals to the driver circuit in a frame period for displaying a first gradation display wherein the n is a natural number; and inputting a first bit digital signal to an (m−1)th bit digital signal to an (m−1)th bit digital signal among n bits digital signals to the driver circuit in the frame period for displaying a second gradation display which has a lower gradation than the first gradation display without inputting an m-th bit digital signal to an n-th bit digital signal to the driver circuit wherein the m is a natural number equal to or greater than 2 and smaller than n, wherein the frame period has a plurality of sub frame periods and whether the pixel emits light or not is determined in each of the plurality of sub frame periods in accordance with the signal current.

5. The method of driving a display device according to claim 4 wherein among the n bits digital signals, the m-th bit digital signal to the n-th bit digital signal are lower bit digital signals.

6. The method of driving a display device according to claim 4 wherein the plurality of pixels include light emitting elements.

7. The method of driving a display device according to claim 6 wherein the plurality of pixels converts the current signal supplied thereto into a voltage and converts the voltage to a current, inputs the current to the light emitting element and makes the light emitting element emit light at a constant intensity.

8. The method of driving a display device according to claim 4 wherein each of the plurality of pixels includes a first thin film transistor, a second thin film transistor and a light emitting element, when the signal current is input into one of the plurality of pixels, the current signal is a drain current of the first thin film transistor which operates in a saturation region, a gate voltage of the first thin film transistor is retained, the gate voltage of the first thin film transistor is a gate voltage of the second thin film transistor, a drain current of the second thin film transistor is input to the light emitting element, and the light emitting element emits light at a constant intensity.

* * * * *

UNITED STATES PATENT AND TRADEMARK OFFICE
CERTIFICATE OF CORRECTION

PATENT NO. : 7,952,541 B2
APPLICATION NO. : 11/871601
DATED : May 31, 2011
INVENTOR(S) : Jun Koyama It is certified that error appears in the above-identified patent and that said Letters Patent is hereby corrected as shown below:

In the Specifications:

Column 2, line 34, replace "tight" with --light--;

Column 3, line 18, replace "LAT." with --LAT1 1803--;

Column 5, line 66, replace "riming" with --timing--;

Column 11, line 27, replace "tinting" with --timing--;

Column 13, line 21, replace "then" with --the n--;

Column 13, line 30, replace "pixel" with --pixels--;

Column 14, line 44, replace "tight" with --light--;

Column 15, line 36, replace "puke" with --pulse--;

Column 16, line 5, replace "pubes" with --pulses--;

Column 16, line 58, replace "riming" with --timing--;

Column 18, line 21, replace "2" with $--2^n--$;

Column 23, line 64, replace "our" with --out--;

Column 24, line 65, replace "takes" with --makes--;

Column 29, line 3, replace "in respective" with --irrespective--;

Signed and Sealed this
Fourteenth Day of May, 2013

Teresa Stanek Rea
*Acting Director of the United States Patent and Trademark Office*

CERTIFICATE OF CORRECTION (continued)
U.S. Pat. No. 7,952,541 B2

Column 29, line 10, replace "nor" with --not--;

Column 36, line 41, replace "ROB" with --RGB--;

Column 37, line 17, replace "$L_{ON}$" with --LOV--;

Column 38, line 31, replace "TFT" with --TFTs--.